United States Patent
Oda et al.

(10) Patent No.: US 6,900,752 B2
(45) Date of Patent: May 31, 2005

(54) STEPWISE ZERO-DATA-DETECTION MUTE CIRCUIT

(75) Inventors: Toshikazu Oda, Yokohama (JP); Mitsuru Nagata, Naka-gun (JP); Hiroyuki Eguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/619,616

(22) Filed: Jul. 16, 2003

(65) Prior Publication Data

US 2004/0061635 A1 Apr. 1, 2004

(30) Foreign Application Priority Data

Jul. 16, 2002 (JP) ........................................ 2002-206869

(51) Int. Cl.⁷ ................................................. H03M 1/78
(52) U.S. Cl. ........................ 341/154; 341/110; 341/144; 332/185
(58) Field of Search ............................ 331/185; 341/144, 341/143, 154, 153, 139, 110; 338/334; 323/353, 354

(56) References Cited

U.S. PATENT DOCUMENTS 4,468,607 A * 8/1984 Tanaka et al. ............... 323/354
6,114,981 A * 9/2000 Nagata ........................ 341/143
6,204,789 B1   3/2001 Nagata ........................ 341/144

FOREIGN PATENT DOCUMENTS

| JP | 2001-77694 | 3/2001 |
| JP | 2001-244791 | 9/2001 |
| JP | 2001-274645 | 10/2001 |

* cited by examiner

Primary Examiner—Robert Pascal
Assistant Examiner—Joseph Chang
(74) Attorney, Agent, or Firm—Oblon, Spivak, McClelland, Maier & Neustadt, P.C.

(57) ABSTRACT

A variable resistance device is disclosed, which comprises a first variable resistance circuit and analog switches, a second variable resistance circuit including series-connected first and second resistors, one terminal of the first resistor connected to one terminal of the second resistor and the other terminal connected to one terminal of the first variable resistance circuit, a series-resistor circuit one terminal of which is connected to the other terminal of the second resistor, analog switches connected between the other terminal of the first resistor and nodes of respective resistors of the series-resistor circuit, an analog switch connected between the other terminal of the series-resistor circuit and a node of the first and second resistors, an analog switch connected between a node of the resistors of the series-resistor circuit and the node of the first and second resistors, and a short-circuiting analog switch connected between the first and second variable resistance circuits.

28 Claims, 40 Drawing Sheets

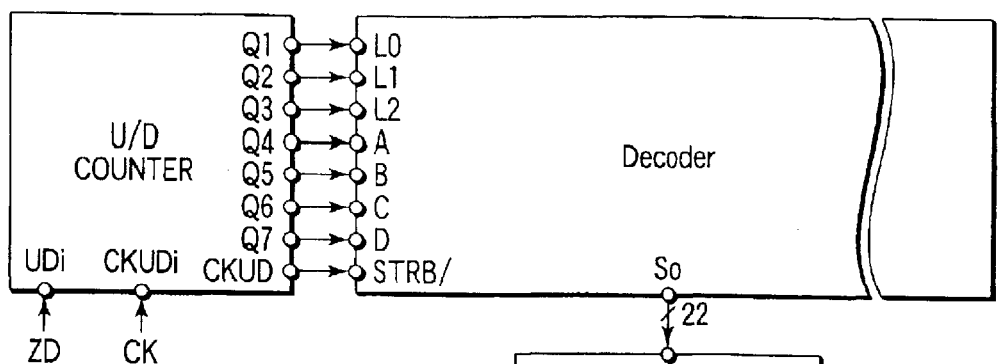
FIG. 2A
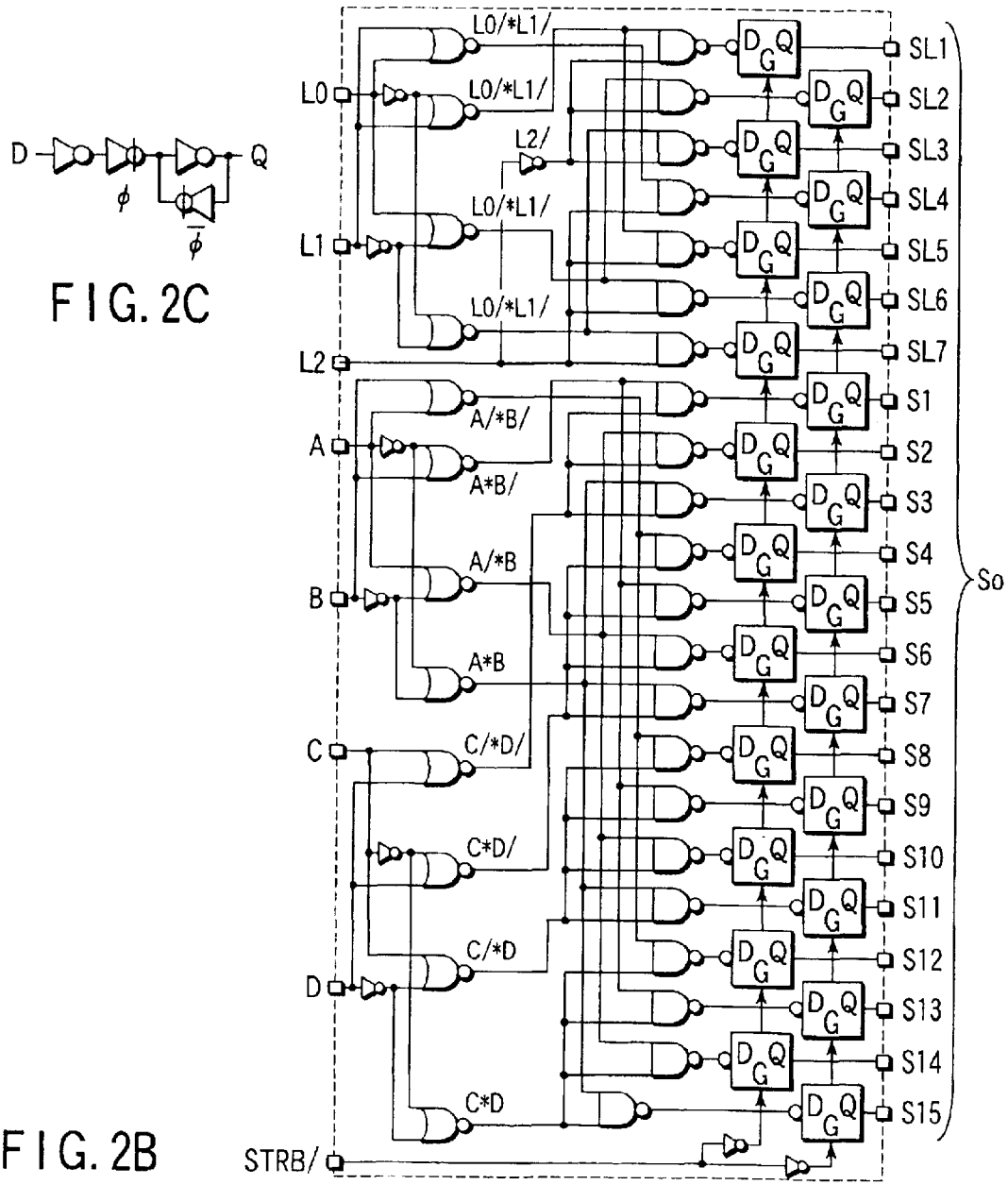
FIG. 2C
FIG. 2B

| Counter | D | C | B | A | L2 | L1 | L0 | ON-SW | | Resistance value |
|---|---|---|---|---|---|---|---|---|---|---|
| 0 | 0 | 0 | 0 | 0 | 0 | 0 | 0 | | | 15r |
| 1 | 0 | 0 | 0 | 0 | 0 | 0 | 1 | | SL1 | (14+7/8)r |
| 2 | 0 | 0 | 0 | 0 | 0 | 1 | 0 | | SL2 | (14+6/8)r |
| 3 | 0 | 0 | 0 | 0 | 0 | 1 | 1 | | SL3 | (14+5/8)r |
| 4 | 0 | 0 | 0 | 0 | 1 | 0 | 0 | | SL4 | (14+4/8)r |
| 5 | 0 | 0 | 0 | 0 | 1 | 0 | 1 | | SL5 | (14+3/8)r |
| 6 | 0 | 0 | 0 | 0 | 1 | 1 | 0 | | SL6 | (14+2/8)r |
| 7 | 0 | 0 | 0 | 0 | 1 | 1 | 1 | | SL7 | (14+1/8)r |
| 8 | 0 | 0 | 0 | 1 | 0 | 0 | 0 | S1 | | 14r |
| 9 | 0 | 0 | 0 | 1 | 0 | 0 | 1 | S1 | SL1 | (13+7/8)r |
| 10 | 0 | 0 | 0 | 1 | 0 | 1 | 0 | S1 | SL2 | (13+6/8)r |
| 11 | 0 | 0 | 0 | 1 | 0 | 1 | 1 | S1 | SL3 | (13+5/8)r |
| 12 | 0 | 0 | 0 | 1 | 1 | 0 | 0 | S1 | SL4 | (13+4/8)r |
| 13 | 0 | 0 | 0 | 1 | 1 | 0 | 1 | S1 | SL5 | (13+3/8)r |
| 14 | 0 | 0 | 0 | 1 | 1 | 1 | 0 | S1 | SL6 | (13+2/8)r |
| 15 | 0 | 0 | 0 | 1 | 1 | 1 | 1 | S1 | SL7 | (13+1/8)r |
| 16 | 0 | 0 | 1 | 0 | 0 | 0 | 0 | S2 | | 13r |
| 17 | 0 | 0 | 1 | 0 | 0 | 0 | 1 | S2 | SL1 | (12+7/8)r |
| 18 | 0 | 0 | 1 | 0 | 0 | 1 | 0 | S2 | SL2 | (12+6/8)r |
| 19 | 0 | 0 | 1 | 0 | 0 | 1 | 1 | S2 | SL3 | (12+5/8)r |
| 20 | 0 | 0 | 1 | 0 | 1 | 0 | 0 | S2 | SL4 | (12+4/8)r |
| 21 | 0 | 0 | 1 | 0 | 1 | 0 | 1 | S2 | SL5 | (12+3/8)r |
| 22 | 0 | 0 | 1 | 0 | 1 | 1 | 0 | S2 | SL6 | (12+2/8)r |
| 23 | 0 | 0 | 1 | 0 | 1 | 1 | 1 | S2 | SL7 | (12+1/8)r |
| 24 | 0 | 0 | 1 | 1 | 0 | 0 | 0 | S3 | | 12r |
| 25 | 0 | 0 | 1 | 1 | 0 | 0 | 1 | S3 | SL1 | (11+7/8)r |
| 26 | 0 | 0 | 1 | 1 | 0 | 1 | 0 | S3 | SL2 | (11+6/8)r |
| 27 | 0 | 0 | 1 | 1 | 0 | 1 | 1 | S3 | SL3 | (11+5/8)r |
| 28 | 0 | 0 | 1 | 1 | 1 | 0 | 0 | S3 | SL4 | (11+4/8)r |
| 29 | 0 | 0 | 1 | 1 | 1 | 0 | 1 | S3 | SL5 | (11+3/8)r |
| 30 | 0 | 0 | 1 | 1 | 1 | 1 | 0 | S3 | SL6 | (11+2/8)r |
| 31 | 0 | 0 | 1 | 1 | 1 | 1 | 1 | S3 | SL7 | (11+1/8)r |
| 32 | 0 | 1 | 0 | 0 | 0 | 0 | 0 | S4 | | 11r |
| 33 | 0 | 1 | 0 | 0 | 0 | 0 | 1 | S4 | SL1 | (10+7/8)r |
| 34 | 0 | 1 | 0 | 0 | 0 | 1 | 0 | S4 | SL2 | (10+6/8)r |
| 35 | 0 | 1 | 0 | 0 | 0 | 1 | 1 | S4 | SL3 | (10+5/8)r |
| 36 | 0 | 1 | 0 | 0 | 1 | 0 | 0 | S4 | SL4 | (10+4/8)r |
| 37 | 0 | 1 | 0 | 0 | 1 | 0 | 1 | S4 | SL5 | (10+3/8)r |
| 38 | 0 | 1 | 0 | 0 | 1 | 1 | 0 | S4 | SL6 | (10+2/8)r |
| 39 | 0 | 1 | 0 | 0 | 1 | 1 | 1 | S4 | SL7 | (10+1/8)r |
| 40 | 0 | 1 | 0 | 1 | 0 | 0 | 0 | S5 | | 10r |
| 41 | 0 | 1 | 0 | 1 | 0 | 0 | 1 | S5 | SL1 | (9+7/8)r |
| 42 | 0 | 1 | 0 | 1 | 0 | 1 | 0 | S5 | SL2 | (9+6/8)r |
| 43 | 0 | 1 | 0 | 1 | 0 | 1 | 1 | S5 | SL3 | (9+5/8)r |

FIG. 4A

| Counter | D | C | B | A | L2 | L1 | L0 | ON-SW | | Resistance value |
|---|---|---|---|---|---|---|---|---|---|---|
| 44 | 0 | 1 | 0 | 1 | 1 | 0 | 0 | S5 | SL4 | (9+4/8)r |
| 45 | 0 | 1 | 0 | 1 | 1 | 0 | 1 | S5 | SL5 | (9+3/8)r |
| 46 | 0 | 1 | 0 | 1 | 1 | 1 | 0 | S5 | SL6 | (9+2/8)r |
| 47 | 0 | 1 | 0 | 1 | 1 | 1 | 1 | S5 | SL7 | (9+1/8)r |
| 48 | 0 | 1 | 1 | 0 | 0 | 0 | 0 | S6 | | 9r |
| 49 | 0 | 1 | 1 | 0 | 0 | 0 | 1 | S6 | SL1 | (8+7/8)r |
| 50 | 0 | 1 | 1 | 0 | 0 | 1 | 0 | S6 | SL2 | (8+6/8)r |
| 51 | 0 | 1 | 1 | 0 | 0 | 1 | 1 | S6 | SL3 | (8+5/8)r |
| 52 | 0 | 1 | 1 | 0 | 1 | 0 | 0 | S6 | SL4 | (8+4/8)r |
| 53 | 0 | 1 | 1 | 0 | 1 | 0 | 1 | S6 | SL5 | (8+3/8)r |
| 54 | 0 | 1 | 1 | 0 | 1 | 1 | 0 | S6 | SL6 | (8+2/8)r |
| 55 | 0 | 1 | 1 | 0 | 1 | 1 | 1 | S6 | SL7 | (8+1/8)r |
| 56 | 0 | 1 | 1 | 1 | 0 | 0 | 0 | S7 | | 8r |
| 57 | 0 | 1 | 1 | 1 | 0 | 0 | 1 | S7 | SL1 | (7+7/8)r |
| 58 | 0 | 1 | 1 | 1 | 0 | 1 | 0 | S7 | SL2 | (7+6/8)r |
| 59 | 0 | 1 | 1 | 1 | 0 | 1 | 1 | S7 | SL3 | (7+5/8)r |
| 60 | 0 | 1 | 1 | 1 | 1 | 0 | 0 | S7 | SL4 | (7+4/8)r |
| 61 | 0 | 1 | 1 | 1 | 1 | 0 | 1 | S7 | SL5 | (7+3/8)r |
| 62 | 0 | 1 | 1 | 1 | 1 | 1 | 0 | S7 | SL6 | (7+2/8)r |
| 63 | 0 | 1 | 1 | 1 | 1 | 1 | 1 | S7 | SL7 | (7+1/8)r |
| 64 | 1 | 0 | 0 | 0 | 0 | 0 | 0 | S8 | | 7r |
| 65 | 1 | 0 | 0 | 0 | 0 | 0 | 1 | S8 | SL1 | (6+7/8)r |
| 66 | 1 | 0 | 0 | 0 | 0 | 1 | 0 | S8 | SL2 | (6+6/8)r |
| 67 | 1 | 0 | 0 | 0 | 0 | 1 | 1 | S8 | SL3 | (6+5/8)r |
| 68 | 1 | 0 | 0 | 0 | 1 | 0 | 0 | S8 | SL4 | (6+4/8)r |
| 69 | 1 | 0 | 0 | 0 | 1 | 0 | 1 | S8 | SL5 | (6+3/8)r |
| 70 | 1 | 0 | 0 | 0 | 1 | 1 | 0 | S8 | SL6 | (6+2/8)r |
| 71 | 1 | 0 | 0 | 0 | 1 | 1 | 1 | S8 | SL7 | (6+1/8)r |
| 72 | 1 | 0 | 0 | 1 | 0 | 0 | 0 | S9 | | 6r |
| 73 | 1 | 0 | 0 | 1 | 0 | 0 | 1 | S9 | SL1 | (5+7/8)r |
| 74 | 1 | 0 | 0 | 1 | 0 | 1 | 0 | S9 | SL2 | (5+6/8)r |
| 75 | 1 | 0 | 0 | 1 | 0 | 1 | 1 | S9 | SL3 | (5+5/8)r |
| 76 | 1 | 0 | 0 | 1 | 1 | 0 | 0 | S9 | SL4 | (5+4/8)r |
| 77 | 1 | 0 | 0 | 1 | 1 | 0 | 1 | S9 | SL5 | (5+3/8)r |
| 78 | 1 | 0 | 0 | 1 | 1 | 1 | 0 | S9 | SL6 | (5+2/8)r |
| 79 | 1 | 0 | 0 | 1 | 1 | 1 | 1 | S9 | SL7 | (5+1/8)r |
| 80 | 1 | 0 | 1 | 0 | 0 | 0 | 0 | S10 | | 5r |
| 81 | 1 | 0 | 1 | 0 | 0 | 0 | 1 | S10 | SL1 | (4+7/8)r |
| 82 | 1 | 0 | 1 | 0 | 0 | 1 | 0 | S10 | SL2 | (4+6/8)r |
| 83 | 1 | 0 | 1 | 0 | 0 | 1 | 1 | S10 | SL3 | (4+5/8)r |
| 84 | 1 | 0 | 1 | 0 | 1 | 0 | 0 | S10 | SL4 | (4+4/8)r |
| 85 | 1 | 0 | 1 | 0 | 1 | 0 | 1 | S10 | SL5 | (4+3/8)r |
| 86 | 1 | 0 | 1 | 0 | 1 | 1 | 0 | S10 | SL6 | (4+2/8)r |

F I G. 4B

| Counter | D | C | B | A | L2 | L1 | L0 | ON-SW | | Resistance value |
|---|---|---|---|---|---|---|---|---|---|---|
| 87 | 1 | 0 | 1 | 0 | 1 | 1 | 1 | S10 | SL7 | (4+1/8)r |
| 88 | 1 | 0 | 1 | 1 | 0 | 0 | 0 | S11 | | 4r |
| 89 | 1 | 0 | 1 | 1 | 0 | 0 | 1 | S11 | SL1 | (3+7/8)r |
| 90 | 1 | 0 | 1 | 1 | 0 | 1 | 0 | S11 | SL2 | (3+6/8)r |
| 91 | 1 | 0 | 1 | 1 | 0 | 1 | 1 | S11 | SL3 | (3+5/8)r |
| 92 | 1 | 0 | 1 | 1 | 1 | 0 | 0 | S11 | SL4 | (3+4/8)r |
| 93 | 1 | 0 | 1 | 1 | 1 | 0 | 1 | S11 | SL5 | (3+3/8)r |
| 94 | 1 | 0 | 1 | 1 | 1 | 1 | 0 | S11 | SL6 | (3+2/8)r |
| 95 | 1 | 0 | 1 | 1 | 1 | 1 | 1 | S11 | SL7 | (3+1/8)r |
| 96 | 1 | 1 | 0 | 0 | 0 | 0 | 0 | S12 | | 3r |
| 97 | 1 | 1 | 0 | 0 | 0 | 0 | 1 | S12 | SL1 | (2+7/8)r |
| 98 | 1 | 1 | 0 | 0 | 0 | 1 | 0 | S12 | SL2 | (2+6/8)r |
| 99 | 1 | 1 | 0 | 0 | 0 | 1 | 1 | S12 | SL3 | (2+5/8)r |
| 100 | 1 | 1 | 0 | 0 | 1 | 0 | 0 | S12 | SL4 | (2+4/8)r |
| 101 | 1 | 1 | 0 | 0 | 1 | 0 | 1 | S12 | SL5 | (2+3/8)r |
| 102 | 1 | 1 | 0 | 0 | 1 | 1 | 0 | S12 | SL6 | (2+2/8)r |
| 103 | 1 | 1 | 0 | 0 | 1 | 1 | 1 | S12 | SL7 | (2+1/8)r |
| 104 | 1 | 1 | 0 | 1 | 0 | 0 | 0 | S13 | | 2r |
| 105 | 1 | 1 | 0 | 1 | 0 | 0 | 1 | S13 | SL1 | (1+7/8)r |
| 106 | 1 | 1 | 0 | 1 | 0 | 1 | 0 | S13 | SL2 | (1+6/8)r |
| 107 | 1 | 1 | 0 | 1 | 0 | 1 | 1 | S13 | SL3 | (1+5/8)r |
| 108 | 1 | 1 | 0 | 1 | 1 | 0 | 0 | S13 | SL4 | (1+4/8)r |
| 109 | 1 | 1 | 0 | 1 | 1 | 0 | 1 | S13 | SL5 | (1+3/8)r |
| 110 | 1 | 1 | 0 | 1 | 1 | 1 | 0 | S13 | SL6 | (1+2/8)r |
| 111 | 1 | 1 | 0 | 1 | 1 | 1 | 1 | S13 | SL7 | (1+1/8)r |
| 112 | 1 | 1 | 1 | 0 | 0 | 0 | 0 | S14 | | r |
| 113 | 1 | 1 | 1 | 0 | 0 | 0 | 1 | S14 | SL1 | (7/8)r |
| 114 | 1 | 1 | 1 | 0 | 0 | 1 | 0 | S14 | SL2 | (6/8)r |
| 115 | 1 | 1 | 1 | 0 | 0 | 1 | 1 | S14 | SL3 | (5/8)r |
| 116 | 1 | 1 | 1 | 0 | 1 | 0 | 0 | S14 | SL4 | (4/8)r |
| 117 | 1 | 1 | 1 | 0 | 1 | 0 | 1 | S14 | SL5 | (3/8)r |
| 118 | 1 | 1 | 1 | 0 | 1 | 1 | 0 | S14 | SL6 | (2/8)r |
| 119 | 1 | 1 | 1 | 0 | 1 | 1 | 1 | S14 | SL7 | (1/8)r |
| 120 | 1 | 1 | 1 | 1 | 0 | 0 | 0 | S15 | | 0 |
| 121 | 1 | 1 | 1 | 1 | 0 | 0 | 1 | S15 | SL1 | 0 |
| 122 | 1 | 1 | 1 | 1 | 0 | 1 | 0 | S15 | SL2 | 0 |
| 123 | 1 | 1 | 1 | 1 | 0 | 1 | 1 | S15 | SL3 | 0 |
| 124 | 1 | 1 | 1 | 1 | 1 | 0 | 0 | S15 | SL4 | 0 |
| 125 | 1 | 1 | 1 | 1 | 1 | 0 | 1 | S15 | SL5 | 0 |
| 126 | 1 | 1 | 1 | 1 | 1 | 1 | 0 | S15 | SL6 | 0 |
| 127 | 1 | 1 | 1 | 1 | 1 | 1 | 1 | S15 | SL7 | 0 |

F I G. 4C

| Counter | D | C | B | A | L2 | L1 | L0 | ON-SW | | Resistance value |
|---|---|---|---|---|---|---|---|---|---|---|
| 0  | 0 | 0 | 0 | 0 | 0 | 0 | 0 |    |     | 15r |
| 1  | 0 | 0 | 0 | 0 | 0 | 0 | 1 |    | SL1 | (14+7/8)r |
| 2  | 0 | 0 | 0 | 0 | 0 | 1 | 0 |    | SL2 | (14+6/8)r |
| 3  | 0 | 0 | 0 | 0 | 0 | 1 | 1 |    | SL3 | (14+5/8)r |
| 4  | 0 | 0 | 0 | 0 | 1 | 0 | 0 |    | SL4 | (14+4/8)r |
| 5  | 0 | 0 | 0 | 0 | 1 | 0 | 1 |    | SL5 | (14+3/8)r |
| 6  | 0 | 0 | 0 | 0 | 1 | 1 | 0 |    | SL6 | (14+2/8)r |
| 7  | 0 | 0 | 0 | 0 | 1 | 1 | 1 |    | SL7 | (14+1/8)r |
| 8  | 0 | 0 | 0 | 1 | 0 | 0 | 0 | S1 |     | 14r+R |
| 9  | 0 | 0 | 0 | 1 | 0 | 0 | 1 | S1 | SL1 | (13+7/8)r+R |
| 10 | 0 | 0 | 0 | 1 | 0 | 1 | 0 | S1 | SL2 | (13+6/8)r+R |
| 11 | 0 | 0 | 0 | 1 | 0 | 1 | 1 | S1 | SL3 | (13+5/8)r+R |
| 12 | 0 | 0 | 0 | 1 | 1 | 0 | 0 | S1 | SL4 | (13+4/8)r+R |
| 13 | 0 | 0 | 0 | 1 | 1 | 0 | 1 | S1 | SL5 | (13+3/8)r+R |
| 14 | 0 | 0 | 0 | 1 | 1 | 1 | 0 | S1 | SL6 | (13+2/8)r+R |
| 15 | 0 | 0 | 0 | 1 | 1 | 1 | 1 | S1 | SL7 | (13+1/8)r+R |
| 16 | 0 | 0 | 1 | 0 | 0 | 0 | 0 | S2 |     | 13r+R |
| 17 | 0 | 0 | 1 | 0 | 0 | 0 | 1 | S2 | SL1 | (12+7/8)r+R |
| 18 | 0 | 0 | 1 | 0 | 0 | 1 | 0 | S2 | SL2 | (12+6/8)r+R |
| 19 | 0 | 0 | 1 | 0 | 0 | 1 | 1 | S2 | SL3 | (12+5/8)r+R |
| 20 | 0 | 0 | 1 | 0 | 1 | 0 | 0 | S2 | SL4 | (12+4/8)r+R |
| 21 | 0 | 0 | 1 | 0 | 1 | 0 | 1 | S2 | SL5 | (12+3/8)r+R |
| 22 | 0 | 0 | 1 | 0 | 1 | 1 | 0 | S2 | SL6 | (12+2/8)r+R |
| 23 | 0 | 0 | 1 | 0 | 1 | 1 | 1 | S2 | SL7 | (12+1/8)r+R |
| 24 | 0 | 0 | 1 | 1 | 0 | 0 | 0 | S3 |     | 12r+R |
| 25 | 0 | 0 | 1 | 1 | 0 | 0 | 1 | S3 | SL1 | (11+7/8)r+R |
| 26 | 0 | 0 | 1 | 1 | 0 | 1 | 0 | S3 | SL2 | (11+6/8)r+R |
| 27 | 0 | 0 | 1 | 1 | 0 | 1 | 1 | S3 | SL3 | (11+5/8)r+R |
| 28 | 0 | 0 | 1 | 1 | 1 | 0 | 0 | S3 | SL4 | (11+4/8)r+R |
| 29 | 0 | 0 | 1 | 1 | 1 | 0 | 1 | S3 | SL5 | (11+3/8)r+R |
| 30 | 0 | 0 | 1 | 1 | 1 | 1 | 0 | S3 | SL6 | (11+2/8)r+R |
| 31 | 0 | 0 | 1 | 1 | 1 | 1 | 1 | S3 | SL7 | (11+1/8)r+R |
| 32 | 0 | 1 | 0 | 0 | 0 | 0 | 0 | S4 |     | 11r+R |
| 33 | 0 | 1 | 0 | 0 | 0 | 0 | 1 | S4 | SL1 | (10+7/8)r+R |
| 34 | 0 | 1 | 0 | 0 | 0 | 1 | 0 | S4 | SL2 | (10+6/8)r+R |
| 35 | 0 | 1 | 0 | 0 | 0 | 1 | 1 | S4 | SL3 | (10+5/8)r+R |
| 36 | 0 | 1 | 0 | 0 | 1 | 0 | 0 | S4 | SL4 | (10+4/8)r+R |
| 37 | 0 | 1 | 0 | 0 | 1 | 0 | 1 | S4 | SL5 | (10+3/8)r+R |
| 38 | 0 | 1 | 0 | 0 | 1 | 1 | 0 | S4 | SL6 | (10+2/8)r+R |
| 39 | 0 | 1 | 0 | 0 | 1 | 1 | 1 | S4 | SL7 | (10+1/8)r+R |
| 40 | 0 | 1 | 0 | 1 | 0 | 0 | 0 | S5 |     | 10r+R |
| 41 | 0 | 1 | 0 | 1 | 0 | 0 | 1 | S5 | SL1 | (9+7/8)r+R |
| 42 | 0 | 1 | 0 | 1 | 0 | 1 | 0 | S5 | SL2 | (9+6/8)r+R |
| 43 | 0 | 1 | 0 | 1 | 0 | 1 | 1 | S5 | SL3 | (9+5/8)r+R |

FIG. 6A

| Counter | D | C | B | A | L2 | L1 | L0 | ON-SW | | Resistance value |
|---|---|---|---|---|---|---|---|---|---|---|
| 44 | 0 | 1 | 0 | 1 | 1 | 0 | 0 | S5 | SL4 | (9+4/8)r+R |
| 45 | 0 | 1 | 0 | 1 | 1 | 0 | 1 | S5 | SL5 | (9+3/8)r+R |
| 46 | 0 | 1 | 0 | 1 | 1 | 1 | 0 | S5 | SL6 | (9+2/8)r+R |
| 47 | 0 | 1 | 0 | 1 | 1 | 1 | 1 | S5 | SL7 | (9+1/8)r+R |
| 48 | 0 | 1 | 1 | 0 | 0 | 0 | 0 | S6 | | 9r+R |
| 49 | 0 | 1 | 1 | 0 | 0 | 0 | 1 | S6 | SL1 | (8+7/8)r+R |
| 50 | 0 | 1 | 1 | 0 | 0 | 1 | 0 | S6 | SL2 | (8+6/8)r+R |
| 51 | 0 | 1 | 1 | 0 | 0 | 1 | 1 | S6 | SL3 | (8+5/8)r+R |
| 52 | 0 | 1 | 1 | 0 | 1 | 0 | 0 | S6 | SL4 | (8+4/8)r+R |
| 53 | 0 | 1 | 1 | 0 | 1 | 0 | 1 | S6 | SL5 | (8+3/8)r+R |
| 54 | 0 | 1 | 1 | 0 | 1 | 1 | 0 | S6 | SL6 | (8+2/8)r+R |
| 55 | 0 | 1 | 1 | 0 | 1 | 1 | 1 | S6 | SL7 | (8+1/8)r+R |
| 56 | 0 | 1 | 1 | 1 | 0 | 0 | 0 | S7 | | 8r+R |
| 57 | 0 | 1 | 1 | 1 | 0 | 0 | 1 | S7 | SL1 | (7+7/8)r+R |
| 58 | 0 | 1 | 1 | 1 | 0 | 1 | 0 | S7 | SL2 | (7+6/8)r+R |
| 59 | 0 | 1 | 1 | 1 | 0 | 1 | 1 | S7 | SL3 | (7+5/8)r+R |
| 60 | 0 | 1 | 1 | 1 | 1 | 0 | 0 | S7 | SL4 | (7+4/8)r+R |
| 61 | 0 | 1 | 1 | 1 | 1 | 0 | 1 | S7 | SL5 | (7+3/8)r+R |
| 62 | 0 | 1 | 1 | 1 | 1 | 1 | 0 | S7 | SL6 | (7+2/8)r+R |
| 63 | 0 | 1 | 1 | 1 | 1 | 1 | 1 | S7 | SL7 | (7+1/8)r+R |
| 64 | 1 | 0 | 0 | 0 | 0 | 0 | 0 | S8 | | 7r+R |
| 65 | 1 | 0 | 0 | 0 | 0 | 0 | 1 | S8 | SL1 | (6+7/8)r+R |
| 66 | 1 | 0 | 0 | 0 | 0 | 1 | 0 | S8 | SL2 | (6+6/8)r+R |
| 67 | 1 | 0 | 0 | 0 | 0 | 1 | 1 | S8 | SL3 | (6+5/8)r+R |
| 68 | 1 | 0 | 0 | 0 | 1 | 0 | 0 | S8 | SL4 | (6+4/8)r+R |
| 69 | 1 | 0 | 0 | 0 | 1 | 0 | 1 | S8 | SL5 | (6+3/8)r+R |
| 70 | 1 | 0 | 0 | 0 | 1 | 1 | 0 | S8 | SL6 | (6+2/8)r+R |
| 71 | 1 | 0 | 0 | 0 | 1 | 1 | 1 | S8 | SL7 | (6+1/8)r+R |
| 72 | 1 | 0 | 0 | 1 | 0 | 0 | 0 | S9 | | 6r+R |
| 73 | 1 | 0 | 0 | 1 | 0 | 0 | 1 | S9 | SL1 | (5+7/8)r+R |
| 74 | 1 | 0 | 0 | 1 | 0 | 1 | 0 | S9 | SL2 | (5+6/8)r+R |
| 75 | 1 | 0 | 0 | 1 | 0 | 1 | 1 | S9 | SL3 | (5+5/8)r+R |
| 76 | 1 | 0 | 0 | 1 | 1 | 0 | 0 | S9 | SL4 | (5+4/8)r+R |
| 77 | 1 | 0 | 0 | 1 | 1 | 0 | 1 | S9 | SL5 | (5+3/8)r+R |
| 78 | 1 | 0 | 0 | 1 | 1 | 1 | 0 | S9 | SL6 | (5+2/8)r+R |
| 79 | 1 | 0 | 0 | 1 | 1 | 1 | 1 | S9 | SL7 | (5+1/8)r+R |
| 80 | 1 | 0 | 1 | 0 | 0 | 0 | 0 | S10 | | 5r+R |
| 81 | 1 | 0 | 1 | 0 | 0 | 0 | 1 | S10 | SL1 | (4+7/8)r+R |
| 82 | 1 | 0 | 1 | 0 | 0 | 1 | 0 | S10 | SL2 | (4+6/8)r+R |
| 83 | 1 | 0 | 1 | 0 | 0 | 1 | 1 | S10 | SL3 | (4+5/8)r+R |
| 84 | 1 | 0 | 1 | 0 | 1 | 0 | 0 | S10 | SL4 | (4+4/8)r+R |
| 85 | 1 | 0 | 1 | 0 | 1 | 0 | 1 | S10 | SL5 | (4+3/8)r+R |
| 86 | 1 | 0 | 1 | 0 | 1 | 1 | 0 | S10 | SL6 | (4+2/8)r+R |

FIG. 6B

| Counter | D | C | B | A | L2 | L1 | L0 | ON-SW | | Resistance value |
|---|---|---|---|---|---|---|---|---|---|---|
| 87 | 1 | 0 | 1 | 0 | 1 | 1 | 1 | S10 | SL7 | (4+1/8)r+R |
| 88 | 1 | 0 | 1 | 1 | 0 | 0 | 0 | S11 | | 4r+R |
| 89 | 1 | 0 | 1 | 1 | 0 | 0 | 1 | S11 | SL1 | (3+7/8)r+R |
| 90 | 1 | 0 | 1 | 1 | 0 | 1 | 0 | S11 | SL2 | (3+6/8)r+R |
| 91 | 1 | 0 | 1 | 1 | 0 | 1 | 1 | S11 | SL3 | (3+5/8)r+R |
| 92 | 1 | 0 | 1 | 1 | 1 | 0 | 0 | S11 | SL4 | (3+4/8)r+R |
| 93 | 1 | 0 | 1 | 1 | 1 | 0 | 1 | S11 | SL5 | (3+3/8)r+R |
| 94 | 1 | 0 | 1 | 1 | 1 | 1 | 0 | S11 | SL6 | (3+2/8)r+R |
| 95 | 1 | 0 | 1 | 1 | 1 | 1 | 1 | S11 | SL7 | (3+1/8)r+R |
| 96 | 1 | 1 | 0 | 0 | 0 | 0 | 0 | S12 | | 3r+R |
| 97 | 1 | 1 | 0 | 0 | 0 | 0 | 1 | S12 | SL1 | (2+7/8)r+R |
| 98 | 1 | 1 | 0 | 0 | 0 | 1 | 0 | S12 | SL2 | (2+6/8)r+R |
| 99 | 1 | 1 | 0 | 0 | 0 | 1 | 1 | S12 | SL3 | (2+5/8)r+R |
| 100 | 1 | 1 | 0 | 0 | 1 | 0 | 0 | S12 | SL4 | (2+4/8)r+R |
| 101 | 1 | 1 | 0 | 0 | 1 | 0 | 1 | S12 | SL5 | (2+3/8)r+R |
| 102 | 1 | 1 | 0 | 0 | 1 | 1 | 0 | S12 | SL6 | (2+2/8)r+R |
| 103 | 1 | 1 | 0 | 0 | 1 | 1 | 1 | S12 | SL7 | (2+1/8)r+R |
| 104 | 1 | 1 | 0 | 1 | 0 | 0 | 0 | S13 | | 2r+R |
| 105 | 1 | 1 | 0 | 1 | 0 | 0 | 1 | S13 | SL1 | (1+7/8)r+R |
| 106 | 1 | 1 | 0 | 1 | 0 | 1 | 0 | S13 | SL2 | (1+6/8)r+R |
| 107 | 1 | 1 | 0 | 1 | 0 | 1 | 1 | S13 | SL3 | (1+5/8)r+R |
| 108 | 1 | 1 | 0 | 1 | 1 | 0 | 0 | S13 | SL4 | (1+4/8)r+R |
| 109 | 1 | 1 | 0 | 1 | 1 | 0 | 1 | S13 | SL5 | (1+3/8)r+R |
| 110 | 1 | 1 | 0 | 1 | 1 | 1 | 0 | S13 | SL6 | (1+2/8)r+R |
| 111 | 1 | 1 | 0 | 1 | 1 | 1 | 1 | S13 | SL7 | (1+1/8)r+R |
| 112 | 1 | 1 | 1 | 0 | 0 | 0 | 0 | S14 | | r+R |
| 113 | 1 | 1 | 1 | 0 | 0 | 0 | 1 | S14 | SL1 | (7/8)r+R |
| 114 | 1 | 1 | 1 | 0 | 0 | 1 | 0 | S14 | SL2 | (6/8)r+R |
| 115 | 1 | 1 | 1 | 0 | 0 | 1 | 1 | S14 | SL3 | (5/8)r+R |
| 116 | 1 | 1 | 1 | 0 | 1 | 0 | 0 | S14 | SL4 | (4/8)r+R |
| 117 | 1 | 1 | 1 | 0 | 1 | 0 | 1 | S14 | SL5 | (3/8)r+R |
| 118 | 1 | 1 | 1 | 0 | 1 | 1 | 0 | S14 | SL6 | (2/8)r+R |
| 119 | 1 | 1 | 1 | 0 | 1 | 1 | 1 | S14 | SL7 | (1/8)r+R |
| 120 | 1 | 1 | 1 | 1 | 0 | 0 | 0 | S15 | | R0 |
| 121 | 1 | 1 | 1 | 1 | 0 | 0 | 1 | S15 | SL1 | R0 |
| 122 | 1 | 1 | 1 | 1 | 0 | 1 | 0 | S15 | SL2 | R0 |
| 123 | 1 | 1 | 1 | 1 | 0 | 1 | 1 | S15 | SL3 | R0 |
| 124 | 1 | 1 | 1 | 1 | 1 | 0 | 0 | S15 | SL4 | R0 |
| 125 | 1 | 1 | 1 | 1 | 1 | 0 | 1 | S15 | SL5 | R0 |
| 126 | 1 | 1 | 1 | 1 | 1 | 1 | 0 | S15 | SL6 | R0 |
| 127 | 1 | 1 | 1 | 1 | 1 | 1 | 1 | S15 | SL7 | R0 |

FIG. 6C

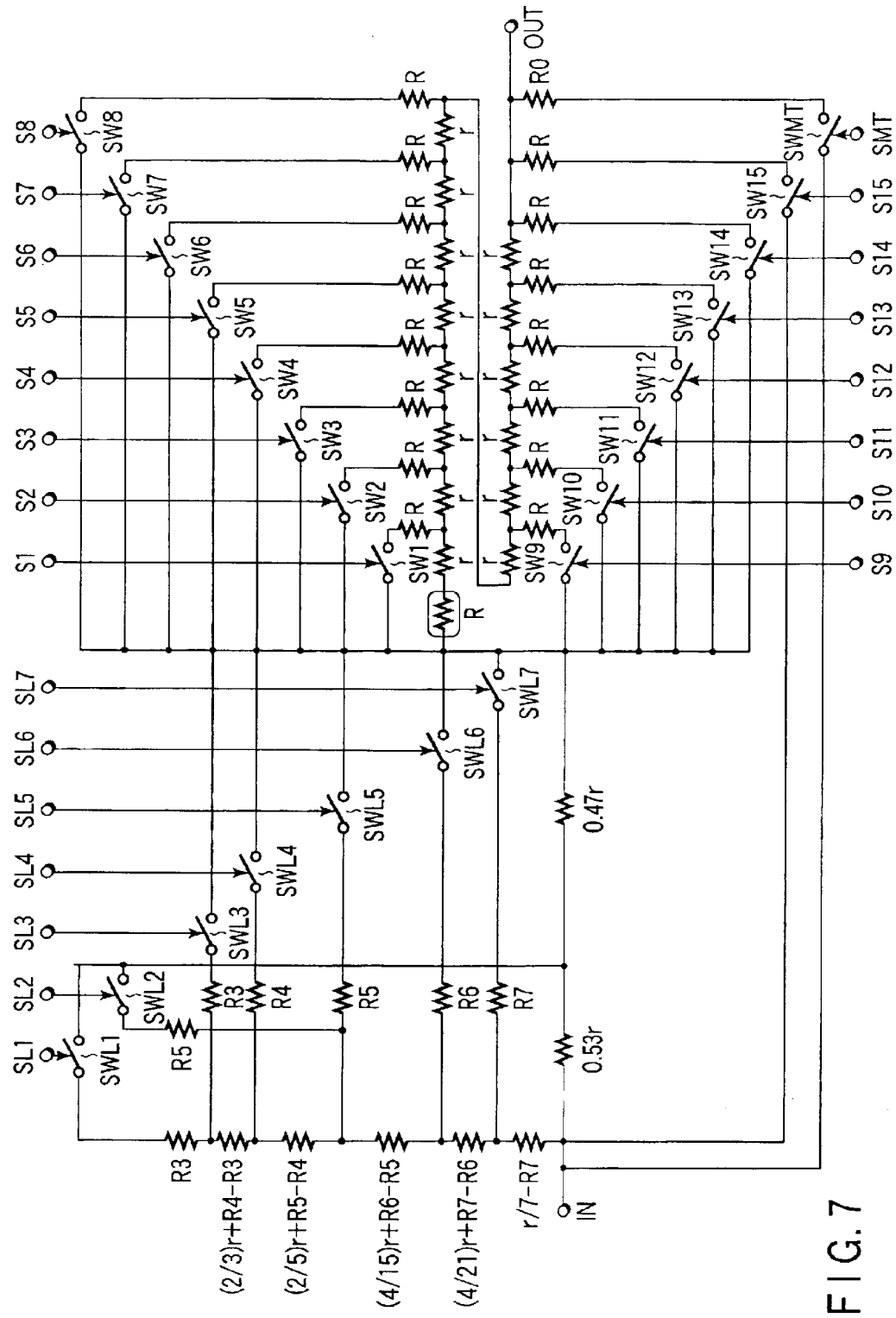
F I G. 7

| Counter | D | C | B | A | L2 | L1 | L0 | ON-SW | | Resistance value |
|---|---|---|---|---|---|---|---|---|---|---|
| 0 | 0 | 0 | 0 | 0 | 0 | 0 | 0 | | | 15r+R |
| 1 | 0 | 0 | 0 | 0 | 0 | 0 | 1 | | SL1 | (14+7/8)r+R |
| 2 | 0 | 0 | 0 | 0 | 0 | 1 | 0 | | SL2 | (14+6/8)r+R |
| 3 | 0 | 0 | 0 | 0 | 0 | 1 | 1 | | SL3 | (14+5/8)r+R |
| 4 | 0 | 0 | 0 | 0 | 1 | 0 | 0 | | SL4 | (14+4/8)r+R |
| 5 | 0 | 0 | 0 | 0 | 1 | 0 | 1 | | SL5 | (14+3/8)r+R |
| 6 | 0 | 0 | 0 | 0 | 1 | 1 | 0 | | SL6 | (14+2/8)r+R |
| 7 | 0 | 0 | 0 | 0 | 1 | 1 | 1 | | SL7 | (14+1/8)r+R |
| 8 | 0 | 0 | 0 | 1 | 0 | 0 | 0 | S1 | | 14r+R |
| 9 | 0 | 0 | 0 | 1 | 0 | 0 | 1 | S1 | SL1 | (13+7/8)r+R |
| 10 | 0 | 0 | 0 | 1 | 0 | 1 | 0 | S1 | SL2 | (13+6/8)r+R |
| 11 | 0 | 0 | 0 | 1 | 0 | 1 | 1 | S1 | SL3 | (13+5/8)r+R |
| 12 | 0 | 0 | 0 | 1 | 1 | 0 | 0 | S1 | SL4 | (13+4/8)r+R |
| 13 | 0 | 0 | 0 | 1 | 1 | 0 | 1 | S1 | SL5 | (13+3/8)r+R |
| 14 | 0 | 0 | 0 | 1 | 1 | 1 | 0 | S1 | SL6 | (13+2/8)r+R |
| 15 | 0 | 0 | 0 | 1 | 1 | 1 | 1 | S1 | SL7 | (13+1/8)r+R |
| 16 | 0 | 0 | 1 | 0 | 0 | 0 | 0 | S2 | | 13r+R |
| 17 | 0 | 0 | 1 | 0 | 0 | 0 | 1 | S2 | SL1 | (12+7/8)r+R |
| 18 | 0 | 0 | 1 | 0 | 0 | 1 | 0 | S2 | SL2 | (12+6/8)r+R |
| 19 | 0 | 0 | 1 | 0 | 0 | 1 | 1 | S2 | SL3 | (12+5/8)r+R |
| 20 | 0 | 0 | 1 | 0 | 1 | 0 | 0 | S2 | SL4 | (12+4/8)r+R |
| 21 | 0 | 0 | 1 | 0 | 1 | 0 | 1 | S2 | SL5 | (12+3/8)r+R |
| 22 | 0 | 0 | 1 | 0 | 1 | 1 | 0 | S2 | SL6 | (12+2/8)r+R |
| 23 | 0 | 0 | 1 | 0 | 1 | 1 | 1 | S2 | SL7 | (12+1/8)r+R |
| 24 | 0 | 0 | 1 | 1 | 0 | 0 | 0 | S3 | | 12r+R |
| 25 | 0 | 0 | 1 | 1 | 0 | 0 | 1 | S3 | SL1 | (11+7/8)r+R |
| 26 | 0 | 0 | 1 | 1 | 0 | 1 | 0 | S3 | SL2 | (11+6/8)r+R |
| 27 | 0 | 0 | 1 | 1 | 0 | 1 | 1 | S3 | SL3 | (11+5/8)r+R |
| 28 | 0 | 0 | 1 | 1 | 1 | 0 | 0 | S3 | SL4 | (11+4/8)r+R |
| 29 | 0 | 0 | 1 | 1 | 1 | 0 | 1 | S3 | SL5 | (11+3/8)r+R |
| 30 | 0 | 0 | 1 | 1 | 1 | 1 | 0 | S3 | SL6 | (11+2/8)r+R |
| 31 | 0 | 0 | 1 | 1 | 1 | 1 | 1 | S3 | SL7 | (11+1/8)r+R |
| 32 | 0 | 1 | 0 | 0 | 0 | 0 | 0 | S4 | | 11r+R |
| 33 | 0 | 1 | 0 | 0 | 0 | 0 | 1 | S4 | SL1 | (10+7/8)r+R |
| 34 | 0 | 1 | 0 | 0 | 0 | 1 | 0 | S4 | SL2 | (10+6/8)r+R |
| 35 | 0 | 1 | 0 | 0 | 0 | 1 | 1 | S4 | SL3 | (10+5/8)r+R |
| 36 | 0 | 1 | 0 | 0 | 1 | 0 | 0 | S4 | SL4 | (10+4/8)r+R |
| 37 | 0 | 1 | 0 | 0 | 1 | 0 | 1 | S4 | SL5 | (10+3/8)r+R |
| 38 | 0 | 1 | 0 | 0 | 1 | 1 | 0 | S4 | SL6 | (10+2/8)r+R |
| 39 | 0 | 1 | 0 | 0 | 1 | 1 | 1 | S4 | SL7 | (10+1/8)r+R |
| 40 | 0 | 1 | 0 | 1 | 0 | 0 | 0 | S5 | | 10r+R |
| 41 | 0 | 1 | 0 | 1 | 0 | 0 | 1 | S5 | SL1 | (9+7/8)r+R |
| 42 | 0 | 1 | 0 | 1 | 0 | 1 | 0 | S5 | SL2 | (9+6/8)r+R |
| 43 | 0 | 1 | 0 | 1 | 0 | 1 | 1 | S5 | SL3 | (9+5/8)r+R |

FIG. 8A

| Counter | D | C | B | A | L2 | L1 | L0 | ON-SW | | Resistance value |
|---|---|---|---|---|---|---|---|---|---|---|
| 44 | 0 | 1 | 0 | 1 | 1 | 0 | 0 | S5 | SL4 | (9+4/8)r+R |
| 45 | 0 | 1 | 0 | 1 | 1 | 0 | 1 | S5 | SL5 | (9+3/8)r+R |
| 46 | 0 | 1 | 0 | 1 | 1 | 1 | 0 | S5 | SL6 | (9+2/8)r+R |
| 47 | 0 | 1 | 0 | 1 | 1 | 1 | 1 | S5 | SL7 | (9+1/8)r+R |
| 48 | 0 | 1 | 1 | 0 | 0 | 0 | 0 | S6 | | 9r+R |
| 49 | 0 | 1 | 1 | 0 | 0 | 0 | 1 | S6 | SL1 | (8+7/8)r+R |
| 50 | 0 | 1 | 1 | 0 | 0 | 1 | 0 | S6 | SL2 | (8+6/8)r+R |
| 51 | 0 | 1 | 1 | 0 | 0 | 1 | 1 | S6 | SL3 | (8+5/8)r+R |
| 52 | 0 | 1 | 1 | 0 | 1 | 0 | 0 | S6 | SL4 | (8+4/8)r+R |
| 53 | 0 | 1 | 1 | 0 | 1 | 0 | 1 | S6 | SL5 | (8+3/8)r+R |
| 54 | 0 | 1 | 1 | 0 | 1 | 1 | 0 | S6 | SL6 | (8+2/8)r+R |
| 55 | 0 | 1 | 1 | 0 | 1 | 1 | 1 | S6 | SL7 | (8+1/8)r+R |
| 56 | 0 | 1 | 1 | 1 | 0 | 0 | 0 | S7 | | 8r+R |
| 57 | 0 | 1 | 1 | 1 | 0 | 0 | 1 | S7 | SL1 | (7+7/8)r+R |
| 58 | 0 | 1 | 1 | 1 | 0 | 1 | 0 | S7 | SL2 | (7+6/8)r+R |
| 59 | 0 | 1 | 1 | 1 | 0 | 1 | 1 | S7 | SL3 | (7+5/8)r+R |
| 60 | 0 | 1 | 1 | 1 | 1 | 0 | 0 | S7 | SL4 | (7+4/8)r+R |
| 61 | 0 | 1 | 1 | 1 | 1 | 0 | 1 | S7 | SL5 | (7+3/8)r+R |
| 62 | 0 | 1 | 1 | 1 | 1 | 1 | 0 | S7 | SL6 | (7+2/8)r+R |
| 63 | 0 | 1 | 1 | 1 | 1 | 1 | 1 | S7 | SL7 | (7+1/8)r+R |
| 64 | 1 | 0 | 0 | 0 | 0 | 0 | 0 | S8 | | 7r+R |
| 65 | 1 | 0 | 0 | 0 | 0 | 0 | 1 | S8 | SL1 | (6+7/8)r+R |
| 66 | 1 | 0 | 0 | 0 | 0 | 1 | 0 | S8 | SL2 | (6+6/8)r+R |
| 67 | 1 | 0 | 0 | 0 | 0 | 1 | 1 | S8 | SL3 | (6+5/8)r+R |
| 68 | 1 | 0 | 0 | 0 | 1 | 0 | 0 | S8 | SL4 | (6+4/8)r+R |
| 69 | 1 | 0 | 0 | 0 | 1 | 0 | 1 | S8 | SL5 | (6+3/8)r+R |
| 70 | 1 | 0 | 0 | 0 | 1 | 1 | 0 | S8 | SL6 | (6+2/8)r+R |
| 71 | 1 | 0 | 0 | 0 | 1 | 1 | 1 | S8 | SL7 | (6+1/8)r+R |
| 72 | 1 | 0 | 0 | 1 | 0 | 0 | 0 | S9 | | 6r+R |
| 73 | 1 | 0 | 0 | 1 | 0 | 0 | 1 | S9 | SL1 | (5+7/8)r+R |
| 74 | 1 | 0 | 0 | 1 | 0 | 1 | 0 | S9 | SL2 | (5+6/8)r+R |
| 75 | 1 | 0 | 0 | 1 | 0 | 1 | 1 | S9 | SL3 | (5+5/8)r+R |
| 76 | 1 | 0 | 0 | 1 | 1 | 0 | 0 | S9 | SL4 | (5+4/8)r+R |
| 77 | 1 | 0 | 0 | 1 | 1 | 0 | 1 | S9 | SL5 | (5+3/8)r+R |
| 78 | 1 | 0 | 0 | 1 | 1 | 1 | 0 | S9 | SL6 | (5+2/8)r+R |
| 79 | 1 | 0 | 0 | 1 | 1 | 1 | 1 | S9 | SL7 | (5+1/8)r+R |
| 80 | 1 | 0 | 1 | 0 | 0 | 0 | 0 | S10 | | 5r+R |
| 81 | 1 | 0 | 1 | 0 | 0 | 0 | 1 | S10 | SL1 | (4+7/8)r+R |
| 82 | 1 | 0 | 1 | 0 | 0 | 1 | 0 | S10 | SL2 | (4+6/8)r+R |
| 83 | 1 | 0 | 1 | 0 | 0 | 1 | 1 | S10 | SL3 | (4+5/8)r+R |
| 84 | 1 | 0 | 1 | 0 | 1 | 0 | 0 | S10 | SL4 | (4+4/8)r+R |
| 85 | 1 | 0 | 1 | 0 | 1 | 0 | 1 | S10 | SL5 | (4+3/8)r+R |
| 86 | 1 | 0 | 1 | 0 | 1 | 1 | 0 | S10 | SL6 | (4+2/8)r+R |

FIG. 8B

| Counter | D | C | B | A | L2 | L1 | L0 | ON-SW | | Resistance value |
|---|---|---|---|---|---|---|---|---|---|---|
| 87 | 1 | 0 | 1 | 0 | 1 | 1 | 1 | S10 | SL7 | (4+1/8)r+R |
| 88 | 1 | 0 | 1 | 1 | 0 | 0 | 0 | S11 | | 4r+R |
| 89 | 1 | 0 | 1 | 1 | 0 | 0 | 1 | S11 | SL1 | (3+7/8)r+R |
| 90 | 1 | 0 | 1 | 1 | 0 | 1 | 0 | S11 | SL2 | (3+6/8)r+R |
| 91 | 1 | 0 | 1 | 1 | 0 | 1 | 1 | S11 | SL3 | (3+5/8)r+R |
| 92 | 1 | 0 | 1 | 1 | 1 | 0 | 0 | S11 | SL4 | (3+4/8)r+R |
| 93 | 1 | 0 | 1 | 1 | 1 | 0 | 1 | S11 | SL5 | (3+3/8)r+R |
| 94 | 1 | 0 | 1 | 1 | 1 | 1 | 0 | S11 | SL6 | (3+2/8)r+R |
| 95 | 1 | 0 | 1 | 1 | 1 | 1 | 1 | S11 | SL7 | (3+1/8)r+R |
| 96 | 1 | 1 | 0 | 0 | 0 | 0 | 0 | S12 | | 3r+R |
| 97 | 1 | 1 | 0 | 0 | 0 | 0 | 1 | S12 | SL1 | (2+7/8)r+R |
| 98 | 1 | 1 | 0 | 0 | 0 | 1 | 0 | S12 | SL2 | (2+6/8)r+R |
| 99 | 1 | 1 | 0 | 0 | 0 | 1 | 1 | S12 | SL3 | (2+5/8)r+R |
| 100 | 1 | 1 | 0 | 0 | 1 | 0 | 0 | S12 | SL4 | (2+4/8)r+R |
| 101 | 1 | 1 | 0 | 0 | 1 | 0 | 1 | S12 | SL5 | (2+3/8)r+R |
| 102 | 1 | 1 | 0 | 0 | 1 | 1 | 0 | S12 | SL6 | (2+2/8)r+R |
| 103 | 1 | 1 | 0 | 0 | 1 | 1 | 1 | S12 | SL7 | (2+1/8)r+R |
| 104 | 1 | 1 | 0 | 1 | 0 | 0 | 0 | S13 | | 2r+R |
| 105 | 1 | 1 | 0 | 1 | 0 | 0 | 1 | S13 | SL1 | (1+7/8)r+R |
| 106 | 1 | 1 | 0 | 1 | 0 | 1 | 0 | S13 | SL2 | (1+6/8)r+R |
| 107 | 1 | 1 | 0 | 1 | 0 | 1 | 1 | S13 | SL3 | (1+5/8)r+R |
| 108 | 1 | 1 | 0 | 1 | 1 | 0 | 0 | S13 | SL4 | (1+4/8)r+R |
| 109 | 1 | 1 | 0 | 1 | 1 | 0 | 1 | S13 | SL5 | (1+3/8)r+R |
| 110 | 1 | 1 | 0 | 1 | 1 | 1 | 0 | S13 | SL6 | (1+2/8)r+R |
| 111 | 1 | 1 | 0 | 1 | 1 | 1 | 1 | S13 | SL7 | (1+1/8)r+R |
| 112 | 1 | 1 | 1 | 0 | 0 | 0 | 0 | S14 | | r+R |
| 113 | 1 | 1 | 1 | 0 | 0 | 0 | 1 | S14 | SL1 | (7/8)r+R |
| 114 | 1 | 1 | 1 | 0 | 0 | 1 | 0 | S14 | SL2 | (6/8)r+R |
| 115 | 1 | 1 | 1 | 0 | 0 | 1 | 1 | S14 | SL3 | (5/8)r+R |
| 116 | 1 | 1 | 1 | 0 | 1 | 0 | 0 | S14 | SL4 | (4/8)r+R |
| 117 | 1 | 1 | 1 | 0 | 1 | 0 | 1 | S14 | SL5 | (3/8)r+R |
| 118 | 1 | 1 | 1 | 0 | 1 | 1 | 0 | S14 | SL6 | (2/8)r+R |
| 119 | 1 | 1 | 1 | 0 | 1 | 1 | 1 | S14 | SL7 | (1/8)r+R |
| 120 | 1 | 1 | 1 | 1 | 0 | 0 | 0 | S15 | | R |
| 121 | 1 | 1 | 1 | 1 | 0 | 0 | 1 | S15 | SMT | R//R0 |
| 122 | 1 | 1 | 1 | 1 | 0 | 1 | 0 | S15 | SMT | R//R0 |
| 123 | 1 | 1 | 1 | 1 | 0 | 1 | 1 | S15 | SMT | R//R0 |
| 124 | 1 | 1 | 1 | 1 | 1 | 0 | 0 | S15 | SMT | R//R0 |
| 125 | 1 | 1 | 1 | 1 | 1 | 0 | 1 | S15 | SMT | R//R0 |
| 126 | 1 | 1 | 1 | 1 | 1 | 1 | 0 | S15 | SMT | R//R0 |
| 127 | 1 | 1 | 1 | 1 | 1 | 1 | 1 | S15 | SMT | R//R0 |

FIG. 8C

| Counter | D | C | B | A | L2 | L1 | L0 | ON-SW | | Resistance value |
|---|---|---|---|---|---|---|---|---|---|---|
| 0 | 0 | 0 | 0 | 0 | 0 | 0 | 0 | | | 15r+R |
| 1 | 0 | 0 | 0 | 0 | 0 | 0 | 1 | | SL1 | (14+7/8)r+R |
| 2 | 0 | 0 | 0 | 0 | 0 | 1 | 0 | | SL2 | (14+6/8)r+R |
| 3 | 0 | 0 | 0 | 0 | 0 | 1 | 1 | | SL3 | (14+5/8)r+R |
| 4 | 0 | 0 | 0 | 0 | 1 | 0 | 0 | | SL4 | (14+4/8)r+R |
| 5 | 0 | 0 | 0 | 0 | 1 | 0 | 1 | | SL5 | (14+3/8)r+R |
| 6 | 0 | 0 | 0 | 0 | 1 | 1 | 0 | | SL6 | (14+2/8)r+R |
| 7 | 0 | 0 | 0 | 0 | 1 | 1 | 1 | | SL7 | (14+1/8)r+R |
| 8 | 0 | 0 | 0 | 1 | 0 | 0 | 0 | S1 | | 14r+R |
| 9 | 0 | 0 | 0 | 1 | 0 | 0 | 1 | S1 | SL1 | (13+7/8)r+R |
| 10 | 0 | 0 | 0 | 1 | 0 | 1 | 0 | S1 | SL2 | (13+6/8)r+R |
| 11 | 0 | 0 | 0 | 1 | 0 | 1 | 1 | S1 | SL3 | (13+5/8)r+R |
| 12 | 0 | 0 | 0 | 1 | 1 | 0 | 0 | S1 | SL4 | (13+4/8)r+R |
| 13 | 0 | 0 | 0 | 1 | 1 | 0 | 1 | S1 | SL5 | (13+3/8)r+R |
| 14 | 0 | 0 | 0 | 1 | 1 | 1 | 0 | S1 | SL6 | (13+2/8)r+R |
| 15 | 0 | 0 | 0 | 1 | 1 | 1 | 1 | S1 | SL7 | (13+1/8)r+R |
| 16 | 0 | 0 | 1 | 0 | 0 | 0 | 0 | S2 | | 13r+R |
| 17 | 0 | 0 | 1 | 0 | 0 | 0 | 1 | S2 | SL1 | (12+7/8)r+R |
| 18 | 0 | 0 | 1 | 0 | 0 | 1 | 0 | S2 | SL2 | (12+6/8)r+R |
| 19 | 0 | 0 | 1 | 0 | 0 | 1 | 1 | S2 | SL3 | (12+5/8)r+R |
| 20 | 0 | 0 | 1 | 0 | 1 | 0 | 0 | S2 | SL4 | (12+4/8)r+R |
| 21 | 0 | 0 | 1 | 0 | 1 | 0 | 1 | S2 | SL5 | (12+3/8)r+R |
| 22 | 0 | 0 | 1 | 0 | 1 | 1 | 0 | S2 | SL6 | (12+2/8)r+R |
| 23 | 0 | 0 | 1 | 0 | 1 | 1 | 1 | S2 | SL7 | (12+1/8)r+R |
| 24 | 0 | 0 | 1 | 1 | 0 | 0 | 0 | S3 | | 12r+R |
| 25 | 0 | 0 | 1 | 1 | 0 | 0 | 1 | S3 | SL1 | (11+7/8)r+R |
| 26 | 0 | 0 | 1 | 1 | 0 | 1 | 0 | S3 | SL2 | (11+6/8)r+R |
| 27 | 0 | 0 | 1 | 1 | 0 | 1 | 1 | S3 | SL3 | (11+5/8)r+R |
| 28 | 0 | 0 | 1 | 1 | 1 | 0 | 0 | S3 | SL4 | (11+4/8)r+R |
| 29 | 0 | 0 | 1 | 1 | 1 | 0 | 1 | S3 | SL5 | (11+3/8)r+R |
| 30 | 0 | 0 | 1 | 1 | 1 | 1 | 0 | S3 | SL6 | (11+2/8)r+R |
| 31 | 0 | 0 | 1 | 1 | 1 | 1 | 1 | S3 | SL7 | (11+1/8)r+R |
| 32 | 0 | 1 | 0 | 0 | 0 | 0 | 0 | S4 | | 11r+R |
| 33 | 0 | 1 | 0 | 0 | 0 | 0 | 1 | S4 | SL1 | (10+7/8)r+R |
| 34 | 0 | 1 | 0 | 0 | 0 | 1 | 0 | S4 | SL2 | (10+6/8)r+R |
| 35 | 0 | 1 | 0 | 0 | 0 | 1 | 1 | S4 | SL3 | (10+5/8)r+R |
| 36 | 0 | 1 | 0 | 0 | 1 | 0 | 0 | S4 | SL4 | (10+4/8)r+R |
| 37 | 0 | 1 | 0 | 0 | 1 | 0 | 1 | S4 | SL5 | (10+3/8)r+R |
| 38 | 0 | 1 | 0 | 0 | 1 | 1 | 0 | S4 | SL6 | (10+2/8)r+R |
| 39 | 0 | 1 | 0 | 0 | 1 | 1 | 1 | S4 | SL7 | (10+1/8)r+R |
| 40 | 0 | 1 | 0 | 1 | 0 | 0 | 0 | S5 | | 10r+R |
| 41 | 0 | 1 | 0 | 1 | 0 | 0 | 1 | S5 | SL1 | (9+7/8)r+R |
| 42 | 0 | 1 | 0 | 1 | 0 | 1 | 0 | S5 | SL2 | (9+6/8)r+R |
| 43 | 0 | 1 | 0 | 1 | 0 | 1 | 1 | S5 | SL3 | (9+5/8)r+R |

FIG. 11A

| Counter | D | C | B | A | L2 | L1 | L0 | ON-SW | | Resistance value |
|---|---|---|---|---|---|---|---|---|---|---|
| 44 | 0 | 1 | 0 | 1 | 1 | 0 | 0 | S5 | SL4 | (9+4/8)r+R |
| 45 | 0 | 1 | 0 | 1 | 1 | 0 | 1 | S5 | SL5 | (9+3/8)r+R |
| 46 | 0 | 1 | 0 | 1 | 1 | 1 | 0 | S5 | SL6 | (9+2/8)r+R |
| 47 | 0 | 1 | 0 | 1 | 1 | 1 | 1 | S5 | SL7 | (9+1/8)r+R |
| 48 | 0 | 1 | 1 | 0 | 0 | 0 | 0 | S6 |  | 9r+R |
| 49 | 0 | 1 | 1 | 0 | 0 | 0 | 1 | S6 | SL1 | (8+7/8)r+R |
| 50 | 0 | 1 | 1 | 0 | 0 | 1 | 0 | S6 | SL2 | (8+6/8)r+R |
| 51 | 0 | 1 | 1 | 0 | 0 | 1 | 1 | S6 | SL3 | (8+5/8)r+R |
| 52 | 0 | 1 | 1 | 0 | 1 | 0 | 0 | S6 | SL4 | (8+4/8)r+R |
| 53 | 0 | 1 | 1 | 0 | 1 | 0 | 1 | S6 | SL5 | (8+3/8)r+R |
| 54 | 0 | 1 | 1 | 0 | 1 | 1 | 0 | S6 | SL6 | (8+2/8)r+R |
| 55 | 0 | 1 | 1 | 0 | 1 | 1 | 1 | S6 | SL7 | (8+1/8)r+R |
| 56 | 0 | 1 | 1 | 1 | 0 | 0 | 0 | S7 |  | 8r+R |
| 57 | 0 | 1 | 1 | 1 | 0 | 0 | 1 | S7 | SL1 | (7+7/8)r+R |
| 58 | 0 | 1 | 1 | 1 | 0 | 1 | 0 | S7 | SL2 | (7+6/8)r+R |
| 59 | 0 | 1 | 1 | 1 | 0 | 1 | 1 | S7 | SL3 | (7+5/8)r+R |
| 60 | 0 | 1 | 1 | 1 | 1 | 0 | 0 | S7 | SL4 | (7+4/8)r+R |
| 61 | 0 | 1 | 1 | 1 | 1 | 0 | 1 | S7 | SL5 | (7+3/8)r+R |
| 62 | 0 | 1 | 1 | 1 | 1 | 1 | 0 | S7 | SL6 | (7+2/8)r+R |
| 63 | 0 | 1 | 1 | 1 | 1 | 1 | 1 | S7 | SL7 | (7+1/8)r+R |
| 64 | 1 | 0 | 0 | 0 | 0 | 0 | 0 | S8 |  | 7r+R |
| 65 | 1 | 0 | 0 | 0 | 0 | 0 | 1 | S8 | SL1 | (6+7/8)r+R |
| 66 | 1 | 0 | 0 | 0 | 0 | 1 | 0 | S8 | SL2 | (6+6/8)r+R |
| 67 | 1 | 0 | 0 | 0 | 0 | 1 | 1 | S8 | SL3 | (6+5/8)r+R |
| 68 | 1 | 0 | 0 | 0 | 1 | 0 | 0 | S8 | SL4 | (6+4/8)r+R |
| 69 | 1 | 0 | 0 | 0 | 1 | 0 | 1 | S8 | SL5 | (6+3/8)r+R |
| 70 | 1 | 0 | 0 | 0 | 1 | 1 | 0 | S8 | SL6 | (6+2/8)r+R |
| 71 | 1 | 0 | 0 | 0 | 1 | 1 | 1 | S8 | SL7 | (6+1/8)r+R |
| 72 | 1 | 0 | 0 | 1 | 0 | 0 | 0 | S9 |  | 6r+R |
| 73 | 1 | 0 | 0 | 1 | 0 | 0 | 1 | S9 | SL1 | (5+7/8)r+R |
| 74 | 1 | 0 | 0 | 1 | 0 | 1 | 0 | S9 | SL2 | (5+6/8)r+R |
| 75 | 1 | 0 | 0 | 1 | 0 | 1 | 1 | S9 | SL3 | (5+5/8)r+R |
| 76 | 1 | 0 | 0 | 1 | 1 | 0 | 0 | S9 | SL4 | (5+4/8)r+R |
| 77 | 1 | 0 | 0 | 1 | 1 | 0 | 1 | S9 | SL5 | (5+3/8)r+R |
| 78 | 1 | 0 | 0 | 1 | 1 | 1 | 0 | S9 | SL6 | (5+2/8)r+R |
| 79 | 1 | 0 | 0 | 1 | 1 | 1 | 1 | S9 | SL7 | (5+1/8)r+R |
| 80 | 1 | 0 | 1 | 0 | 0 | 0 | 0 | S10 |  | 5r+R |
| 81 | 1 | 0 | 1 | 0 | 0 | 0 | 1 | S10 | SL1 | (4+7/8)r+R |
| 82 | 1 | 0 | 1 | 0 | 0 | 1 | 0 | S10 | SL2 | (4+6/8)r+R |
| 83 | 1 | 0 | 1 | 0 | 0 | 1 | 1 | S10 | SL3 | (4+5/8)r+R |
| 84 | 1 | 0 | 1 | 0 | 1 | 0 | 0 | S10 | SL4 | (4+4/8)r+R |
| 85 | 1 | 0 | 1 | 0 | 1 | 0 | 1 | S10 | SL5 | (4+3/8)r+R |
| 86 | 1 | 0 | 1 | 0 | 1 | 1 | 0 | S10 | SL6 | (4+2/8)r+R |

FIG. 11B

| Counter | D | C | B | A | L2 | L1 | L0 | ON-SW | | Resistance value |
|---|---|---|---|---|---|---|---|---|---|---|
| 87 | 1 | 0 | 1 | 0 | 1 | 1 | 1 | S10 | SL7 | (4+1/8)r+R |
| 88 | 1 | 0 | 1 | 1 | 0 | 0 | 0 | S11 | | 4r+R |
| 89 | 1 | 0 | 1 | 1 | 0 | 0 | 1 | S11 | SL1 | (3+7/8)r+R |
| 90 | 1 | 0 | 1 | 1 | 0 | 1 | 0 | S11 | SL2 | (3+6/8)r+R |
| 91 | 1 | 0 | 1 | 1 | 0 | 1 | 1 | S11 | SL3 | (3+5/8)r+R |
| 92 | 1 | 0 | 1 | 1 | 1 | 0 | 0 | S11 | SL4 | (3+4/8)r+R |
| 93 | 1 | 0 | 1 | 1 | 1 | 0 | 1 | S11 | SL5 | (3+3/8)r+R |
| 94 | 1 | 0 | 1 | 1 | 1 | 1 | 0 | S11 | SL6 | (3+2/8)r+R |
| 95 | 1 | 0 | 1 | 1 | 1 | 1 | 1 | S11 | SL7 | (3+1/8)r+R |
| 96 | 1 | 1 | 0 | 0 | 0 | 0 | 0 | S12 | | 3r+R |
| 97 | 1 | 1 | 0 | 0 | 0 | 0 | 1 | S12 | SL1 | (2+7/8)r+R |
| 98 | 1 | 1 | 0 | 0 | 0 | 1 | 0 | S12 | SL2 | (2+6/8)r+R |
| 99 | 1 | 1 | 0 | 0 | 0 | 1 | 1 | S12 | SL3 | (2+5/8)r+R |
| 100 | 1 | 1 | 0 | 0 | 1 | 0 | 0 | S12 | SL4 | (2+4/8)r+R |
| 101 | 1 | 1 | 0 | 0 | 1 | 0 | 1 | S12 | SL5 | (2+3/8)r+R |
| 102 | 1 | 1 | 0 | 0 | 1 | 1 | 0 | S12 | SL6 | (2+2/8)r+R |
| 103 | 1 | 1 | 0 | 0 | 1 | 1 | 1 | S12 | SL7 | (2+1/8)r+R |
| 104 | 1 | 1 | 0 | 1 | 0 | 0 | 0 | S13 | | 2r+R |
| 105 | 1 | 1 | 0 | 1 | 0 | 0 | 1 | S13 | SL1 | (1+7/8)r+R |
| 106 | 1 | 1 | 0 | 1 | 0 | 1 | 0 | S13 | SL2 | (1+6/8)r+R |
| 107 | 1 | 1 | 0 | 1 | 0 | 1 | 1 | S13 | SL3 | (1+5/8)r+R |
| 108 | 1 | 1 | 0 | 1 | 1 | 0 | 0 | S13 | SL4 | (1+4/8)r+R |
| 109 | 1 | 1 | 0 | 1 | 1 | 0 | 1 | S13 | SL5 | (1+3/8)r+R |
| 110 | 1 | 1 | 0 | 1 | 1 | 1 | 0 | S13 | SL6 | (1+2/8)r+R |
| 111 | 1 | 1 | 0 | 1 | 1 | 1 | 1 | S13 | SL7 | (1+1/8)r+R |
| 112 | 1 | 1 | 1 | 0 | 0 | 0 | 0 | S14 | | r+R |
| 113 | 1 | 1 | 1 | 0 | 0 | 0 | 1 | S14 | SL1 | (7/8)r+R |
| 114 | 1 | 1 | 1 | 0 | 0 | 1 | 0 | S14 | SL2 | (6/8)r+R |
| 115 | 1 | 1 | 1 | 0 | 0 | 1 | 1 | S14 | SL3 | (5/8)r+R |
| 116 | 1 | 1 | 1 | 0 | 1 | 0 | 0 | S14 | SL4 | (4/8)r+R |
| 117 | 1 | 1 | 1 | 0 | 1 | 0 | 1 | S14 | SL5 | (3/8)r+R |
| 118 | 1 | 1 | 1 | 0 | 1 | 1 | 0 | S14 | SL6 | (2/8)r+R |
| 119 | 1 | 1 | 1 | 0 | 1 | 1 | 1 | S14 | SL7 | (1/8)r+R |
| 120 | 1 | 1 | 1 | 1 | 0 | 0 | 0 | S15 | | R |
| 121 | 1 | 1 | 1 | 1 | 0 | 0 | 1 | SM1 | | R01 |
| 122 | 1 | 1 | 1 | 1 | 0 | 1 | 0 | SM1 | SM2 | R01//R02 |
| 123 | 1 | 1 | 1 | 1 | 0 | 1 | 1 | SM1 | SM2 | R01//R02 |
| 124 | 1 | 1 | 1 | 1 | 1 | 0 | 0 | SM1 | SM2 | R01//R02 |
| 125 | 1 | 1 | 1 | 1 | 1 | 0 | 1 | SM1 | SM2 | R01//R02 |
| 126 | 1 | 1 | 1 | 1 | 1 | 1 | 0 | SM1 | SM2 | R01//R02 |
| 127 | 1 | 1 | 1 | 1 | 1 | 1 | 1 | SM1 | SM2 | R01//R02 |

F I G. 11C

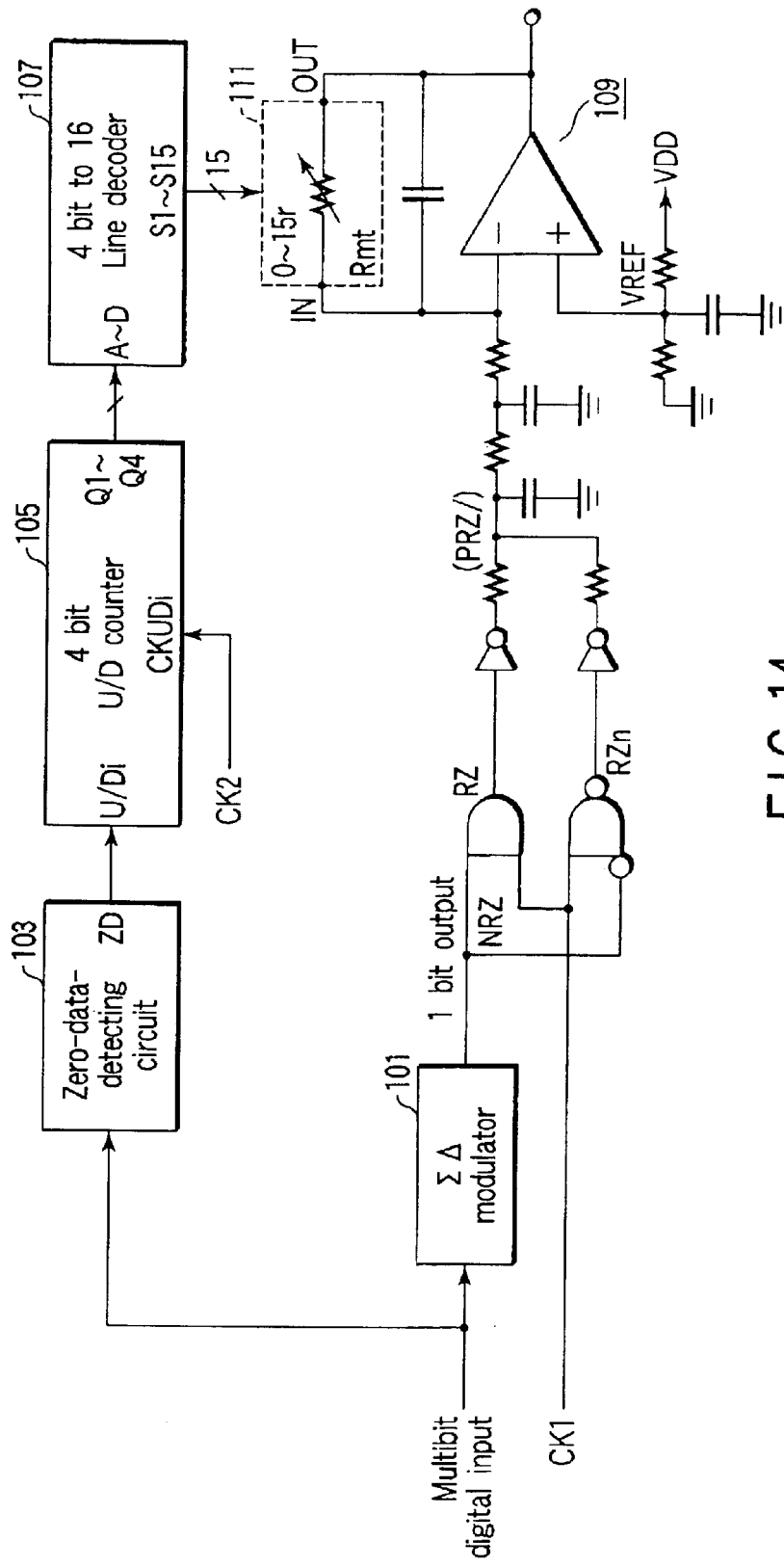
F I G. 14

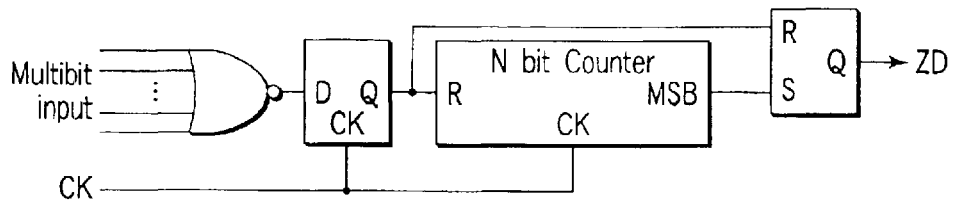
FIG. 16
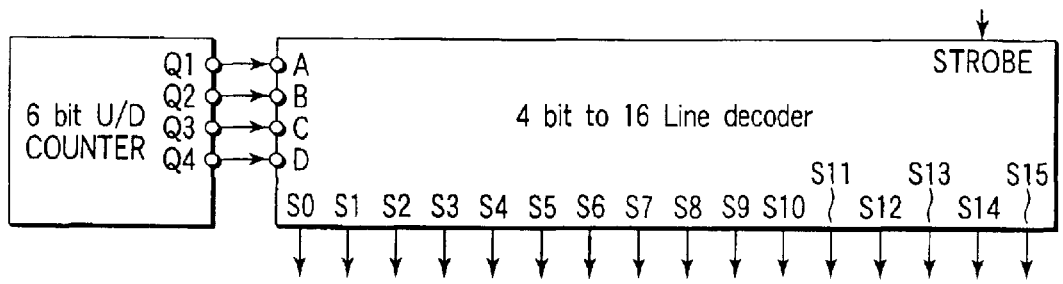
FIG. 17A
| INPUT | | | | SELECT LINE (H) | ATT |
|---|---|---|---|---|---|
| A | B | C | D | | |
| 0 | 0 | 0 | 0 | | 15/15 |
| 1 | 0 | 0 | 0 | S1 | 14/15 |
| 0 | 1 | 0 | 0 | S2 | 13/15 |
| 1 | 1 | 0 | 0 | S3 | 12/15 |
| 0 | 0 | 1 | 0 | S4 | 11/15 |
| 1 | 0 | 1 | 0 | S5 | 10/15 |
| 0 | 1 | 1 | 0 | S6 | 9/15 |
| 1 | 1 | 1 | 0 | S7 | 8/15 |
| 0 | 0 | 0 | 1 | S8 | 7/15 |
| 1 | 0 | 0 | 1 | S9 | 6/15 |
| 0 | 1 | 0 | 1 | S10 | 5/15 |
| 1 | 1 | 0 | 1 | S11 | 4/15 |
| 0 | 0 | 1 | 1 | S12 | 3/15 |
| 1 | 0 | 1 | 1 | S13 | 2/15 |
| 0 | 1 | 1 | 1 | S14 | 1/15 |
| 1 | 1 | 1 | 1 | S15 | 0/15 |
FIG. 18

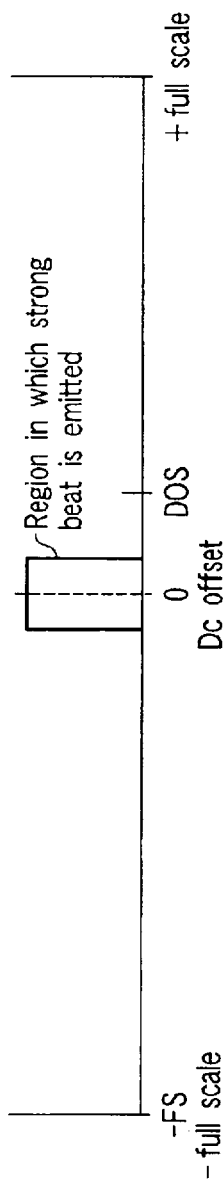
F I G. 22
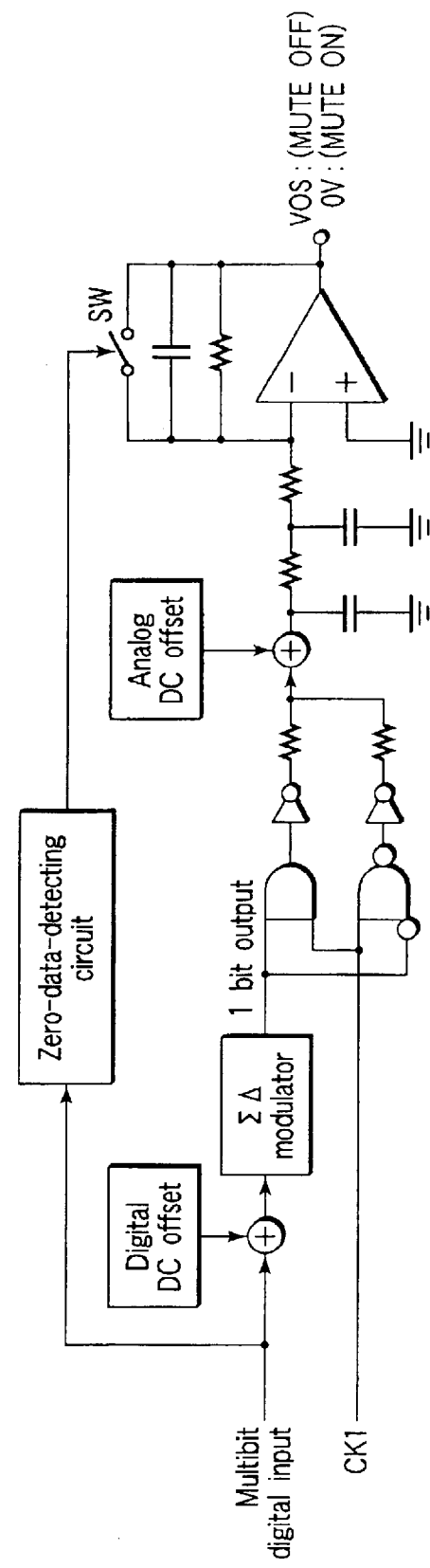
F I G. 23

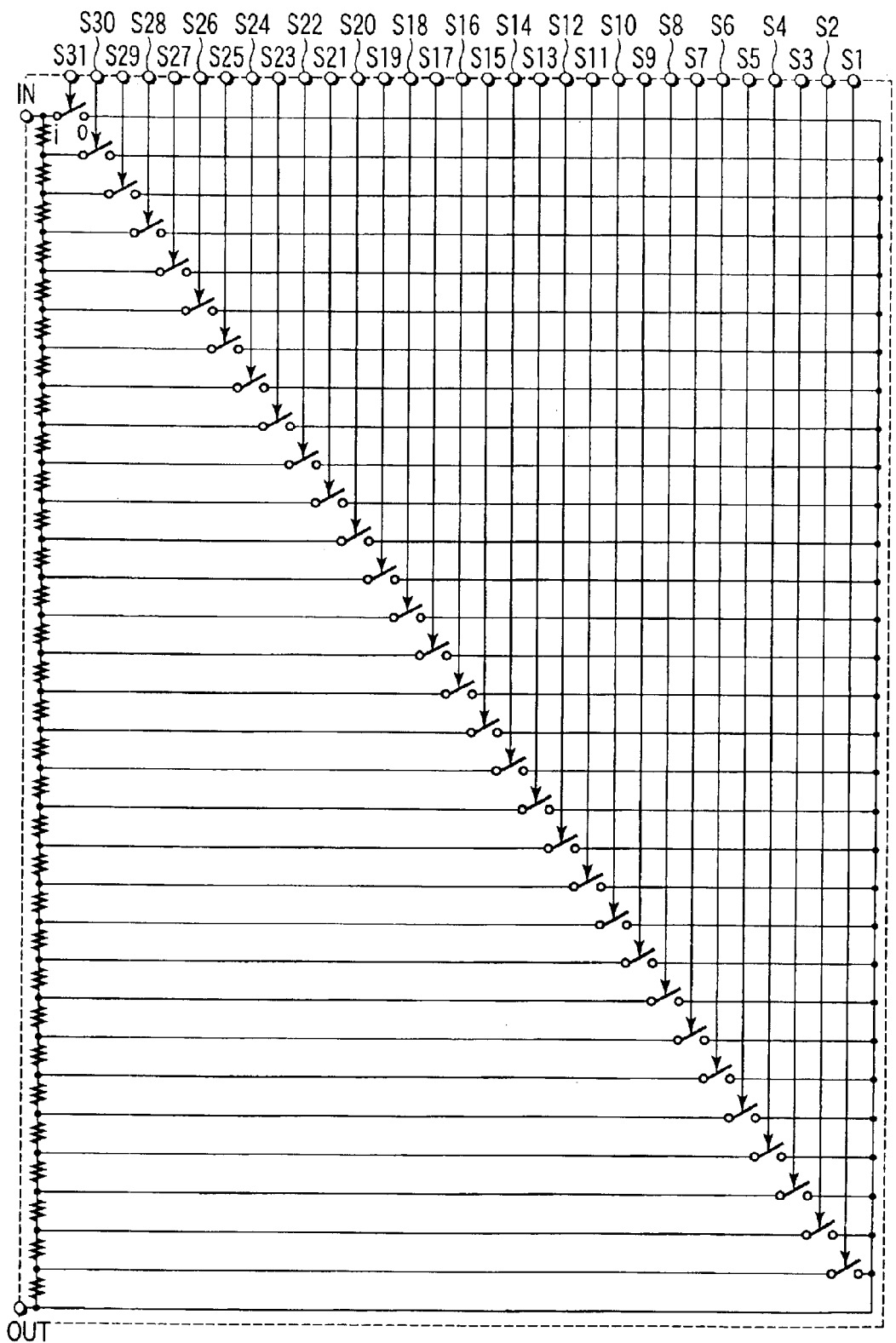
F I G. 28A

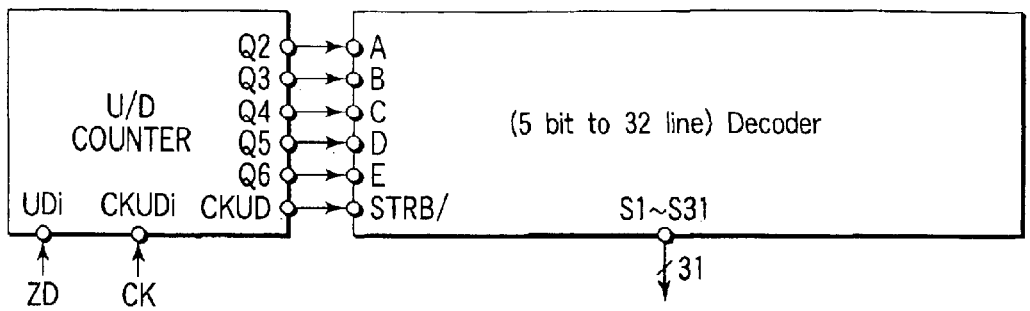
FIG. 29A
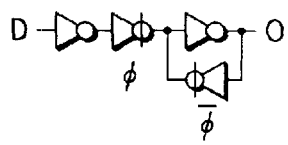
FIG. 29C
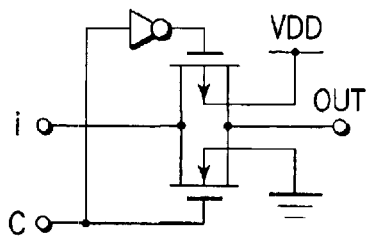
FIG. 28B
FIG. 29D
| INPUT | | | | | SELECT LINE (H) | STATE |
|---|---|---|---|---|---|---|
| A | B | C | D | E | | |
| 0 | 0 | 0 | 0 | 0 | | MUTE OFF |
| 1 | 0 | 0 | 0 | 0 | S1 | |
| 0 | 1 | 0 | 0 | 0 | S2 | |
| 1 | 1 | 0 | 0 | 0 | S3 | |
| 0 | 0 | 1 | 0 | 0 | S4 | |
| 1 | 0 | 1 | 0 | 0 | S5 | |
| 0 | 1 | 1 | 0 | 0 | S6 | |
| 1 | 1 | 1 | 0 | 0 | S7 | |
| 0 | 0 | 0 | 1 | 0 | S8 | |
| 1 | 0 | 0 | 1 | 0 | S9 | |
| 0 | 1 | 0 | 1 | 0 | S10 | |
| 1 | 1 | 0 | 1 | 0 | S11 | |
| 0 | 0 | 1 | 1 | 0 | S12 | |
| 1 | 0 | 1 | 1 | 0 | S13 | |
| 0 | 1 | 1 | 1 | 0 | S14 | |
| 1 | 1 | 1 | 1 | 0 | S15 | |
| 0 | 0 | 0 | 0 | 1 | S16 | |
| 1 | 0 | 0 | 0 | 1 | S17 | |
| 0 | 1 | 0 | 0 | 1 | S18 | |
| 1 | 1 | 0 | 0 | 1 | S19 | |
| 0 | 0 | 1 | 0 | 1 | S20 | |
| 1 | 0 | 1 | 0 | 1 | S21 | |
| 0 | 1 | 1 | 0 | 1 | S22 | |
| 1 | 1 | 1 | 0 | 1 | S23 | |
| 0 | 0 | 0 | 1 | 1 | S24 | |
| 1 | 0 | 0 | 1 | 1 | S25 | |
| 0 | 1 | 0 | 1 | 1 | S26 | |
| 1 | 1 | 0 | 1 | 1 | S27 | |
| 0 | 0 | 1 | 1 | 1 | S28 | |
| 1 | 0 | 1 | 1 | 1 | S29 | |
| 0 | 1 | 1 | 1 | 1 | S30 | |
| 1 | 1 | 1 | 1 | 1 | S31 | MUTE ON |

| INPUT | | | | | | SELECT LINE (H) | SL1 | SL2 | SL3 | ATT |
|---|---|---|---|---|---|---|---|---|---|---|
| L1 | L2 | A | B | C | D | | | | | |
| 0 | 0 | 0 | 0 | 0 | 0 | - | L | L | L | 60/60 |
| 1 | 0 | 0 | 0 | 0 | 0 | | H | L | L | 59/60 |
| 0 | 1 | 0 | 0 | 0 | 0 | | L | H | L | 58/60 |
| 1 | 1 | 0 | 0 | 0 | 0 | | L | L | H | 57/60 |
| 0 | 0 | 1 | 0 | 0 | 0 | S1 | L | L | L | 56/60 |
| 1 | 0 | 1 | 0 | 0 | 0 | | H | L | L | 55/60 |
| 0 | 1 | 1 | 0 | 0 | 0 | | L | H | L | 54/60 |
| 1 | 1 | 1 | 0 | 0 | 0 | | L | L | H | 53/60 |
| 0 | 0 | 0 | 1 | 0 | 0 | S2 | L | L | L | 52/60 |
| 1 | 0 | 0 | 1 | 0 | 0 | | H | L | L | 51/60 |
| 0 | 1 | 0 | 1 | 0 | 0 | | L | H | L | 50/60 |
| 1 | 1 | 0 | 1 | 0 | 0 | | L | L | H | 49/60 |
| 0 | 0 | 1 | 1 | 0 | 0 | S3 | L | L | L | 48/60 |
| 1 | 0 | 1 | 1 | 0 | 0 | | H | L | L | 47/60 |
| 0 | 1 | 1 | 1 | 0 | 0 | | L | H | L | 46/60 |
| 1 | 1 | 1 | 1 | 0 | 0 | | L | L | H | 45/60 |
| 0 | 0 | 0 | 0 | 1 | 0 | S4 | L | L | L | 44/60 |
| 1 | 0 | 0 | 0 | 1 | 0 | | H | L | L | 43/60 |
| 0 | 1 | 0 | 0 | 1 | 0 | | L | H | L | 42/60 |
| 1 | 1 | 0 | 0 | 1 | 0 | | L | L | H | 41/60 |
| 0 | 0 | 1 | 0 | 1 | 0 | S5 | L | L | L | 40/60 |
| 1 | 0 | 1 | 0 | 1 | 0 | | H | L | L | 39/60 |
| 0 | 1 | 1 | 0 | 1 | 0 | | L | H | L | 38/60 |
| 1 | 1 | 1 | 0 | 1 | 0 | | L | L | H | 37/60 |
| 0 | 0 | 0 | 1 | 1 | 0 | S6 | L | L | L | 36/60 |
| 1 | 0 | 0 | 1 | 1 | 0 | | H | L | L | 35/60 |
| 0 | 1 | 0 | 1 | 1 | 0 | | L | H | L | 34/60 |
| 1 | 1 | 0 | 1 | 1 | 0 | | L | L | H | 33/60 |
| 0 | 0 | 1 | 1 | 1 | 0 | S7 | L | L | L | 32/60 |
| 1 | 0 | 1 | 1 | 1 | 0 | | H | L | L | 31/60 |
| 0 | 1 | 1 | 1 | 1 | 0 | | L | H | L | 30/60 |
| 1 | 1 | 1 | 1 | 1 | 0 | | L | L | H | 29/60 |

F I G. 33A

| INPUT | | | | | | SELECT LINE (H) | SL1 | SL2 | SL3 | ATT |
|---|---|---|---|---|---|---|---|---|---|---|
| L1 | L2 | A | B | C | D | | | | | |
| 0 | 0 | 0 | 0 | 0 | 1 | S8 | L | L | L | 28/60 |
| 1 | 0 | 0 | 0 | 0 | 1 | | H | L | L | 27/60 |
| 0 | 1 | 0 | 0 | 0 | 1 | | L | H | L | 26/60 |
| 1 | 1 | 0 | 0 | 0 | 1 | | L | L | H | 25/60 |
| 0 | 0 | 1 | 0 | 0 | 1 | S9 | L | L | L | 24/60 |
| 1 | 0 | 1 | 0 | 0 | 1 | | H | L | L | 23/60 |
| 0 | 1 | 1 | 0 | 0 | 1 | | L | H | L | 22/60 |
| 1 | 1 | 1 | 0 | 0 | 1 | | L | L | H | 21/60 |
| 0 | 0 | 0 | 1 | 0 | 1 | S10 | L | L | L | 20/60 |
| 1 | 0 | 0 | 1 | 0 | 1 | | H | L | L | 19/60 |
| 0 | 1 | 0 | 1 | 0 | 1 | | L | H | L | 18/60 |
| 1 | 1 | 0 | 1 | 0 | 1 | | L | L | H | 17/60 |
| 0 | 0 | 1 | 1 | 0 | 1 | S11 | L | L | L | 16/60 |
| 1 | 0 | 1 | 1 | 0 | 1 | | H | L | L | 15/60 |
| 0 | 1 | 1 | 1 | 0 | 1 | | L | H | L | 14/60 |
| 1 | 1 | 1 | 1 | 0 | 1 | | L | L | H | 13/60 |
| 0 | 0 | 0 | 0 | 1 | 1 | S12 | L | L | L | 12/60 |
| 1 | 0 | 0 | 0 | 1 | 1 | | H | L | L | 11/60 |
| 0 | 1 | 0 | 0 | 1 | 1 | | L | H | L | 10/60 |
| 1 | 1 | 0 | 0 | 1 | 1 | | L | L | H | 9/60 |
| 0 | 0 | 1 | 0 | 1 | 1 | S13 | L | L | L | 8/60 |
| 1 | 0 | 1 | 0 | 1 | 1 | | H | L | L | 7/60 |
| 0 | 1 | 1 | 0 | 1 | 1 | | L | H | L | 6/60 |
| 1 | 1 | 1 | 0 | 1 | 1 | | L | L | H | 5/60 |
| 0 | 0 | 0 | 1 | 1 | 1 | S14 | L | L | L | 4/60 |
| 1 | 0 | 0 | 1 | 1 | 1 | | H | L | L | 3/60 |
| 0 | 1 | 0 | 1 | 1 | 1 | | L | H | L | 2/60 |
| 1 | 1 | 0 | 1 | 1 | 1 | | L | L | H | 1/60 |
| 0 | 0 | 1 | 1 | 1 | 1 | S15 | L | L | L | 0/60 |
| 1 | 0 | 1 | 1 | 1 | 1 | | H | L | L | |
| 0 | 1 | 1 | 1 | 1 | 1 | | L | H | L | |
| 1 | 1 | 1 | 1 | 1 | 1 | | L | L | H | |

FIG. 33B

STEPWISE ZERO-DATA-DETECTION MUTE CIRCUIT

CROSS-REFERENCE TO RELATED APPLICATIONS

This application is based upon and claims the benefit of priority from the prior Japanese Patent Application No. 2002-206869, filed on Jul. 16, 2002, the entire contents of which are incorporated herein by reference.

BACKGROUND OF THE INVENTION

1. Field of the Invention

The present invention relates to a mute (which is denoted as MUTE in the drawings) circuit for cutting off in an analog scheme an input signal, particularly relates to a zero-data-detection mute circuit of an output circuit of a one-bit D/A converter (hereafter referred to as D/A converter) using a $\Sigma\Delta$ modulator.

2. Description of the Related Art

FIGS. 20A and 20B show a circuit of an output section of a one-bit D/A converter using a $\Sigma\Delta$ modulator and a timing chart, respectively.

The output circuit section includes a $\Sigma\Delta$ modulator for receiving a multibit digital input, a digital to analog converter (D/A converter) for receiving a one-bit output of the $\Sigma\Delta$ modulator, and an inverting type operational amplifier (op-amp). An inverting input terminal (−) of the op-amp receives an analog output PRZ/ of the D/A converter via an input resistor, and a non-inverting input terminal (+) of the op-amp receives a reference voltage.

In the D/A converter, a function for detecting that input digital signals in a certain period are zero data and fixing the output voltage to a certain DC value (normally, midpoint potential) is frequently requested.

This is because, in the case of a D/A converter, another large-scale digital circuit is frequently provided on the same chip or same board in general and a large amount of unnecessary radiation is emitted to the D/A converter from the digital circuit as noises spatially or through a power source, thus deteriorating the performance of the D/A converter.

Moreover, in the one-bit D/A converter using the $\Sigma\Delta$ modulator, a converted output does not frequently become DC even if zero data is input and outputs waveforms containing a very-high-frequency noises referred to as requantization noises. Thus, uncomfortable sound is outputted or an undesirable S/N value may be obtained. To prevent these unwanted matters, zero-data-detecting mute technique is also used in the one-bit D/A converter using the $\Sigma\Delta$ modulator frequently.

In the ordinary zero-data-detecting mute system, that zero data are successively inputted for a certain period (normally, approximately. 100 msec) is detected and the analog output of the D/A converter is fixed to a reference potential.

Since the reference potential is normally decoupled by a capacitor having a large capacitance, noises that enter into the D/A converter is not so much. Hence, it is possible to prevent uncomfortable sound from being outputted and the S/N value from being deteriorated.

In the circuit in FIG. 23, since the filter amplifier of the D/A converter output section is an inverting type amplifier, then the mute is on (denoted as ON in FIG. 23) or off (denoted as OFF in FIG. 23) by turning on/off a feedback signal with an analog switch (hereafter referred to as switch) SW.

The circuit in FIG. 23 includes an adder for adding a multibit digital input and a digital DC offset, a $\Sigma\Delta$ modulator for receiving an output of the adder, a D/A converter for receiving a one-bit output of the $\Sigma\Delta$ modulator, an adder for adding an output of the D/A converter and an analog DC offset, a 0-data detecting circuit for receiving the multibit digital input, a switch SW controlled by an output of the zero-data (0-data) detecting circuit, and an inverting type operational amplifier (op-amp). The switch SW and a feedback resistor are connected in parallel to each other between an inverting input terminal (−) of the op-amp and output terminal of the op-amp. The inverting input terminal (−) of the op-amp receives an output signal of the adder for adding an output of the D/A converter and the analog DC offset via an input resistor, and a non-inverting input terminal (+) of the op-amp receives a reference voltage.

In this case, there is a large problem to operate a zero-data detecting mute, that is, a problem that a pop noise is generated when the mute is turned on/off. This is a pop noise generated due to that the DC value when a mute is turned on differs from the DC value when a mute is turned off. There are various causes of the problem as described blow.

To prevent a fixed pattern peculiar to a $\Sigma\Delta$ modulator and harmful beat noise from being generated, it is frequent to previously add digital DC offsets to an input signal of the $\Sigma\Delta$ modulator (see FIG. 22). Due to the addition of the digital DC offsets, analog DC offsets corresponding to input digital DC offsets are outputted and a pop noise is generated when a mute is turned on/off.

To prevent the above problem, a method is used in which analog DC offsets for canceling digital DC offsets are added as shown in FIG. 23. However, the digital DC offsets cannot be completely cancelled because of device accuracy or device variation and thus, some DC offsets are left.

Another problem is a DC error of a D/A converter generated in a DC offset due to slowdown of a waveform or device variation of a D/A converter.

A further problem is that when the mute is carried out by short-circuiting a feedback resistance with an input-converted DC offset of an operational amplifier as shown in FIG. 24, a DC change of EOS occurs and a pop noise is generated when the mute is turned on/off in the case of an operational amplifier having a input-converted DC offset serving as the EOS.

Though the above causes can be reduced by improving a circuit configuration or device accuracy or suppressing device variation, it is impossible to completely eliminate these disadvantages. That is, a small DC change is inevitably produced by turning on/off a mute and a pop noise is produced.

Thus, to minimize the pop sound, it is proposed to change the feedback resistor to a resistance variable resistor, and stepwise decrease or increase the resistance of the resistance variable feedback resistor.

When it is assumed that a potential difference of EM is generated if mutes are turned on/off, a stepwise waveform is obtained and an audible pop noise is produced by simultaneously turning on/off the mutes with the switch SW as shown in FIG. 25.

As shown in FIG. 26, by stepwise changing voltages, pop noises can be inaudibly heard. In this case, the pop noises are decreased in intensity in 15 steps. By further increasing the number of steps to smoothly change the voltages, the pop noises are further decreased in intensity (see FIG. 27).

FIG. 13 shows a circuit of a D/A converter using a zero-data-detecting mute function in which the pop sounds are decreased in intensity. In this case, the output level m of a ΣΔ modulator generally ranges between 2 and 15.

The circuit in FIG. 13 includes a ΣΔ modulator for receiving a multibit digital input, an m-level D/A converter for receiving an m-level digital output of the ΣΔ modulator, a 0-data detecting circuit for receiving the multibit digital input, an n-bit up-down counter for receiving an output of the 0-data detecting circuit, an n-bit to $2^n$ line decoder for receiving an n-bit output of the n-bit up-down counter, a feedback resistor for receiving $2^n-1$ outputs of the n-bit to $2^n$ line decoder, while an inverting type operational amplifier (op-amp). The feedback resistor is connected between an inverting input terminal (−) of the op-amp and output terminal of the op-amp. The inverting input terminal (−) of the op-amp receives an analog output of the m-level D/A converter via an input resistor, and a non-inverting input terminal (+) of the op-amp receives a reference voltage.

The circuit in FIG. 14 is a circuit obtained by making the circuit in FIG. 13 more specific, in which m is equal to 2 and n is equal to 4.

The circuit in FIG. 14 includes a ΣΔ modulator 101 for receiving a multibit digital input, a 2-level D/A converter for receiving a one-bit output of the ΣΔ modulator 101, a 0-data detecting circuit 103 for receiving the multibit digital input, a 4-bit up-down counter 105 for receiving an output of the 0-data detecting circuit 103, an 4-bit to 16 line decoder 107 for receiving a bit output of the 4-bit up-down counter 105, a feedback resistor circuit 111 for receiving outputs of the 4-bit to 16 line decoder, and an inverting type operational amplifier (op-amp) 109. The feedback resistor 111 is connected between an inverting input terminal (−) of the op-amp and output terminal of the op-amp. The inverting input terminal (−) of the op-amp receives an analog output PRZ/ of the 2-level D/A converter via an input resistor, and a non-inverting input terminal (+) of the op-amp receives a reference voltage.

FIG. 15B shows an example of a concrete configuration of the feedback resistor circuit 111 in FIG. 14.

The feedback resistor circuit in FIG. 15B is formed of a variable resistance circuit. In the variable resistance circuit, n resistors each having a resistance value of r are connected in series to form a first series-resistor circuit (n being an integer of 2 or more and 15 in this example). Analog switches SW1 to SW14 are connected between one terminal of the series-resistor circuit and respective nodes of the resistors of the series-resistor circuit. The analog switches SW1 to SW14 are on/off controlled by control signals S1 to S14 to stepwise change a resistance value of the first variable resistance circuit from 0 to n·r in units of r. The one terminal of the series-resistor circuit is connected to an input terminal IN of the variable resistance circuit, and the other terminal of the series-resistor circuit is connected to an output terminal OUT of the variable resistance circuit.

A further analog switch SW15 is connected between the one terminal of the series-resistor circuit (i.e., input terminal IN of the variable resistance circuit) and the other terminal of the series-resistor circuit (i.e., output terminal OUT of the variable resistance circuit) and controlled by control signal S15 to make a short-circuit between the terminals.

With the analog switches SW1 to SW15 being controlled by control signals S1 to S15, the resistance value of the feedback resistor circuit changes stepwise from 0 to 15r in units of r. Moreover, as shown in FIG. 26, a DC change when a mute is turned on/off smoothly changes to weaken a pop noise.

FIG. 15A shows the feedback resistor circuit 111 alone of the D/A converter in FIG. 14. FIG. 15C shows an example of a concrete circuit diagram of one analog switch in the feedback resistor circuit 111 in FIG. 15B, in which the analog switch is formed of n channel transistors and p channel transistors.

FIG. 16 shows an example of the zero-data detection circuit 103 in the circuit of FIG. 14.

The zero-data detection circuit 103 includes a NOR gate circuit for receiving a multibit digital input, a D-type flip flop circuit for receiving an output of the NOR gate circuit, an N-bit counter for receiving an output of the D-type flip flop circuit, and an RS-type flip flop circuit for receiving an output of the N-bit counter at its set terminal and the output of the D-type flip flop circuit at its reset terminal.

FIG. 17B shows an example of the decoder 107 in the circuit of FIG. 14.

The decoder 107 receives output signals Q1 to Q4 of the 4-bit U/D counter and outputs control signals S1 to S15 to the feedback resistor circuit. The decoder 107 includes a plurality of logic circuit sections which receive output signals Q1 to Q4 of the 4-bit U/D counter to perform logic operations and a plurality of flip flop circuits which are controlled by output signals of the logic circuit sections.

FIG. 17A shows a block diagram of the decoder and the counter of the circuit in FIG. 14. FIG. 17C shows an example of a concrete circuit diagram of one flip flop circuit in the decoder 107 in FIG. 17B.

FIG. 18 is a truth table of the decoder 107 in FIG. 17B.

FIG. 19A is a block diagram of the up-down counter 105 of the D/A converter in FIG. 14. FIG. 19B shows an example of a concrete configuration of the up-down counter 105 of the D/A converter in FIG. 14.

The up-down counter 105 includes flip flop circuit sections and logic circuit sections. The up-down counter 105 receives clock signal CKUDi and up-down control signal U/Di, and outputs count signals Q1 to Q4 and clock signal CKUD.

FIGS. 21A and 21B show a timing chart of a zero-data-detection mute circuit (including the zero-data detecting circuit 103, counter 105, decoder 107 and variable resistance circuit 111 in FIG. 14).

When the counter 105 is at 0, the variable resistance shows 15r which is the normal state. When an D/A converter input is zero data for a certain time period, a zero-data-detecting circuit output ZD becomes H (a high level) and a U/Di input of the counter 105 becomes H. When the U/Di input becomes H, the counter 105 starts up-counting and the control signals S1, S2, S3, . . . supplied from the decoder 107 sequentially become H as the state of the counter 105 increases to 1, 2, 3, . . . .

Moreover, switches SW1, SW2, SW3, . . . corresponding to the controls signals S1, S2, S3, . . . are turned on and the variable resistance decreases to 14r, 13r, 12r, . . . . Finally, the control signal S15 becomes H and the variable resistance is short-circuited (the state of the counter 105 becomes 15), and a mute is turned on.

However, when the D/A converter input is not zero data, the ZD instantaneously becomes L and the U/Di input of the counter 105 becomes L. When the U/Di input becomes L, the counter 105 starts down-counting. As the state of the counter 105 increases to 14, 13, 12, . . . , control signals S14, S13, S12, . . . supplied from the decoder 107 sequentially become H.

Switches SW14, SW13, SW12, . . . corresponding to the signals S14, S13, S12, . . . are turned on and the variable resistance increases to r, 2r, 3r . . . . Finally, the state of the counter 105 becomes zero, every analog switch is turned off, the variable resistance becomes 15r which is the normal value, and the mute is turned off.

To minimize a pop noise as much as possible, as is clear by comparing FIG. 26 to FIG. 27, it is necessary to further increase the number of bits of the counter 105 and further smooth the waveform when the mute is turned on/off.

It is attempted here to consider doubling the number of change steps of the feedback resistance in the circuit in FIG. 15B. A circuit of the feedback resistance in such a case becomes a circuit shown in FIG. 28A in which 31 control signals S1 to S31 are used and thus it is found that the circuit scale is doubled. FIG. 28A shows a circuit configuration of a feedback resistor circuit in which the number of change steps is doubled to that of the feedback resistance in FIG. 15B and the circuit scale of the feedback resistor circuit is doubled to that of the feedback resistance in FIG. 15B, and FIG. 28B is a circuit configuration of one of the switches in the circuit in FIG. 28A.

Moreover, the decoder becomes that shown in FIG. 29B in which 31 control signals S1 to S31 are outputted and thus it is found that the circuit scale is doubled.

The decoder shown in FIG. 29B receives output signals Q1 to Q6 of the U/D counter and outputs control signals S1 to S31 to the feedback resistor circuit. The decoder includes a plurality of logic circuit sections which receive output signals Q1 to Q6 of the U/D counter to perform logic operations and a plurality of flip flop circuits which are controlled by output signals of the logic circuit sections. FIG. 29A shows a block diagram of a decoder in which the number of DC change steps is doubled to that of the conventional circuit in FIG. 17B, FIG. 29B is a concrete circuit configuration of the decoder in FIG. 29A, in which the circuit scale is doubled to that of the decoder in FIG. 17B, and FIG. 29C is a circuit configuration of a flip flop circuit in the decoder shown in FIG. 29B.

The counter does not become so large. However, when the circuit scale of the feedback resistance and the decoder is doubled, the whole circuit scale becomes significantly large. Moreover, by making the number of steps fourfold, the circuit scale of the feedback resistance and the decoder becomes fourfold and the load is greatly increased.

Moreover, when forming the circuit into an IC pattern, 31 resistances are connected in series in the case of n=5 as shown in FIG. 28A, and 32 contact portions (contact resistances) for connecting resistances with wiring are connected in series. Although a contact resistance value is made considerably small compared to that of a resistance body, it cannot be ignored when the number of contact portions for connecting resistances with wiring increases.

The voltage dependency or process variation of the contact resistance is not greatly considered in many cases differently from the case of the resistance body. As a result, the characteristic is deteriorated due to the voltage dependency of the contact resistance. Moreover, the gain of the D/A converter greatly varies due to the process variation of the contact resistance value.

To solve the above problems, a following method is disclosed in Jpn. Pat. Appln. KOKAI Publication No. 2001-77694.

FIG. 30B shows a configuration of the feedback resistor disclosed in Jpn. Pat. Appln. KOKAI Publication No. 2001-77694. The general circuit of the output section of the D/A converter is the same as that in FIG. 14. The circuit in FIG. 30B is different from that in FIG. 15B in that a resistor r connected to the terminal IN is added. Moreover, when switches SWL1, SWL2, and SWL3 controlled in accordance with control signals SL1, SL2, and SL3 are turned on/off, resistors 3r, r, and r/3 each are connected in parallel to the added resistor r in the variable feedback resistance circuit. Furthermore, the resistor r connected between the switch SW14 controlled in accordance with the control signal S14 and the switch SW15 controlled in accordance with the control signal S15 is eliminated.

With the modification above, the resolution is expanded by 2 bits. That is, by increasing or decreasing the variable resistance of the feedback resistor circuit in units of r/4, instead of increasing or decreasing the variable resistance of the feedback resistor circuit in units of r, it is possible to further smooth the voltage change and decrease the pop noise.

The control signals SL1 to SL3 are signals constituted by the LSB (Least Significant Bit) and its one digit upper bit of an output of a counter. The switches SWL1 to SWL3 are controlled by control signals SL1 to SL3 so that the resistance value between the IN terminal and the common node of the switches SW1 to SW14 controlled in accordance with control signals S1 to S14 becomes r when the LSB and its one digit upper bit of the counter are (0, 0), 3r/4 when these bits are (1, 0), r/2 when these bits are (0, 1), and r/4 when these bits are (1, 1).

In this way, when the state of the counter changes to 0, 1, 2, . . . , 58, 59, 60, 61, 62, and 63, the feedback resistance value changes to 15r, 14.75r, 14.5r, . . . , 0.5r, 0.25r, 0, 0, 0, and 0. Thus, it is found that the number of change steps in the feedback resistance circuit of FIG. 30B becomes approximately fourfold as shown in FIGS. 33A and 33B compared to the number of change steps in the feedback resistance circuit of FIG. 15B. As to the circuit scale of the feedback resistance circuit, only the number of resistors r is increased by 3, the number of switches is increased by 3, and the number of control terminals is increased by 3.

FIG. 31B is a circuit of the decoder used with the feedback resistance circuit of FIG. 30B. FIG. 32B is a counter circuit used with the feedback resistance circuit of FIG. 30B. FIGS. 33A and 33B show a truth table of the decoder of FIG. 31B.

FIG. 34B is a modified circuit of FIG. 30B in which the switches each are formed of only an N-channel MOS transistor. As is known, since the on-resistance of MOS transistors is nonlinear, a distortion is normally generated in an output signal when MOS transistors are used.

However, in the case of this circuit, MOS transistors are used to provide the switches of a simple structure, rendering it possible to reduce the circuit scale, while considering that the switches are turned on only when the D/A converter input is zero data and the on-time is very short and transient.

Only the switch SW15 controlled in accordance with the control signal S15 for decreasing the feedback resistance to 0 (zero) is made of a combination of the P-channel MOS transistor and N-channel MOS transistor, as shown in FIG. 15C. This is because only the switch SW15 is not transiently turned on but it is continuously turned on while a mute operates. Therefore, it is prevented that a DC change does not occur even if a comparatively large noise is generated. It is naturally possible to use a P-channel transistor instead of an N-channel MOS transistor. In this case, it is necessary to invert a control signal.

In this way, by using the method disclosed in Jpn. Pat. Appln. KOKAI Publication No. 2001-77694, it is possible to make the number of change steps of the feedback resistance fourfold, further smooth a DC-voltage change from mute-off to mute-on, and avoid an uncomfortable pop noise.

However, when a smoother DC change is further requested for HiFi use, it is requested that the number of change steps of a feedback resistance should be doubled. A circuit according to the requirement is as shown in FIG. 35B, when using the method disclosed in Jpn. Pat. Appln. KOKAI Publication No. 2001-77694.

In the circuit in FIG. 30B, resistance r/4,r/2, and 3r/4 are obtained by providing resistors having resistance values r/3,r, and 3r in parallel with a resistor having a resistance value r. However, the circuit in FIG. 35B generates resistances r/8,r/4, 3r/8,r/2, 5r/8, 3r/4, and 7r/8 by providing resistors having resistance values r/7, r/3, 3r/5, r, 5r/3, 3r, and 7r in parallel with a resistor having a resistance value r.

Therefore, it is necessary to form a high-accuracy resistance resistor having resistance 7r, which is 49 times resistance r/7. Moreover, the total resistance value of this resistor section (resistors having resistances r/7, r/3, 3r/5, r, 5r/3, 3r, and 7r) becomes 13.7r. When this resistor structure is formed on an IC, the chip occupation area is considerably increased and the chip cost is increased. Moreover, since the area of a feedback resistance portion is increased, then noises incoming due to that the wirings function as antennas are increased and noises incoming from the contact area with the substrate are increased. Hence, the characteristic of the variable feedback resistance circuit is deteriorated.

BRIEF SUMMARY OF THE INVENTION

According to an aspect of the present invention, there is provided a variable resistance device comprising a first variable resistance circuit including n resistors connected in series forming a first series-resistor circuit and analog switches connected between one terminal of the series-resistor circuit and respective nodes of the resistors of the series-resistor circuit, n being an integer of 2 or more, the analog switches being on/off controlled by an output signal of a counter to stepwise change a resistance value of the first variable resistance circuit; a second variable resistance circuit one terminal of which is connected to the one terminal of the first series-resistor circuit of the first variable resistance circuit, the second variable resistance circuit including a second series-resistor circuit of a first resistor and a second resistor which have a predetermined resistance ratio therebetween, one terminal of the first resistor being connected to one terminal of the second resistor, the other terminal of the first resistor being connected to the one terminal of the series-resistor circuit of the first variable resistance circuit, a third series-resistor circuit of a plurality of resistors, one terminal of third series-resistor circuit being connected to the other terminal of the second resistor, a plurality of analog switches connected between the other terminal of the first resistor and nodes of the respective resistors of the third series-resistor circuit, an analog switch connected between the other terminal of the third series-resistor circuit and a node of the first resistor and the second resistor and controlled by an output signal of a counter, an analog switch connected between a node of resistors of the third series-resistor circuit and the node of the first resistor and the second resistor and controlled by an output signal of a counter, and a short-circuiting analog switch connected between the other terminal of series-resistor circuit of the first variable resistance circuit and the other terminal of the second resistor of the second variable resistance circuit and controlled by an output signal of a counter to make a short-circuit therebetween.

According to another aspect of the present invention, there is provided a zero-data-detection mute circuit of an output section of a one-bit D/A converter in which a multibit digital signal is converted into a one-bit signal via a modulator, the one-bit signal is outputted in a form of analog signal via an inverting type amplifier of an analog low-pass filter, a counter is operated when detecting that the multibit digital signals are all zero for a predetermined time period to decrease stepwise a resistance of a feedback resistor circuit of the inverting type amplifier of the analog low-pass filter and finally make a short-circuit both terminals of the feedback resistor circuit according to an output of the counter to fix an output of the inverting type amplifier to a reference potential, the feedback resistor circuit comprising a first variable resistance circuit including n resistors connected in series forming a first series-resistor circuit and analog switches connected between one terminal of the series-resistor circuit and respective nodes of the resistors of the series-resistor circuit, n being an integer of 2 or more, the analog switches being on/off controlled by an output signal of a counter to stepwise change a resistance value of the first variable resistance circuit; a second variable resistance circuit one terminal of which is connected to the one terminal of the series-resistor circuit of the first variable resistance circuit, the second variable resistance circuit including a second series-resistor circuit of a first resistor and a second resistor which have a predetermined resistance ratio therebetween, one terminal of the first resistor being connected to one terminal of the second resistor, the other terminal of the first resistor being connected to the one terminal of the series-resistor circuit of the first variable resistance circuit, a third series-resistor circuit of a plurality of resistors, one terminal of third series-resistor circuit being connected to the other terminal of the second resistor, a plurality of analog switches connected between the other terminal of the first resistor and nodes of the respective resistors of the third series-resistor circuit, an analog switch connected between the other terminal of the third series-resistor circuit and a node of the first resistor and the second resistor and controlled by an output signal of a counter, an analog switch connected between a node of resistors of the third series-resistor circuit and the node of the first resistor and the second resistor and controlled by an output signal of a counter, and a short-circuiting analog switch connected between the other terminal of series-resistor circuit of the first variable resistance circuit and the other terminal of the second resistor of the second variable resistance circuit and controlled by an output signal of a counter to make a short-circuit therebetween.

According to a further aspect of the present invention, there is provided a variable resistance device comprising a first variable resistance circuit including n resistors connected in series forming a series-resistor circuit and analog switches connected between one terminal of the series-resistor circuit and respective nodes of the resistors of the series-resistor circuit, n being an integer of 2 or more, the n resistors each having a resistance value of r, the analog switches being on/off controlled by an output signal of a counter to stepwise change a resistance value of the first variable resistance circuit from 0 to n·r; and a second variable resistance circuit, the second variable resistance circuit including a first resistor having a resistance value of 0.53r, a second resistor having a resistance value of 0.47r one terminal of which is connected to one terminal of the first resistor and the other terminal of which is connected to one terminal of the series-resistor circuit of the first variable resistance circuit, a third resistor having a resistance value of r/7 one terminal of which is connected to the other terminal of the first resistor, a first analog switch one terminal of which is connected to the other terminal of the third resistor, and the other terminal of which is connected to the other terminal of the second resistor, a fourth resistor having a resistance value of 4r/21 one terminal of which is connected to the other terminal of the third resistor, a second analog switch one terminal of which is connected to the other terminal of the fourth resistor, and the other terminal of which is connected to the other terminal of the second resistor, a fifth resistor having a resistance value of 4r/15 one terminal of which is connected to the other terminal of the fourth resistor, a third analog switch one terminal of which is connected to the other terminal of the fifth resistor, and the other terminal of which is connected to the other terminal of the second resistor, a sixth resistor having a resistance value of 2r/5 one terminal of which is connected to the other terminal of the fifth resistor, a fourth analog switch one terminal of which is connected to the other terminal of the sixth resistor, and the other terminal of which is connected to the other terminal of the second resistor, a seventh resistor having a resistance value of 2r/3 one terminal of which is connected to the other terminal of the sixth resistor, a fifth analog switch one terminal of which is connected to the other terminal of the seventh resistor, and the other terminal of which is connected to the other terminal of the second resistor, a sixth analog switch one terminal of which is connected to the other terminal of the fifth resistor, and the other terminal of which is connected to the one terminal of the first resistor, a seventh analog switch one terminal of which is connected to the other terminal of the seventh resistor, and the other terminal of which is connected to the one terminal of the first resistor, and an eighth analog switch connected between the other terminal of the series-resistor circuit of the first variable resistance circuit and the other terminal of the first resistor of the second variable resistance circuit to make a short-circuit therebetween.

According to a further aspect of the present invention, there is provided a zero-data-detection mute circuit of an output section of a one-bit D/A converter in which a multibit digital signal is converted into a one-bit signal via a modulator, the one-bit signal is outputted in a form of analog signal via an inverting type amplifier of an analog low-pass filter, a counter is operated when detecting that the multibit digital signals are all zero for a predetermined time period to decrease stepwise a resistance of a feedback resistor circuit of the inverting type amplifier of the analog low-pass filter and finally make a short-circuit both terminals of the feedback resistor circuit according to an output of the counter to fix an output of the inverting type amplifier to a reference potential, the feedback resistor circuit comprising a first variable resistance circuit including n resistors connected in series forming a series-resistor circuit and analog switches connected between one terminal of the series-resistor circuit and respective nodes of the resistors of the series-resistor circuit, n being an integer of 2 or more, the n resistors each having a resistance value of r, the analog switches being on/off controlled by an output signal of a counter to stepwise change a resistance value of the first variable resistance circuit from 0 to n·r; and a second variable resistance circuit, the second variable resistance circuit including a first resistor having a resistance value of 0.53r, a second resistor having a resistance value of 0.47r one terminal of which is connected to one terminal of the first resistor and the other terminal of which is connected to one terminal of the series-resistor circuit of the first variable resistance circuit, a third resistor having a resistance value of r/7 one terminal of which is connected to the other terminal of the first resistor, a first analog switch one terminal of which is connected to the other terminal of the third resistor, and the other terminal of which is connected to the other terminal of the second resistor, a fourth resistor having a resistance value of 4r/21 one terminal of which is connected to the other terminal of the third resistor, a second analog switch one terminal of which is connected to the other terminal of the fourth resistor, and the other terminal of which is connected to the other terminal of the second resistor, a fifth resistor having a resistance value of 4r/15 one terminal of which is connected to the other terminal of the fourth resistor, a third analog switch one terminal of which is connected to the other terminal of the fifth resistor, and the other terminal of which is connected to the other terminal of the second resistor, a sixth resistor having a resistance value of 2r/5 one terminal of which is connected to the other terminal of the fifth resistor, a fourth analog switch one terminal of which is connected to the other terminal of the sixth resistor, and the other terminal of which is connected to the other terminal of the second resistor, a seventh resistor having a resistance value of 2r/3 one terminal of which is connected to the other terminal of the sixth resistor, a fifth analog switch one terminal of which is connected to the other terminal of the seventh resistor, and the other terminal of which is connected to the other terminal of the second resistor, a sixth analog switch one terminal of which is connected to the other terminal of the fifth resistor, and the other terminal of which is connected to the one terminal of the first resistor, a seventh analog switch one terminal of which is connected to the other terminal of the seventh resistor, and the other terminal of which is connected to the one terminal of the first resistor, and an eighth analog switch connected between the other terminal of the series-resistor circuit of the first variable resistance circuit and the other terminal of the first resistor of the second variable resistance circuit to make a short-circuit therebetween.

According to a further aspect of the present invention, there is provided a zero-data-detection mute circuit of an output section of a one-bit D/A converter, comprising an analog low-pass filter including an inverting type amplifier, configured to pass an analog-converted output of a one-bit D/A converter; zero-data-detecting circuit configured to detect that an input digital signal inputted to the D/A converter is 0-level data; a counter configured to receive an output signal of the zero-data-detecting circuit and generate an output signal when detecting that the digital signals inputted to the D/A converter are all zero for a predetermined time period; and a decoder configured to decode the output signal of the counter and decrease stepwise a resistance of a feedback resistor circuit of the inverting type amplifier of the analog low-pass filter and finally make a short-circuit both terminals of the feedback resistor circuit to fix an output of the analog low-pass filter to a reference potential, feedback resistor circuit including a first variable resistance circuit and a second variable resistance circuit, wherein the first variable resistance circuit includes n resistors connected in series forming a series-resistor circuit and analog switches connected between one terminal of the series-resistor circuit and respective nodes of the resistors of the series-resistor circuit, n being an integer of 2 or more, the n resistors each having a resistance value of r, the analog switches being on/off controlled by an output signal of a counter to stepwise change a resistance value of the first variable resistance circuit from 0 to n·r; and the second variable resistance circuit includes a first resistor having a resistance value of 0.53r, a second resistor having a resistance value of 0.47r one terminal of which is connected to one terminal of the first resistor and the other terminal of which is connected to one terminal of the series-resistor circuit of the first variable resistance circuit, a third resistor having a resistance value of r/7 one terminal of which is connected to the other terminal of the first resistor, a first analog switch one terminal of which is connected to the other terminal of the third resistor, and the other terminal of which is connected to the other terminal of the second resistor, a fourth resistor having a resistance value of 4r/21 one terminal of which is connected to the other terminal of the third resistor, a second analog switch one terminal of which is connected to the other terminal of the fourth resistor, and the other terminal of which is connected to the other terminal of the second resistor, a fifth resistor having a resistance value of 4r/15 one terminal of which is connected to the other terminal of the fourth resistor, a third analog switch one terminal of which is connected to the other terminal of the fifth resistor, and the other terminal of which is connected to the other terminal of the second resistor, a sixth resistor having a resistance value of 2r/5 one terminal of which is connected to the other terminal of the fifth resistor, a fourth analog switch one terminal of which is connected to the other terminal of the sixth resistor, and the other terminal of which is connected to the other terminal of the second resistor, a seventh resistor having a resistance value of 2r/3 one terminal of which is connected to the other terminal of the sixth resistor, a fifth analog switch one terminal of which is connected to the other terminal of the seventh resistor, and the other terminal of which is connected to the other terminal of the second resistor, a sixth analog switch one terminal of which is connected to the other terminal of the fifth resistor, and the other terminal of which is connected to the one terminal of the first resistor, a seventh analog switch one terminal of which is connected to the other terminal of the seventh resistor, and the other terminal of which is connected to the one terminal of the first resistor, and an eighth analog switch connected between the other terminal of the series-resistor circuit of the first variable resistance circuit and the other terminal of the first resistor of the second variable resistance circuit to make a short-circuit therebetween.

According to a further aspect of the present invention, there is provided a 25. A zero-data-detection mute circuit of an output section of a one-bit D/A converter, comprising an analog low-pass filter including an inverting type amplifier, configured to pass an analog-converted output of a one-bit D/A converter; zero-data-detecting circuit configured to detect that an input digital signal inputted to the D/A converter is 0-level data; a counter configured to receive an output signal of the zero-data-detecting circuit and generate an output signal when detecting that the digital signals inputted to the D/A converter are all zero for a predetermined time period; and a decoder configured to decode the output signal of the counter and decrease stepwise a resistance of a feedback resistor circuit of the inverting type amplifier of the analog low-pass filter and finally make a short-circuit both terminals of the feedback resistor circuit to fix an output of the analog low-pass filter to a reference potential, wherein the feedback resistor circuit includes a first variable resistance circuit including n resistors connected in series forming a first series-resistor circuit and analog switches connected between one terminal of the series-resistor circuit and respective nodes of the resistors of the series-resistor circuit, n being an integer of 2 or more, the analog switches being on/off controlled by an output signal of a counter to stepwise change a resistance value of the first variable resistance circuit; a second variable resistance circuit one terminal of which is connected to the one terminal of the first series-resistor circuit of the first variable resistance circuit, the second variable resistance circuit including a second series-resistor circuit of a first resistor and a second resistor which have a predetermined resistance ratio therebetween, one terminal of the first resistor being connected to one terminal of the second resistor, the other terminal of the first resistor being connected to the one terminal of the series-resistor circuit of the first variable resistance circuit, a third series-resistor circuit of a plurality of resistors, one terminal of third series-resistor circuit being connected to the other terminal of the second resistor, a plurality of analog switches connected between the other terminal of the first resistor and nodes of the respective resistors of the third series-resistor circuit, an analog switch connected between the other terminal of the third series-resistor circuit and a node of the first resistor and the second resistor and controlled by an output signal of a counter, an analog switch connected between a node of resistors of the third series-resistor circuit and the node of the first resistor and the second resistor and controlled by an output signal of a counter, and a short-circuiting analog switch connected between the other terminal of series-resistor circuit of the first variable resistance circuit and the other terminal of the second resistor of the second variable resistance circuit and controlled by an output signal of a counter to make a short-circuit there-between.

BRIEF DESCRIPTION OF THE SEVERAL VIEWS OF THE DRAWING

FIG. 2A is a block diagram of a circuit portion including a decoder for controlling the feedback resistor circuit in FIGS. 1, 5, 7, 9A, and 12A and 35B;

FIG. 2B is a concrete configuration of the decoder shown in FIG. 2A;

FIG. 2C is a circuit configuration of a flip flop circuit in the decoder shown in FIG. 2B;

FIGS. 4A to 4C are a table diagram showing how the feedback resistor circuit in FIG. 1 is operated in accordance with a count signal;

FIGS. 6A to 6C show a table diagram showing how the feedback resistor circuit in FIG. 5 is operated in accordance with a count signal;

FIG. 7 is a circuit configuration of a feedback resistor circuit used in a stepwise zero-data-detection mute circuit according to a modification of the second embodiment of the present invention;

FIGS. 8A to 8C show a table diagram showing how the feedback resistor circuit in FIG. 7 is operated in accordance with a count signal;

FIGS. 11A to 11C show a table diagram showing how a feedback resistor circuit in FIG. 9A is operated in accordance with a count signal;

FIG. 14 is a block diagram showing an example of a concrete configuration of the output section of the conventional D/A converter in FIG. 13;

FIG. 16 is a concrete configuration of the zero-data detection circuit of the conventional circuit in FIG. 14;

FIG. 17A is a block diagram of a circuit portion including the decoder of the conventional circuit in FIG. 14;

FIG. 18 is a truth table of the conventional decoder in FIG. 17B;

FIG. 22 shows a relation between a beat and a DC offset according to a fixed pattern peculiar to a conventional ΣΔ modulator;

FIG. 23 shows a configuration of the output section of a one-bit D/A converter with a non-stepwise mute function;

FIG. 28A shows a circuit configuration of a feedback resistor circuit in which the number of change steps is doubled to that of the feedback resistance in FIG. 15B and the circuit scale of the feedback resistor circuit is doubled to that of the feedback resistance in FIG. 15B;

FIG. 28B is a circuit configuration of one of the switches in the circuit in FIG. 28A;

FIG. 29A shows a block diagram of a decoder in which the number of DC change steps is doubled to that of the conventional circuit in FIG. 17B;

FIG. 29C is a circuit configuration of one of the flip flop circuits in the decoder shown in FIG. 29B;

FIG. 29D is a truth table of the decoder in FIG. 29B;

FIGS. 33A and 33B show a truth table of the decoder for controlling the conventional feedback resistor circuit in FIGS. 30A and 30B;

DETAILED DESCRIPTION OF THE INVENTION (First Embodiment)

Figure 1:
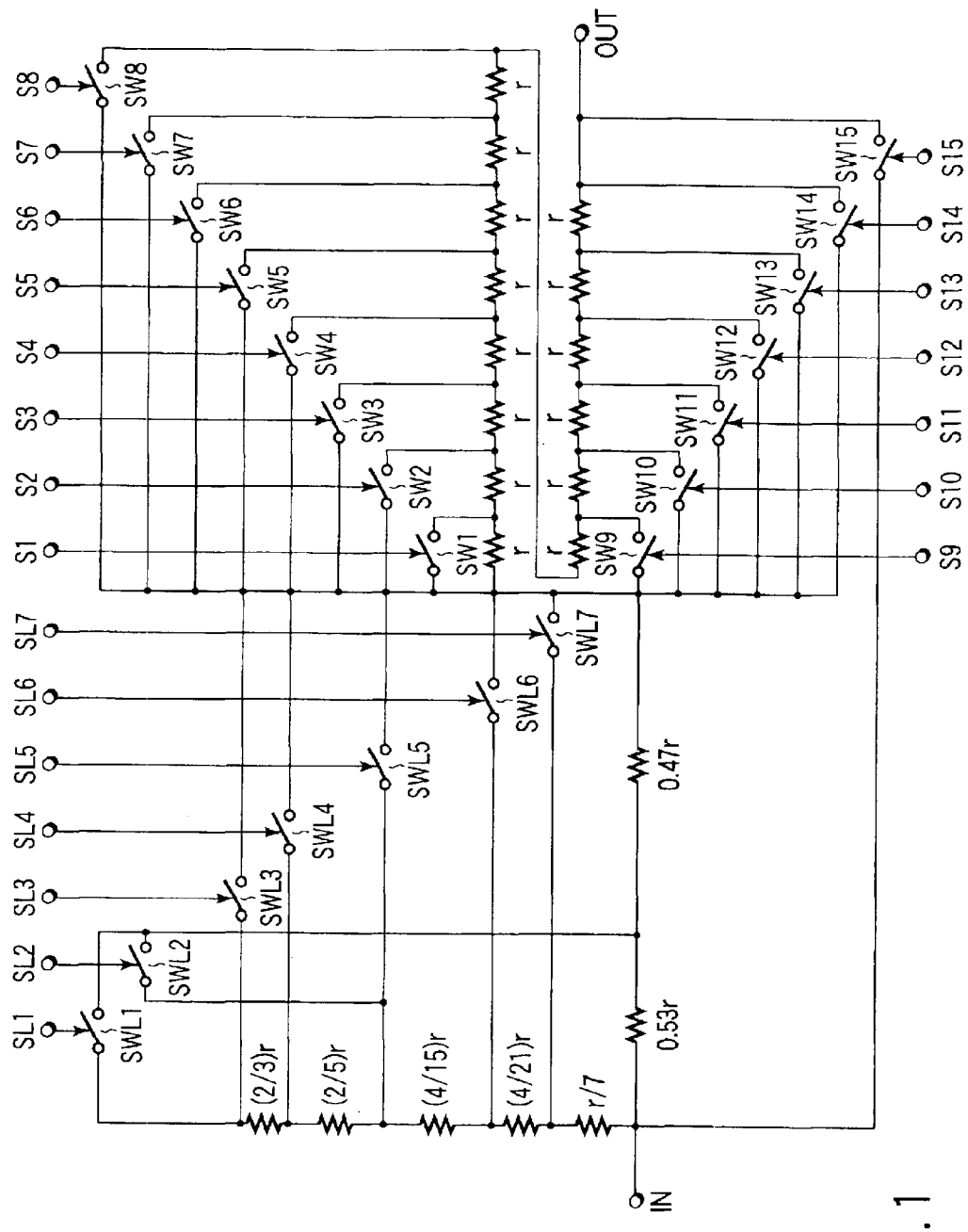
FIG. 1 is a circuit configuration of a feedback resistor circuit used in a stepwise zero-data-detection mute circuit according to a first embodiment of the present invention.

FIG. 1 shows a configuration of a feedback resistor circuit used in a stepwise zero-data-detection mute circuit according to a first embodiment of the present invention. The circuit section of the analog switches SWL1 to SWL7 controlled by the control signals SL1 to SL7 is different from that of FIG. 35B.

The feedback resistor circuit in FIG. 1 is formed of a first variable resistance circuit and a second variable resistance circuit. In the first variable resistance circuit, n resistors each having a resistance value of r are connected in series to form a first series-resistor circuit (n being an integer of 2 or more and 14 in this example). Analog switches SW1 to SW14 are connected between one terminal of the series-resistor circuit and respective nodes of the resistors of the series-resistor circuit. The analog switches SW1 to SW14 are on/off controlled by control signals S1 to S14 to stepwise change a resistance value of the first variable resistance circuit from 0 to n·r in units of r. The other terminal of the series-resistor circuit is connected to an output terminal OUT of the first variable resistance circuit.

The second variable resistance circuit includes a first resistor having a resistance value of 0.53r, a second resistor having a resistance value of 0.47r, a third resistor having a resistance value of r/7, a fourth resistor having a resistance value of 4r/21, a fifth resistor having a resistance value of 4r/15, a sixth resistor having a resistance value of 2r/5, and a seventh resistor having a resistance value of 2r/3.

One terminal of the first resistor having resistance value of 0.53r is connected to one terminal of the second resistor having resistance value of 0.47r. The other terminal of the first resistor having resistance value of 0.53r is connected to an input terminal IN of the feedback resistor circuit. The other terminal of the second resistor having resistance value of 0.47r is connected to the one terminal of the series-resistor circuit of the first variable resistance circuit.

One terminal of the third resistor having a resistance value of r/7 is connected to the other terminal of the first resistor. One terminal of the first analog switch SWL7 is connected to the other terminal of the third resistor, and the other terminal of the first analog switch SWL7 is connected to the other terminal of the second resistor.

One terminal the fourth resistor having a resistance value of 4r/21 is connected to the other terminal of the third resistor. One terminal of the second analog switch SWL6 is connected to the other terminal of the fourth resistor, and the other terminal of the second analog switch SWL6 is connected to the other terminal of the second resistor.

One terminal of the fifth resistor having a resistance value of 4r/15 is connected to the other terminal of the fourth resistor. One terminal of the third analog switch SWL5 is connected to the other terminal of the fifth resistor, and the other terminal of the third analog switch SWL5 is connected to the other terminal of the second resistor.

One terminal of the sixth resistor having a resistance value of 2r/5 is connected to the other terminal of the fifth resistor. One terminal of the fourth analog switch SWL4 is connected to the other terminal of the sixth resistor, and the other terminal of the fourth analog switch SWL4 is connected to the other terminal of the second resistor.

One terminal of the seventh resistor having a resistance value of 2r/3 is connected to the other terminal of the sixth resistor. One terminal of the fifth analog switch SWL3 is connected to the other terminal of the seventh resistor, and the other terminal of the fifth analog switch SWL3 is connected to the other terminal of the second resistor.

One terminal of the sixth analog switch SWL2 is connected to the other terminal of the fifth resistor, and the other terminal of the sixth analog switch SWL2 is connected to the one terminal of the first resistor.

One terminal of the seventh analog switch SWL1 is connected to the other terminal of the seventh resistor, and the other terminal of the seventh analog switch SWL1 is connected to the one terminal of the first resistor.

The resistance value between the other terminal of the first resistor having the resistance value of 0.53r and the other terminal of the second resistor having the resistance value of 0.47r is changed from r/8 to r in units of r/8.

The other terminal of the second resistor is connected to the one terminal of the first series-resistor circuit of the first variable resistance circuit so that the first variable resistance circuit and the second variable resistance circuit are connected in series to each other.

A further analog switch SW15 is connected between the input terminal IN and the output terminal OUT to make a short-circuit therebetween.

In the second variable resistance circuit, when only the analog switch (hereafter referred to as switch) SWL7 among the analog switches SWL1 to SWL7, which is controlled in accordance with the control signal SL7, is turned on, r/7 is connected in parallel with r (a total resistance of 0.53r and 0.47r connected in series) and the resistance of r/8 is formed. This is the same as the case of the circuit in FIG. 35B.

When only the switch SWL6 among the analog switches SWL1 to SWL7, which is controlled in accordance with the control signal SL6 is turned on, the series resistance of r/7 and 4r/21, that is, r/7+4r/21=r/3 becomes parallel with r and the resistance of r/4=2r/8 is formed.

When only the switch SWL5 among the analog switches SWL1 to SWL7, which is controlled in accordance with the control signal SL5 is turned on, the series resistance of r/7, 4r/21 and 4r/15, that is, r/7+4r/21+4r/15=3r/5 becomes parallel with r and the resistance 3r/8 is formed.

When only the switch SWL4 among the analog switches SWL1 to SWL7, which is controlled in accordance with the control signal SL4 is turned on, the series resistance of r/7, 4r/21, 4r/15 and 2r/5, that is, r/7+4r/21+4r/15+2r/5=r becomes parallel with r and the resistance of r/2=4r/8 is formed.

When only the switch SWL3 among the analog switches SWL1 to SWL7, which is controlled in accordance with the control signal SL3 is turned on, the series resistance of r/7, 4r/21, 4r/15, 2r/5, and 2r/3, that is, r/7+4r/21+4r/15+2r/5+2r/3=5r/3 becomes parallel with r and the resistance of 5r/8 is formed.

When only the switch SWL2 among the analog switches SWL1 to SWL7, which is controlled in accordance with the control signal SL2 is turned on, the series resistance of r/7, 4r/21 and 4r/15, that is, r/7+4r/21+4r/15=5r/5 becomes parallel with 0.53r and the resistance of 0.28r is formed. Since the resistance of 0.28r becomes in series with 0.47r, then the resistance of 0.28r+0.47r=0.75r=3r/4=6r/8 is formed.

When only the switch SWL1 among the analog switches SWL1 to SWL7, which is controlled in accordance with the control signal SL1 is turned on, the series resistance of r/7, 4r/21, 4r/15, 2r/5, and 2r/3, that is, r/7+4r/21+4r/15+2r/5+2r/3=5r/3 becomes parallel with 0.53r and the resistance of 0.4r is formed. Since the resistance of 0.4r becomes in series with 0.47r, then the resistance of 0.4r+0.47r=0.87r/≈7r/8 is formed.

In this way, in the case of the circuit in FIG. 1, the resistance value between the IN terminal and the common node of the switches SW1 to SW14 controlled in accordance with the control signals S1 to S14 changes from 7r/8 to r/8 in units of r/8 as the switches SLW1 to SLW7 are sequentially turned on in accordance with the control signals SL1 to SL7.

Figure 15A:
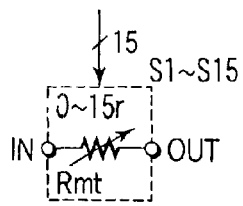
FIG. 15A is an equivalent circuit of the feedback resistor circuit in the conventional circuit in FIG. 14.
Figure 15C:
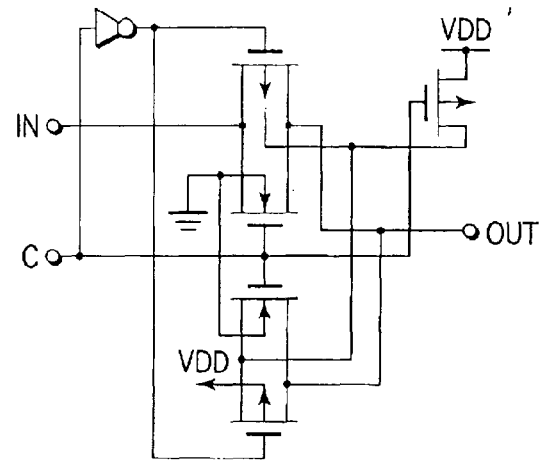
FIG. 15C is a circuit configuration of one of the switches in the feedback resistor circuit in FIG. 15B.
Figure 15B:
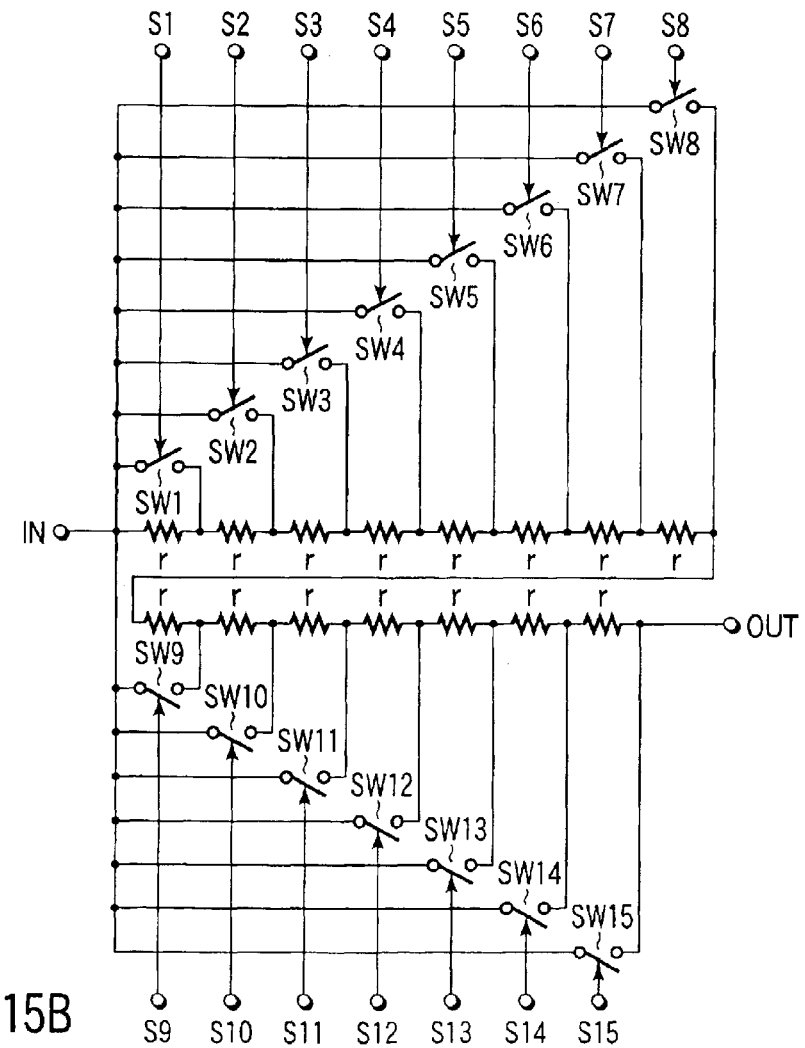
FIG. 15B is a concrete circuit diagram of the feedback resistor circuit in the conventional circuit in FIG. 14.
Figure 17B:
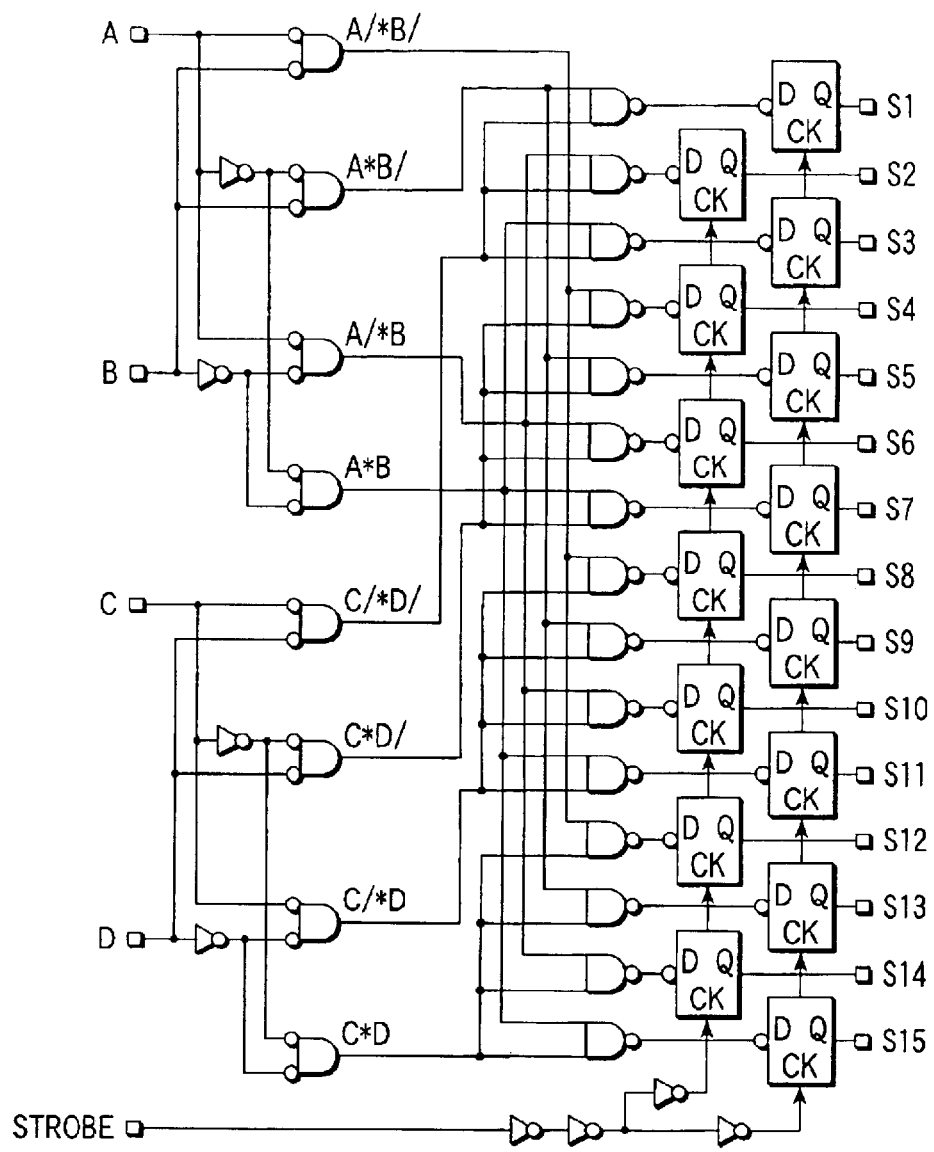
FIG. 17B is a concrete circuit diagram of the decoder of the conventional circuit in FIG. 14.
Figure 17C:
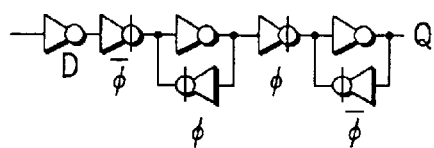
FIG. 17C is a circuit configuration of one of the flip flop circuits in the decoder shown in FIG. 17B.
Figure 19A:
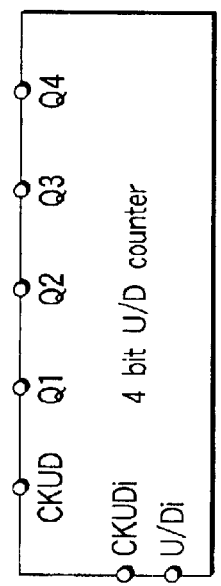
FIG. 19A is a block diagram of the up-down counter of the conventional circuit in FIG. 14.
Figure 19B:
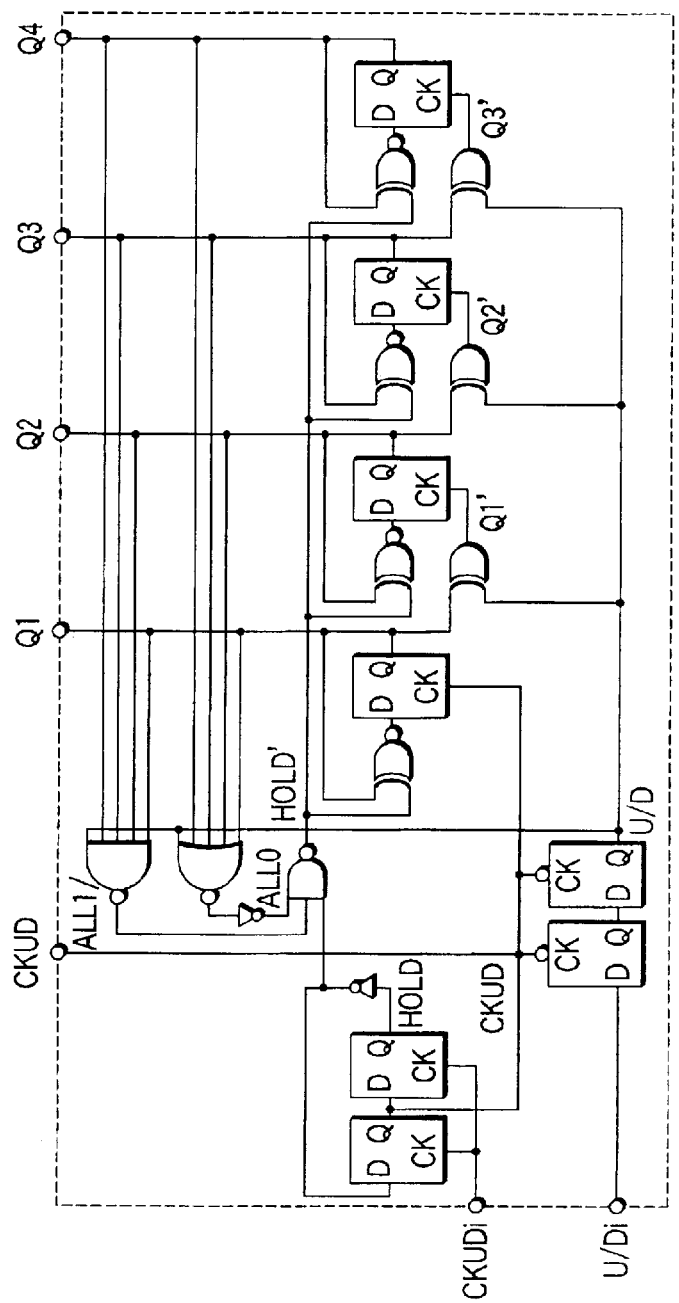
FIG. 19B is a concrete diagram of the up-down counter of the conventional circuit in FIG. 14.
Figure 20A:
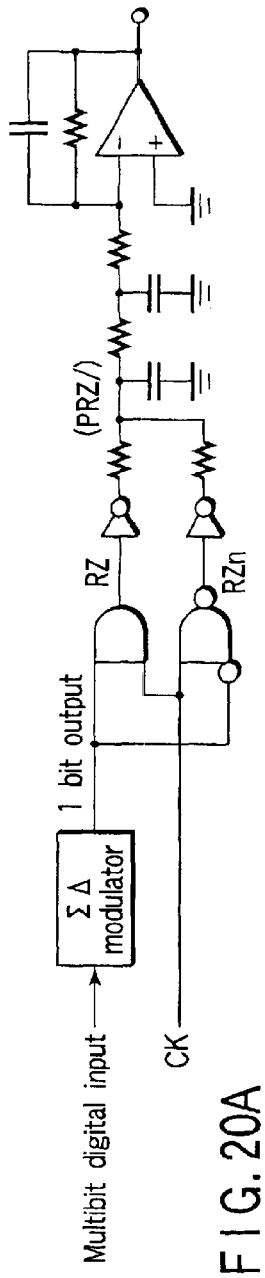
FIG. 20A shows a concrete configuration of the output section of a one-bit D/A converter using a ΣΔ converter.
Figure 20B:
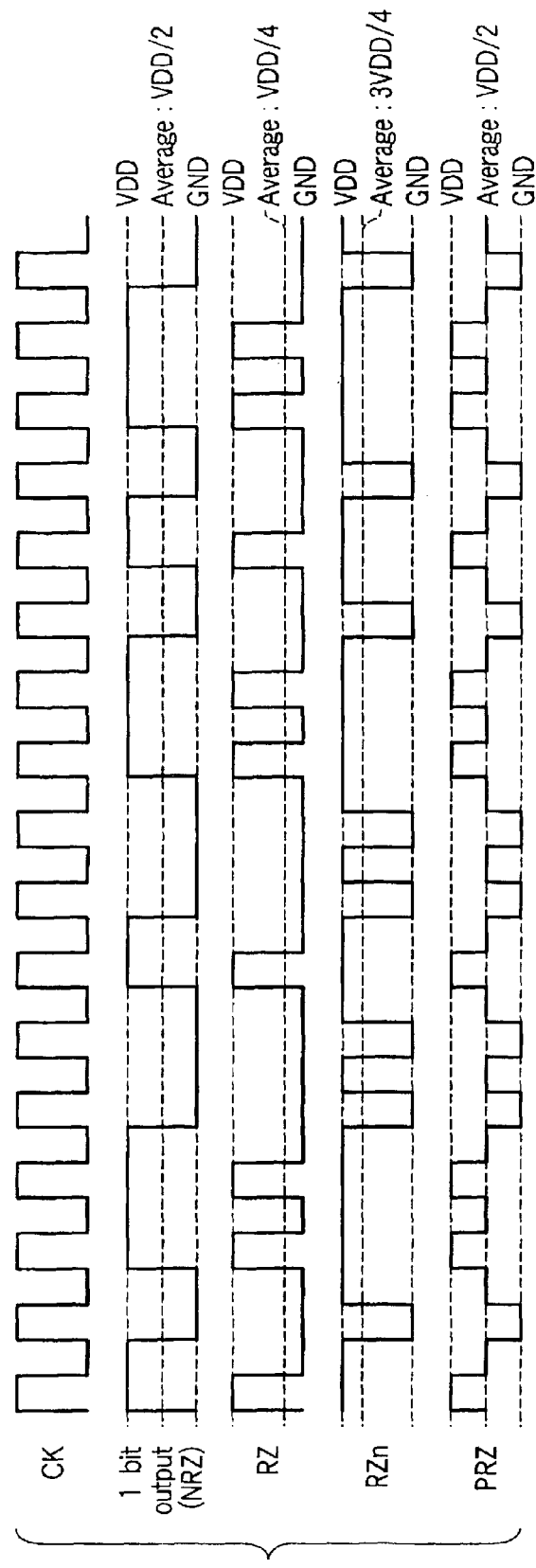
FIG. 20B shows a timing signal chart of outputs of the output section of the one-bit D/A converter using a ΣΔ converter.
Figure 21A:
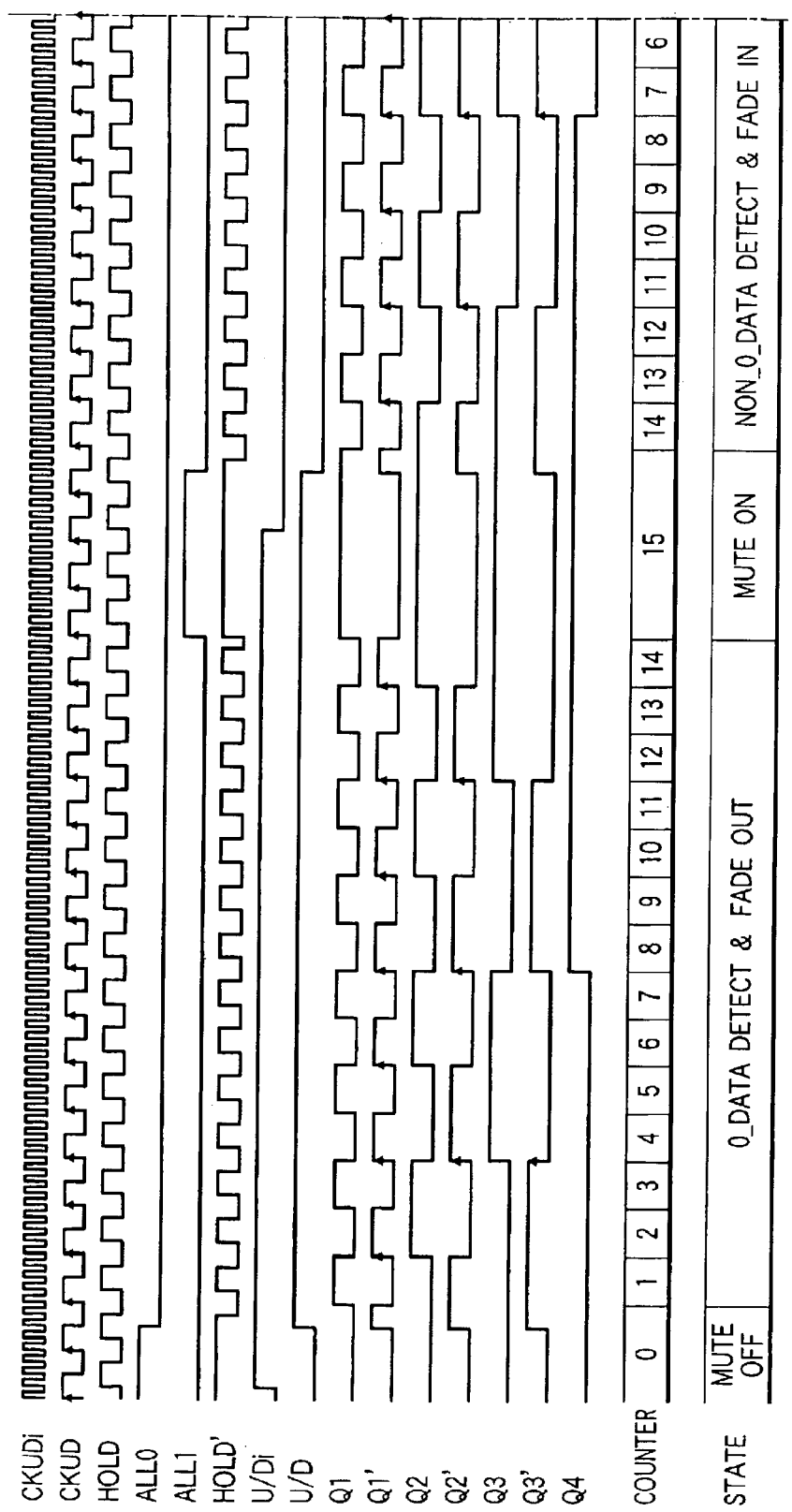
FIGS. 21A and 21B show a timing signal chart of the zero-data-detection mute circuit of the conventional circuit in FIG. 14.
Figure 21B:
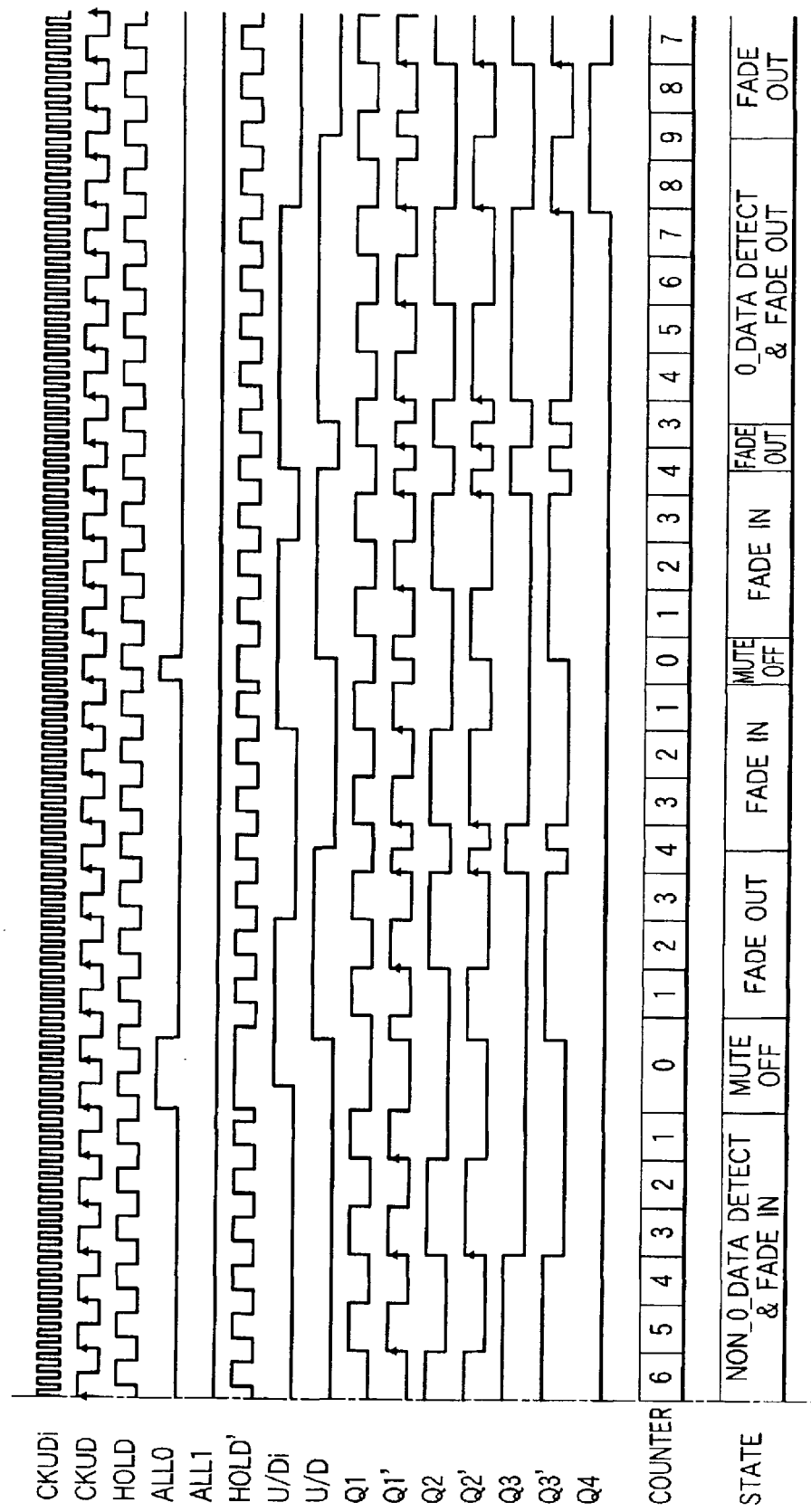
Figure 24:
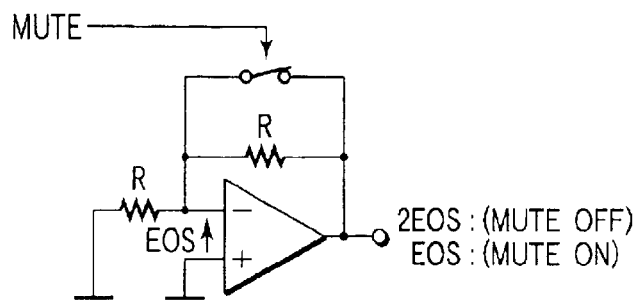
FIG. 24 is a circuit diagram showing a pop-noise generation mechanism when a mute is turned on/off according to an input-converted DC offset of a conventional operational amplifier.
Figure 25:
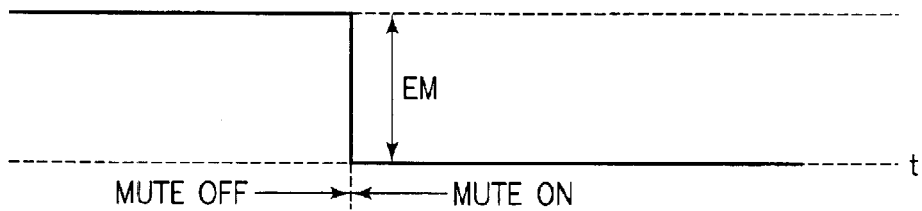
FIG. 25 shows a conventional DC change waveform according to a not-stepwise mute.
Figure 26:
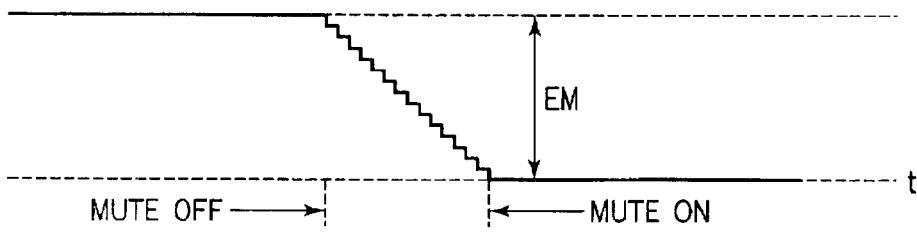
FIG. 26 shows a conventional DC change waveform according to a stepwise mute.
Figure 27:
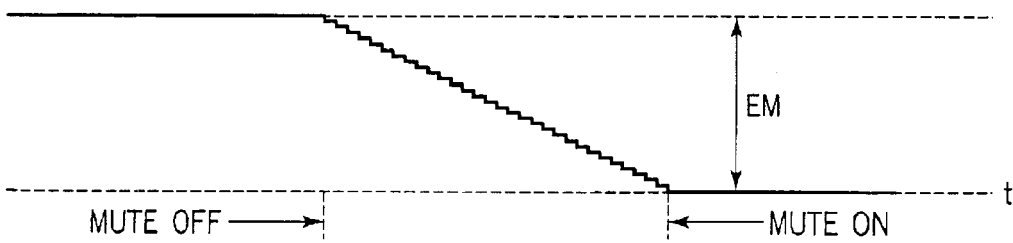
FIG. 27 shows a DC change waveform according to a conventional stepwise mute, in which the number of change steps is doubled, compared to the case of the DC change waveform in FIG. 26.
Figure 29B:
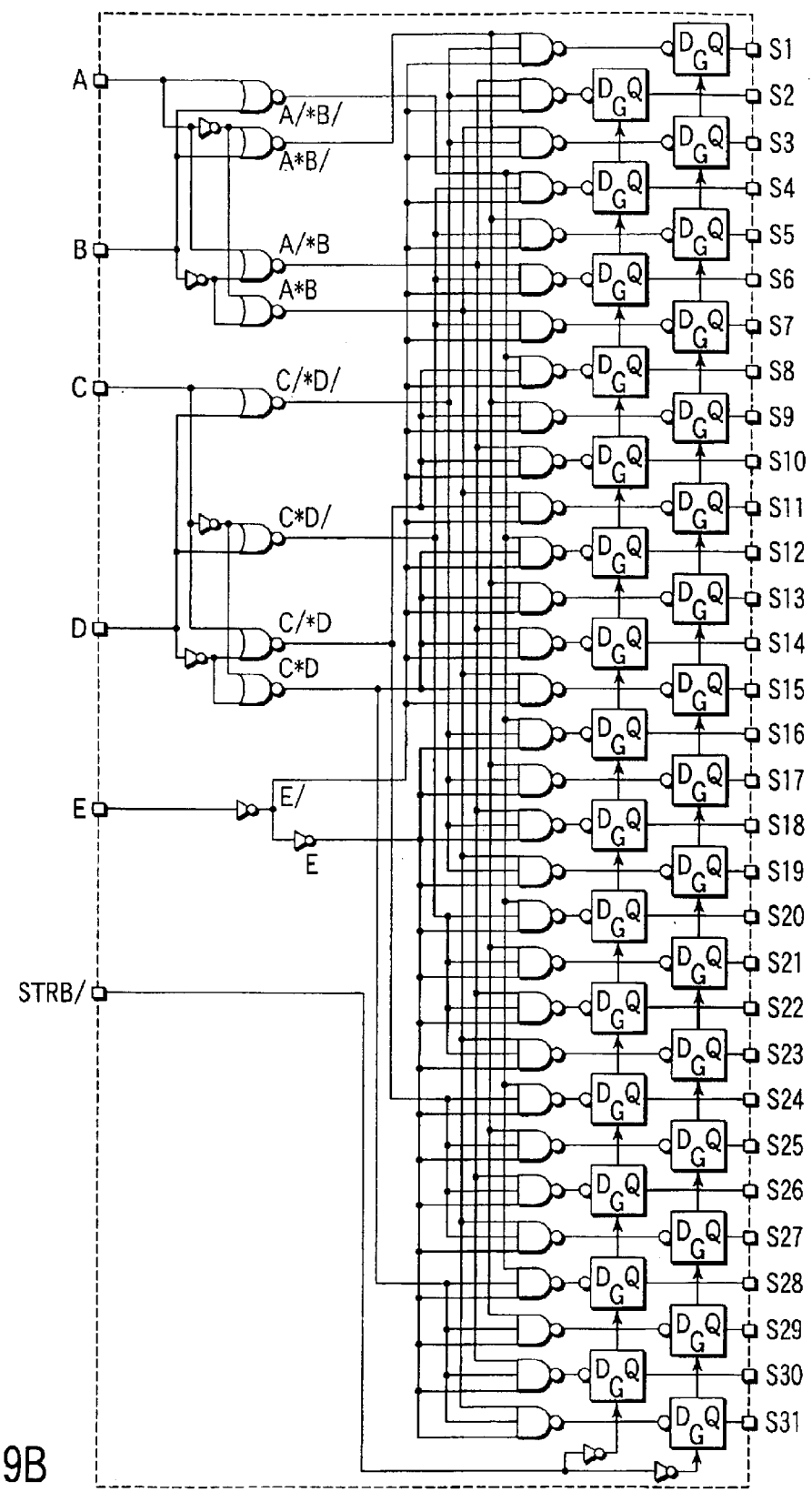
FIG. 29B is a concrete circuit configuration of the decoder in FIG. 29A, in which the circuit scale is doubled to that of the decoder in FIG. 17B.
Figure 30B:
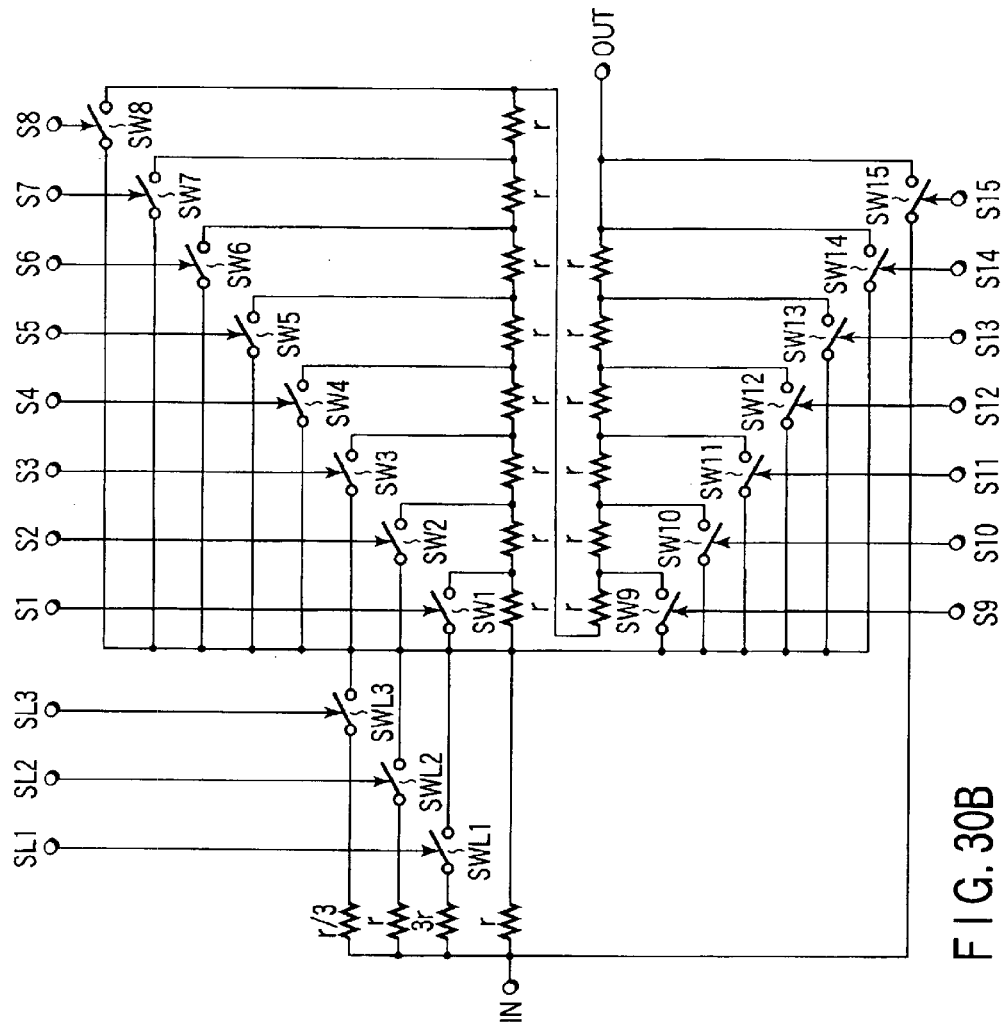
FIG. 30B is a circuit configuration of the feedback resistor circuit in FIG. 30A, which is according to Jpn. Pat. Appln. KOKAI Publication No. 2001-77694.
Figure 30A:
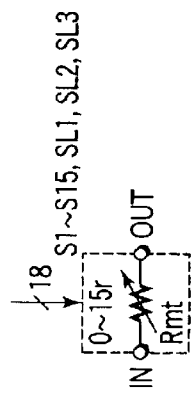
FIG. 30A shows an equivalent circuit of a feedback resistor circuit of a stepwise zero-data-detection mute circuit according to Jpn. Pat. Appln. KOKAI Publication No. 2001-77694.
Figure 31A:
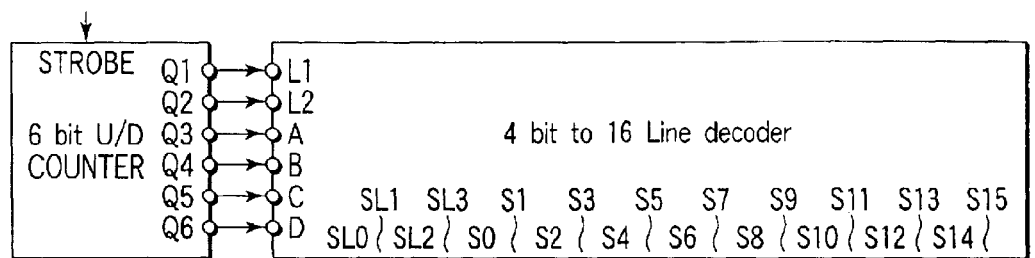
FIG. 31A shows a circuit portion including a decoder for controlling the feedback resistor circuit in FIGS. 30A and 30B.
Figure 31B:
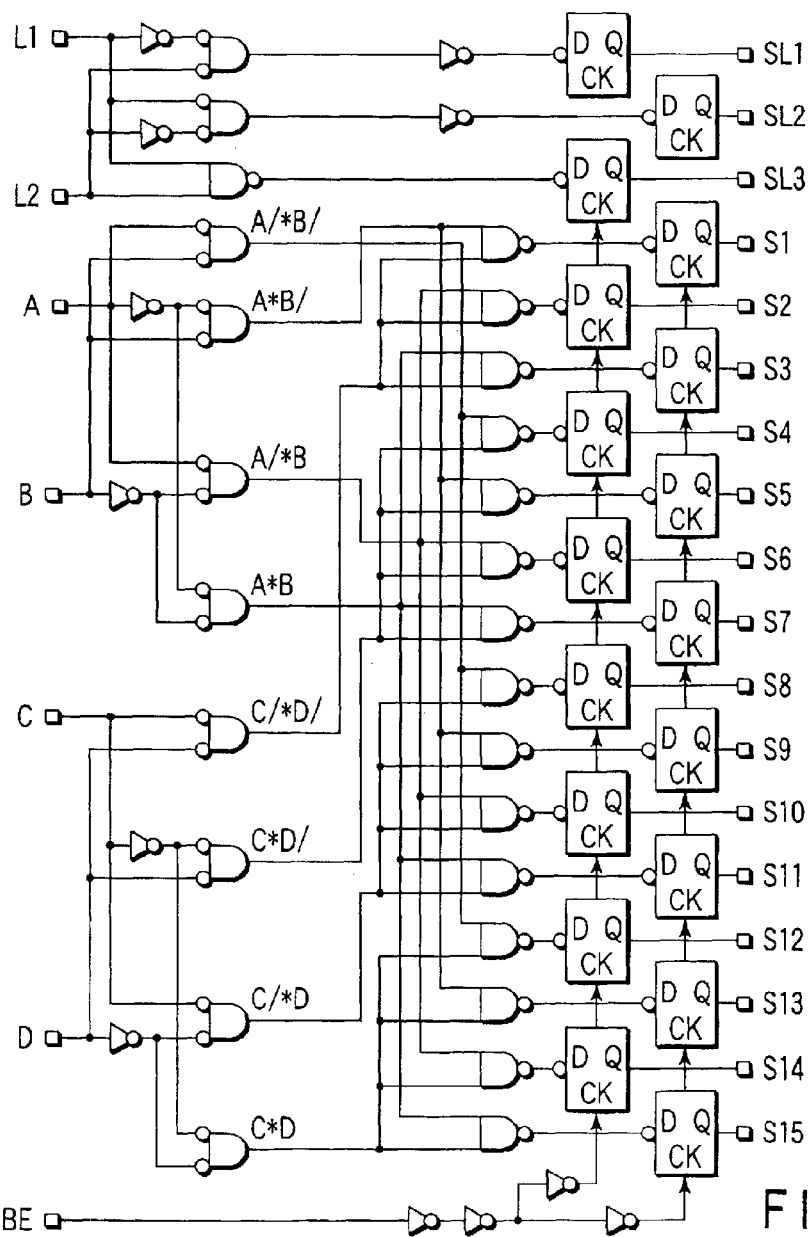
FIG. 31B is a concrete circuit configuration of the decoder in FIG. 31A.
Figure 32A:
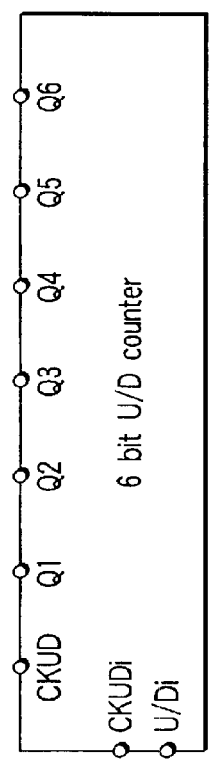
FIG. 32A is a block diagram of an up-down counter for controlling the decoder of FIGS. 31A and 31B.
Figure 32B:
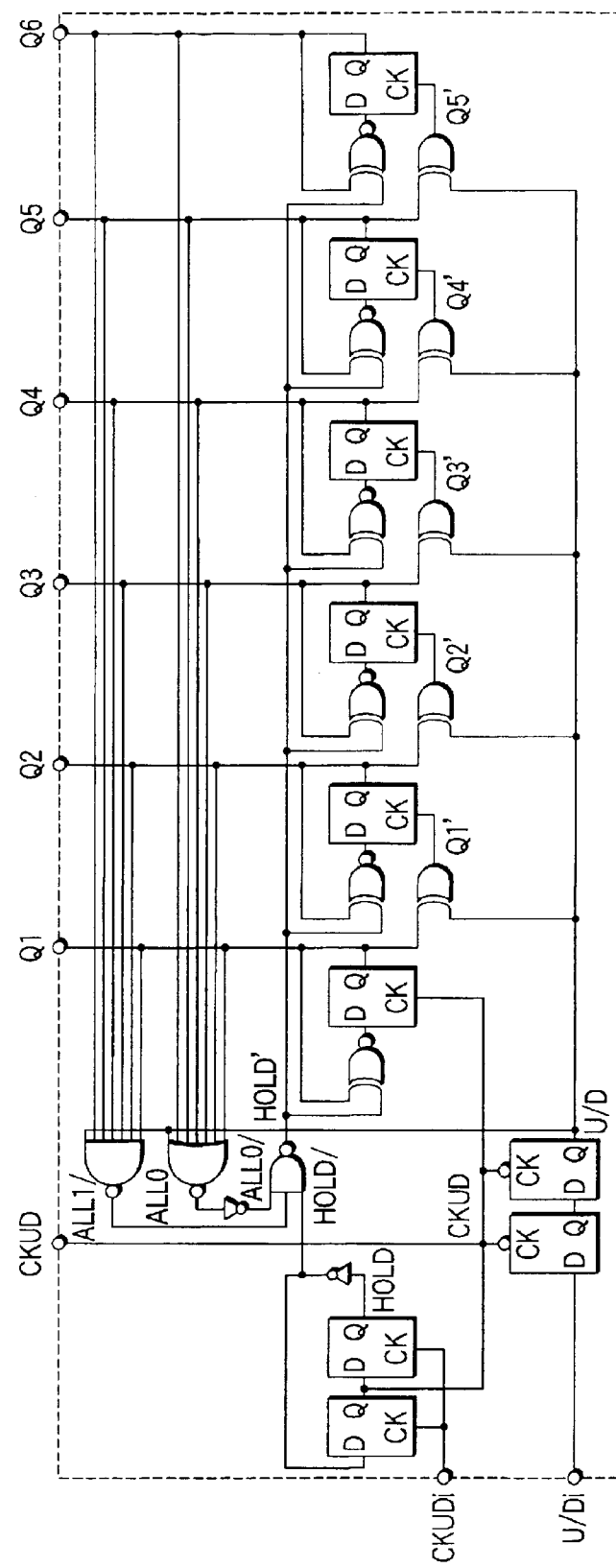
FIG. 32B is a concrete circuit configuration of the up-down counter in FIG. 32A.
Figure 34B:
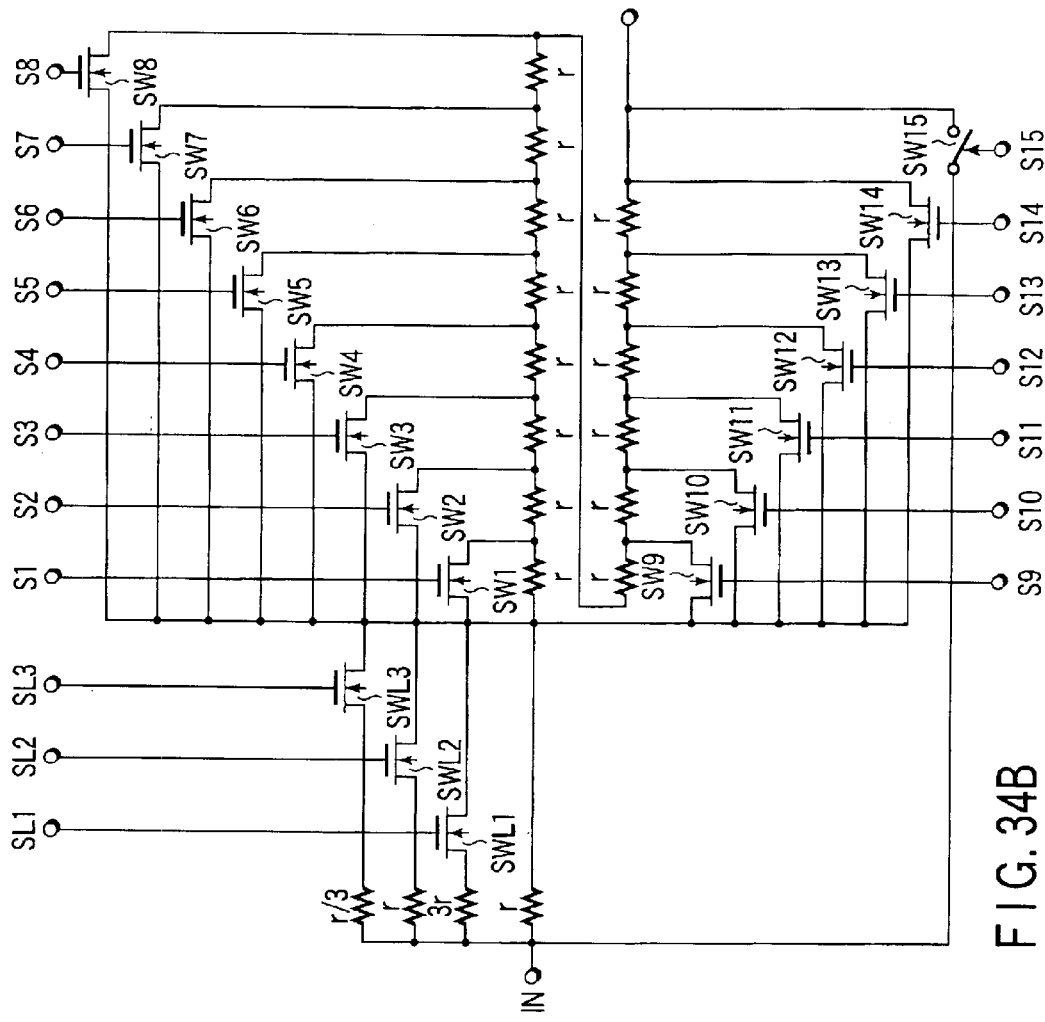
FIG. 34B is a circuit configuration of the feedback resistor circuit in FIG. 34A, in which the switches are formed of a MOS transistor, which is according to Jpn. Pat. Appln. KOKAI Publication No. 2001-77694.
Figure 34A:
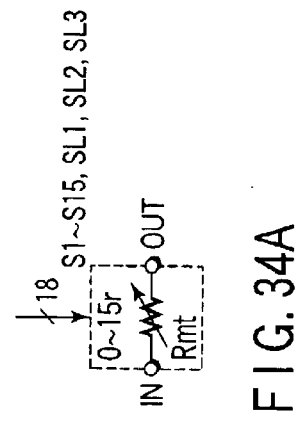
FIG. 34A shows an equivalent circuit of another feedback resistor circuit of the stepwise zero-data-detection mute circuit according to Jpn. Pat. Appln. KOKAI Publication No. 2001-77694.
Figures 35A, 35B:
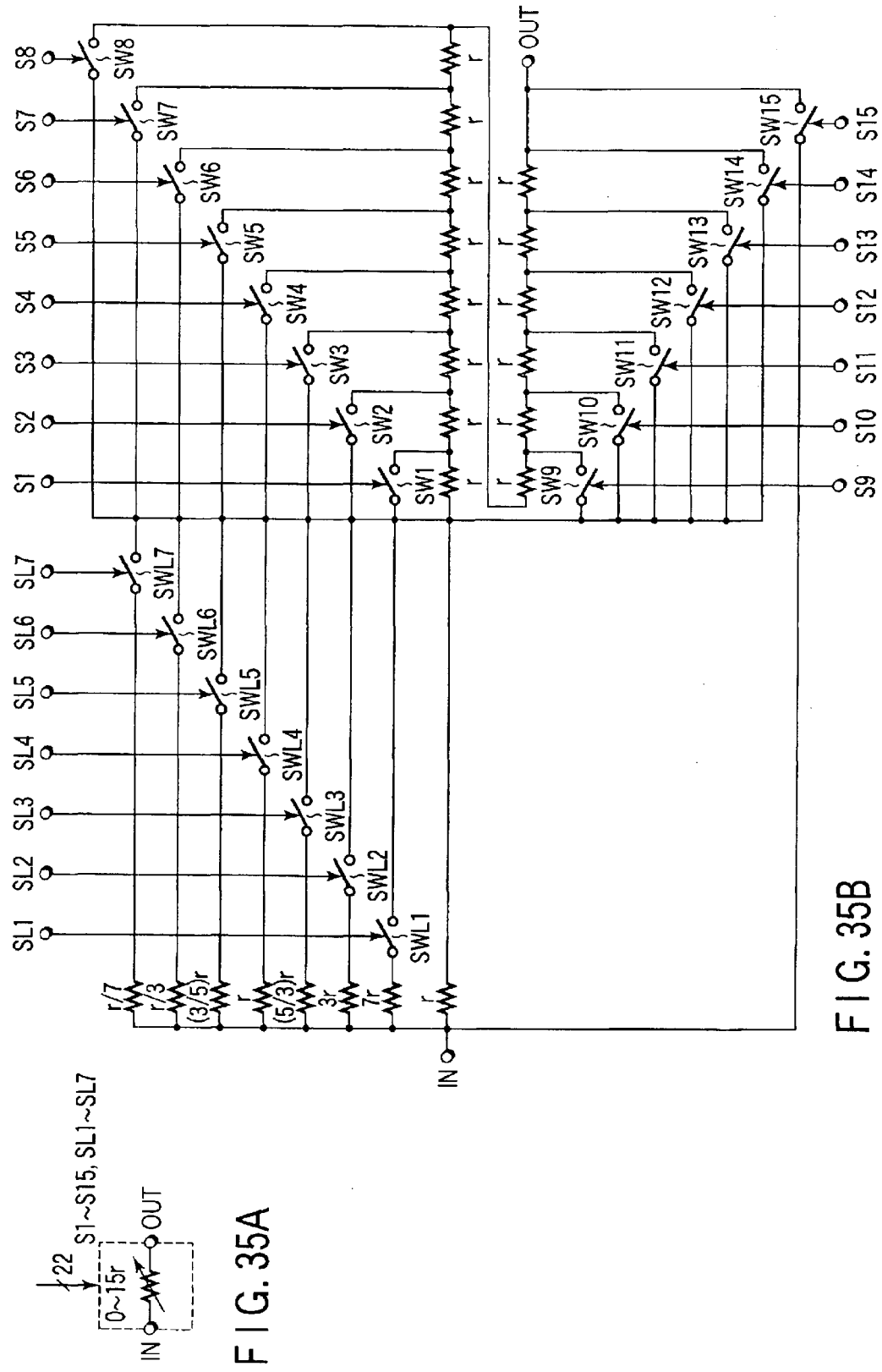
FIG. 35A is an equivalent circuit of a feedback-resistance circuit of a stepwise zero-data-detection mute circuit when the number of steps is doubled to that of the circuit in FIG. 30A, which is according to Jpn. Pat. Appln. KOKAI Publication No. 2001-77694.
FIG. 35B is a circuit configuration of the feedback resistor circuit in FIG. 35A, which is according to Jpn. Pat. Appln. KOKAI Publication No. 2001-77694.

Therefore, in the case of the circuit in FIG. 1, it is found that the resistance change rate is small since the change rate becomes 1/8 compared to the case of FIG. 15B, similarly to the case of the circuit in FIG. 35B.

Moreover, it is necessary to add the resistance of 13.7r (total resistance of r, r/7, r/3, 3r/5, r, 5r/3, 3r, and 7r) to the circuit in FIG. 35B compared to the case of the circuit in FIG. 15B. However, in the case of FIG. 1 according to the embodiment of the present invention, it is allowed to only add 1.67r (total resistance of 0.53r of the first resistor, 0.47r of the second resistor, r/7 of the third resistor, 4r/21 of the fourth resistor, 4r/15 of the fifth resistor, 2r/5 of the sixth resistor, and 2r/3 of the seventh resistor).

FIG. 2A is a block diagram of a circuit portion including the U/D counter, the decoder and the feedback resistor circuit of the circuit shown in FIG. 1, and FIG. 2B shows an example of a concrete structure of the decoder of the circuit shown in FIG. 1.

The decoder of FIGS. 2A and 2B receives output signals Q1 to Q7 and clock CKUD of the U/D counter and outputs control signals SL1 to SL7 and S1 to S15 to the feedback resistor circuit. The decoder includes a plurality of logic circuit sections which receive output signals Q1 to Q7 and clock CKUD of the U/D counter to perform logic operations and a plurality of flip flop circuits which are controlled by output signals of the logic circuit sections. FIG. 2C shows an example of a concrete circuit diagram of one flip flop circuit in the decoder in FIG. 2B.

Figure 3A:
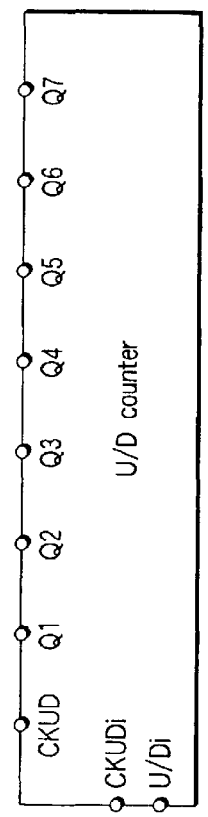
FIG. 3A is a block diagram of an up-down counter for inputting a count signal to the decoder in FIGS. 2A and 2B.
Figure 3B:
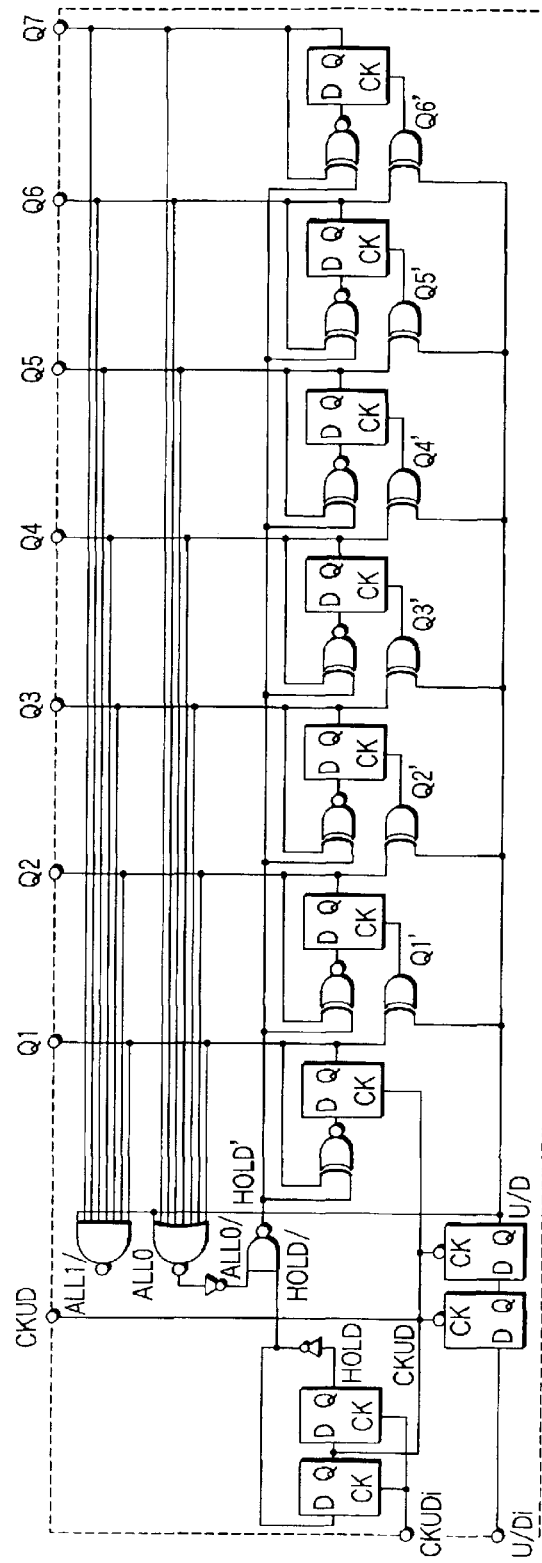
FIG. 3B is a concrete configuration of the up-down counter shown in FIG. 3A.

FIG. 3A is a block diagram of the U/D counter (hereafter referred to as counter) of the circuit shown in FIG. 1, and FIG. 3B shows an example of a concrete structure of the U/D counter of the circuit shown in FIG. 1.

As shown in FIG. 3B, the U/D counter includes a flip flop section and a logic circuit portion. The U/D counter receives clock signal CKUDi and up-down control signal U/Di, and outputs count signals Q1 to Q7 and clock signal CKUD.

FIGS. 4A to 4C shows a state in which a feedback resistance smoothly changes when switches SW1 to SW15 controlled in accordance with the control signals S1 to S15 and switches SWL1 to SWL7 controlled in accordance with the control signals SL1 to SL7 are sequentially turned on in accordance with the value of the counter.

In this way, only by slightly increasing the feedback resistance, it is possible to increase the number of change steps of the feedback resistance. Moreover, it is possible to reduce the pop noise while a mute operates.

(Second Embodiment)

Figure 5:
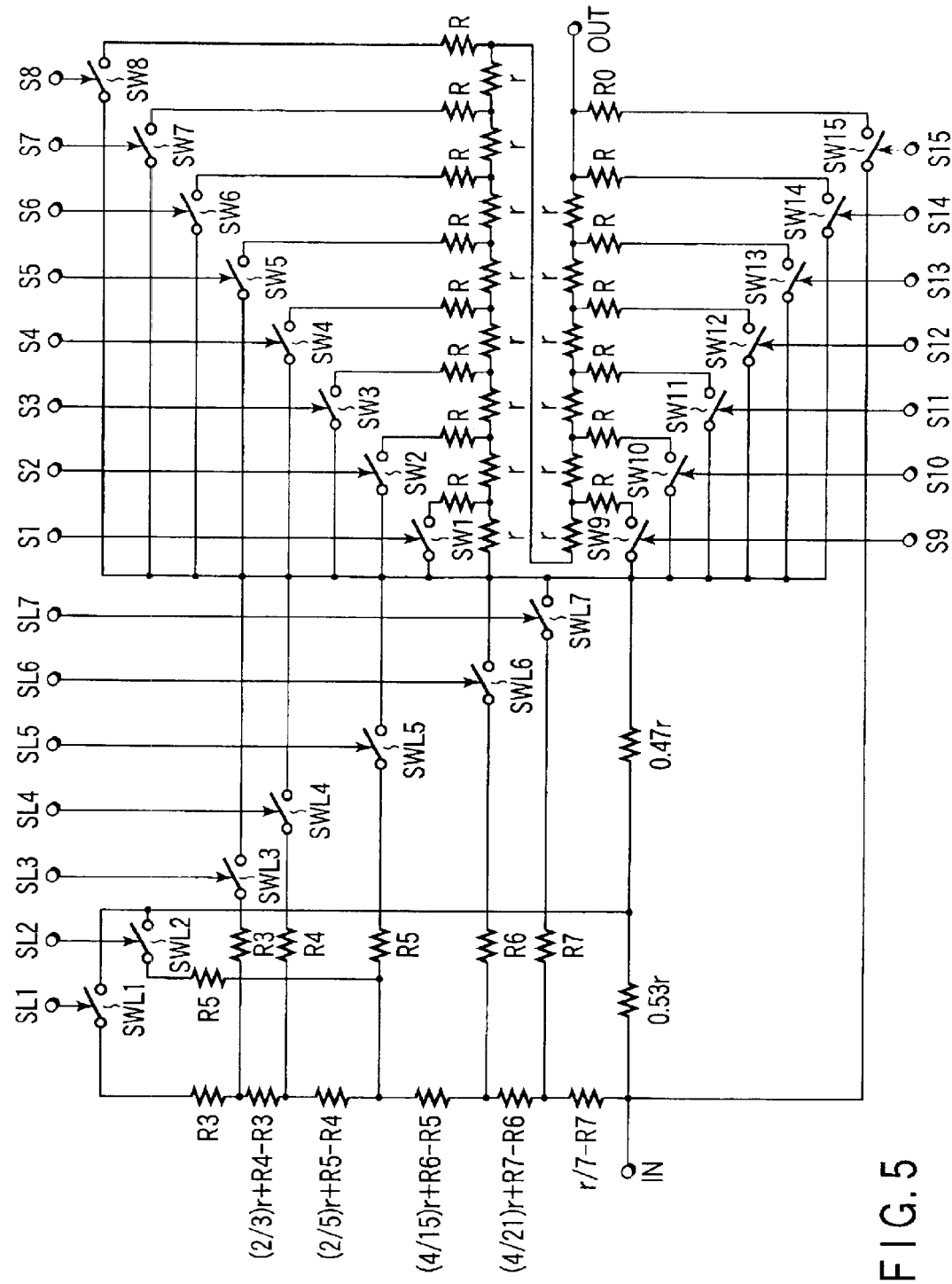
FIG. 5 is a circuit configuration of a feedback resistor circuit used in a stepwise zero-data-detection mute circuit according to a second embodiment of the present invention.

FIG. 5 shows a configuration of a feedback resistor circuit used for a stepwise zero-data-detection mute circuit according to a second embodiment of the present invention. In the feedback resistor circuit of FIG. 5, the on-resistance of the analog switches is taken into consideration.

That is, to correct errors due to the on-resistance of the switches, in the feedback resistor circuit of FIG. 5, the resistance values are changed with respect to the circuit shown in FIG. 1 as described below.

The resistance r/7 is changed to r/7−R7. The resistance 4r/21 is changed to 4r/21+R7−R6. The resistance 4r/15 is changed to 4r/15+R6−R5. The resistance 2r/5 is changed to 2r/5+R5−R4. The resistance 2r/3 is changed to 2r/3+R4−R3.

It is not necessary to consider the on-resistance of the switch when it is sufficiently smaller than the resistance r. However, to make the on-resistance sufficiently small, it is necessary to increase dimensions of a device constituting the switch. For example, when the switch has the configuration in FIG. 15C, it is necessary to make the W/L of the gate of the MOS transistors sufficiently large in order to make the on-resistance sufficiently small. Thus, the area occupied by the analog switches becomes considerably large.

As shown in FIG. 5, by considering the on-resistance of the switches, it is possible to suppress the MOS transistors to a proper size. In FIG. 5, it is assumed that the on-resistance of the switches SW1 to SW14 controlled in accordance with the control signals S1 to S14 are equal to resistance R for simplification. Moreover, the on-resistance of the switch SW15 controlled in accordance with the control signal S15 should be small, and the on-resistance of the switch SW15 is shown by another symbol R0.

The switches SWL3 to SWL5 controlled in accordance with the control signals SL3 to SL5 respectively need to have a comparatively small on-resistance, and the on-resistance of the switches SWL3 to SWL5 are shown by symbols R3 to R5. The on-resistance of the switch SWL1 controlled in accordance with the control signal SL1 is made equal to R3. Moreover, the on-resistance of the switch SWL2 controlled in accordance with the control signal SL2 is made equal to R5.

FIGS. 6A to 6C show the resistance change of the circuit in FIG. 5. In FIGS. 6A to 6C, it is found that an error is generated by R at the change time from when the switches S1 to S15 controlled in accordance with the control signals S1 to S15 are all turned off to when the switch SW1 controlled in accordance with the control signal S1 is turned on. Moreover, an error is also generated by R, if R>>R0, at the change time from when the switches SW14 and SWL7 controlled in accordance with the control signals S14 and SL7 are turned on to when the switch SW15 controlled in accordance with the control signal S15 is turned on.

FIG. 7 shows a circuit taking this point into consideration. The circuit of FIG. 7 is a feedback resistor circuit used for a stepwise zero-data-detection mute circuit according to a modification of the second embodiment of the present invention.

As shown in FIG. 7, R is connected in series to the resistance r between the switch SW1 controlled in accordance with the control signal S1 and the common node among the switches SW1 to SW14 controlled in accordance with the control signals S1 to S14. Moreover, the on-resistance of the switch SW15 controlled in accordance with the control signal S15 is set to R, and the on-resistance of the switch SWMT controlled in accordance with another control signal SMT is set to R0 (R>>R0). R0 is connected in parallel with the on-resistance of the switch SW15 controlled in accordance with the control signal S15. With the connection scheme, the resistance value change becomes such that as shown in FIGS. 8A to 8C and steps are eliminated from the resistance value change.

In the case of this embodiment, steps between variable resistance values are further eliminated than in the first embodiment. Therefore, it is possible to further decrease the pop noise when a mute operates.

(Third Embodiment)

Figures 9A, 9B:
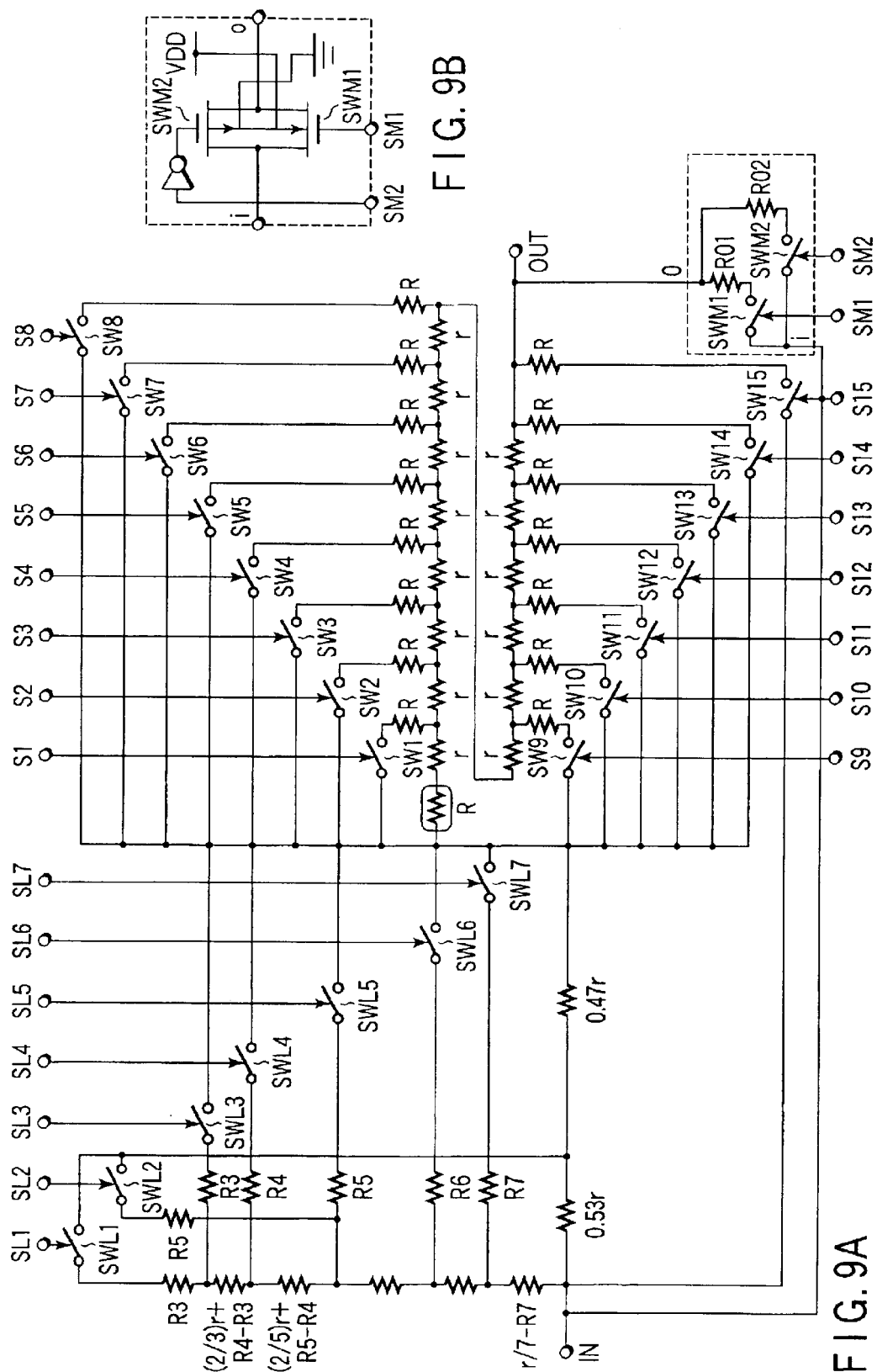
FIG. 9A is a circuit configuration of a feedback resistor circuit used in a stepwise zero-data-detection mute circuit according to a third embodiment of the present invention.
FIG. 9B is a circuit configuration of a switch for receiving control signals SM1 and SM2 in the feedback resistor circuit in FIG. 9A.

FIG. 9A shows a circuit structure of a feedback resistor circuit used for a stepwise zero-data-detection mute circuit according to a third embodiment of the present invention. FIG. 9B shows an example of a concrete circuit structure of the switch for receiving control signals SM1 and SM2 in the feedback resistor circuit of FIG. 9A.

When R−R0 is larger than r/8 in the circuit in FIG. 7, then the on-resistance of the switch SWMT controlled in accordance with the control signal SMT is greatly changed. Therefore, it is shown in FIG. 9 to attempt to make the on-resistance change smaller than r/8 at two stages of control signals SM1 and SM2 instead of the control signal SMT.

That is, in the circuit in FIG. 9A, the switch SWMT in the circuit in FIG. 7 is replaced with two parallel-connected switches SWM1 and SWM2. The switches SWM1 and SWM2 are controlled by control signals SM1 and SM2, respectively. Specifically, as shown in FIG. 9B, an N channel MOS transistor forming the switch SWM1 is turned on by the control signal SM1, while a P channel MOS transistor forming the switch SWM2 is turned on by the control signal SM2, respectively. The on-resistance values of the swithes SWM1 and SWM2 are R01, R02, respectively.

Figure 10:
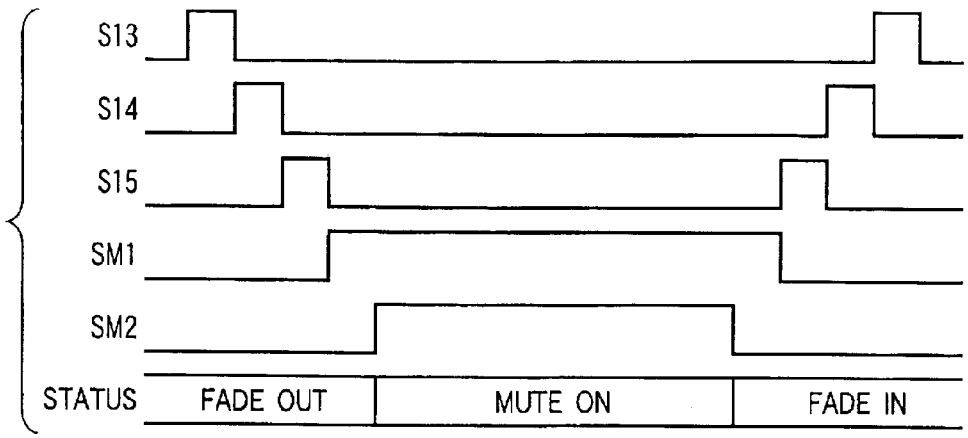
FIG. 10 shows an on/off timing signal chart of analog switches of the feedback resistor circuit in FIG. 9A.

FIG. 10 shows a timing chart in a state immediately before the mute-on, of the circuit of FIG. 9A. In the mute-on state, the both switches SWM1 and SWM2 controlled in accordance with the control signals SM1 and SM2 are turned on. FIGS. 11A to 11C show the resistance change in this case. In FIG. 9B, an N-channel MOS transistor is turned on in accordance with the control signal SM1 and a P-channel MOS transistor is turned on in accordance with the control signal SM2. The mute-on state is equivalent to the state in which the switch shown in FIG. 15C is turned on. In this case, it is also allowed to turn on the P-channel MOS transistor in accordance with the control signal SM1 and the N-channel MOS transistor in accordance with the control signal SM2.

According to this embodiment, it is not necessary to greatly decrease the resistance R corresponding to a switch SW15 to be turned on in accordance with the control signal S15. Moreover, the step between feedback resistances is further decreased than the case of the second embodiment. Furthermore, it is possible to further weaken a pop noise when a mute operates.

(Fourth Embodiment)

Figure 12B:
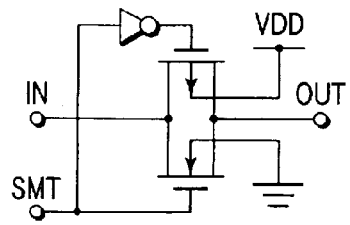
FIG. 12B is a concrete example of an analog switch for receiving a control signal SMT in the feedback resistor circuit in FIG. 12A.
Figure 13:
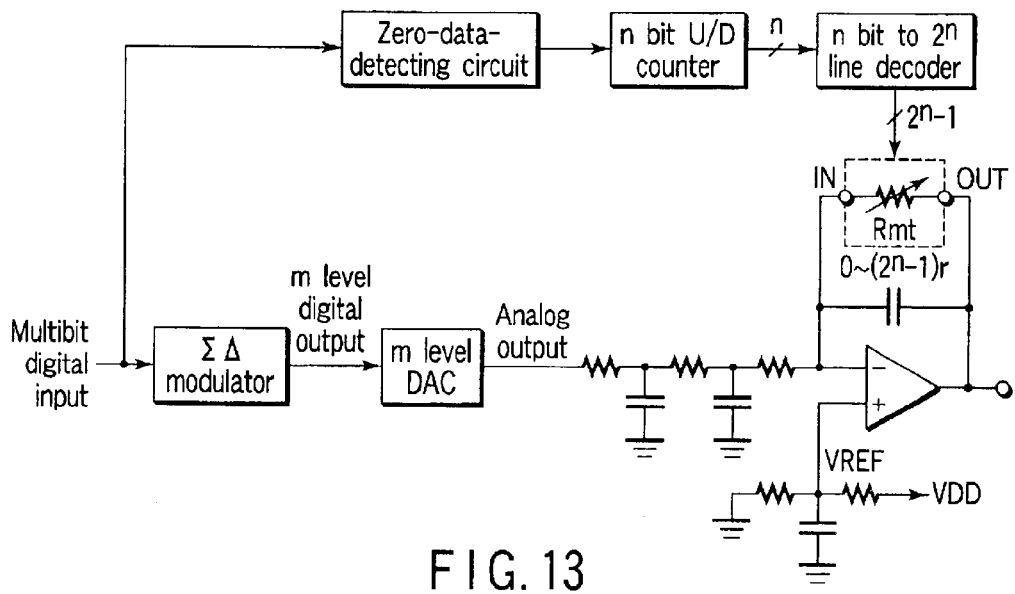
FIG. 13 is a block diagram showing a circuit configuration of an output section of a conventional ΣΔ-type D/A converter with a stepwise mute function.
Figure 12A:
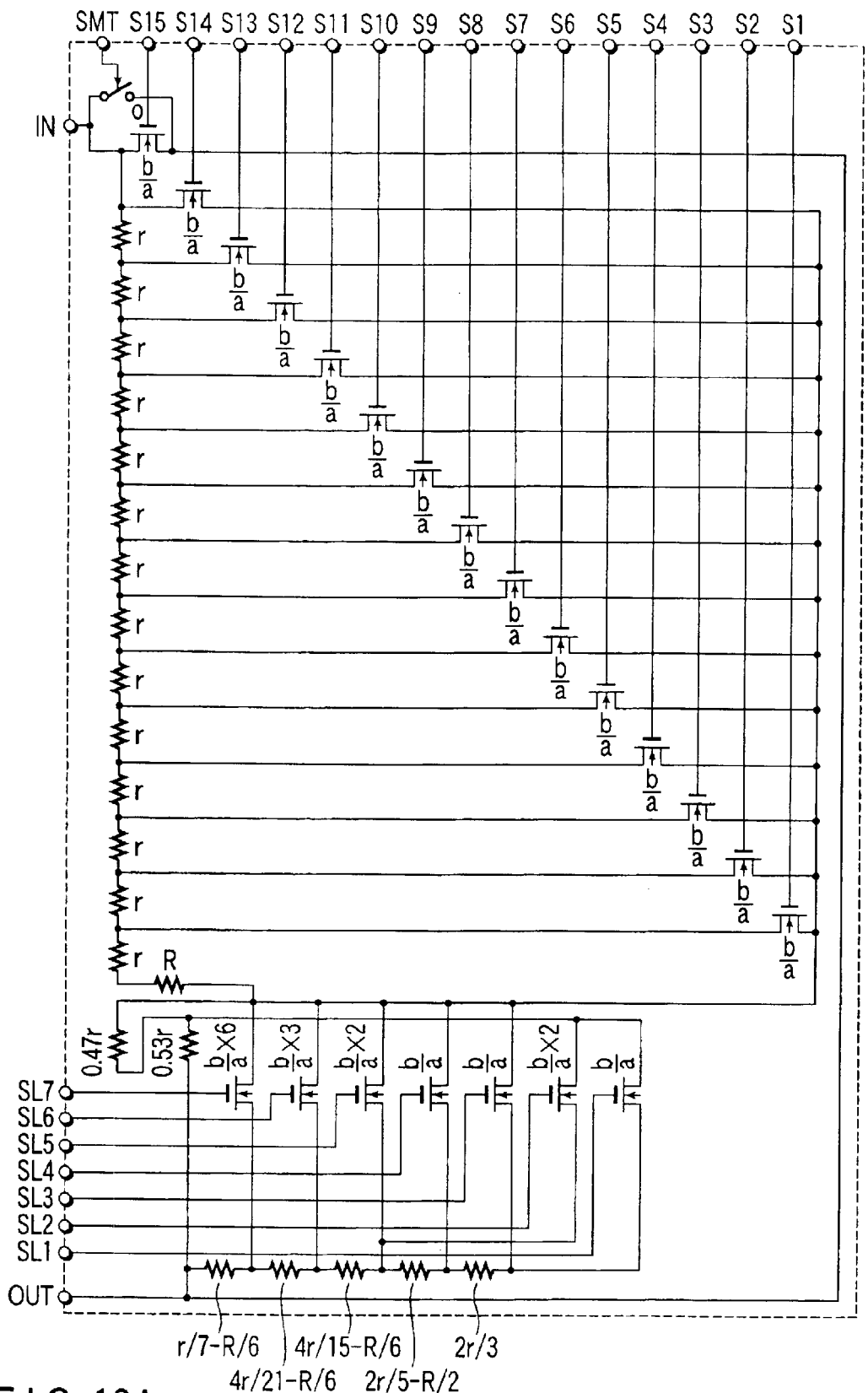
FIG. 12A is a concrete example of the feedback resistor circuit in FIG. 7, in which the analog switches are formed of a MOS transistor.

FIG. 12A shows an example in which the switches in the circuit of FIG. 7 are each replaced with a MOS transistor. The switches SW1 to SW15 controlled in accordance with the control signals S1 to S15 are each formed of an N-channel MOS transistor. Moreover, the dimension of these transistors is set to b/a, and the on-resistance thereof is set to R. The switch SWMT controlled in accordance with the control signal SMT is formed of a parallel circuit of an N channel MOS transistor and P channel MOS transistor, as shown in FIG. 12B, and the on-resistance of the switch SWMT is set to R0.

Moreover, the on-resistance of the switch SWL1 controlled in accordance with the control signal SL1 is set to R. The on-resistance of the switch SWL2 controlled in accordance with the control signal SL2 is set to R/2. The on-resistance of the switch SWL3 controlled in accordance with the control signal SL3 is also set to R. The on-resistance of the switch SWL4 controlled in accordance with the control signal SL4 is set to R. The on-resistance of the switch SWL5 controlled in accordance with the control signal SL5 is set to R/2. The on-resistance of the switch SWL6 controlled in accordance with the control signal SL6 is set to R/3. The on-resistance of the switch SWL7 controlled in accordance with the control signal SL7 is set to R/6.

Advantages of this embodiment are substantially the same as those of the third embodiment. Moreover, since most switches are respectively replaced with a MOS transistor, it is possible to decrease the size of a feedback resistor circuit.

As described above, in the stepwise zero-data-detection mute circuit according to each of the embodiments of the present invention, it is possible to increase the number of change steps of a feedback resistance and weaken a pop noise when a mute operates by only slightly increasing the feedback resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable resistance device comprising:

a first variable resistance circuit including n resistors connected in series forming a first series-resistor circuit and analog switches connected between one terminal of the series-resistor circuit and respective nodes of the resistors of the series-resistor circuit, n being an integer of 2 or more, the analog switches being on/off controlled by an output signal of a counter to stepwise change a resistance value of the first variable resistance circuit;

a second variable resistance circuit one terminal of which is connected to the one terminal of the first series-resistor circuit of the first variable resistance circuit, the second variable resistance circuit including a second series-resistor circuit of a first resistor and a second resistor which have a predetermined resistance ratio therebetween, one terminal of the first resistor being connected to one terminal of the second resistor, the other terminal of the first resistor being connected to the one terminal of the series-resistor circuit of the first variable resistance circuit, a third series-resistor circuit of a plurality of resistors, one terminal of third series-resistor circuit being connected to the other terminal of the second resistor, a plurality of analog switches connected between the other terminal of the first resistor and nodes of the respective resistors of the third series-resistor circuit, an analog switch connected between the other terminal of the third series-resistor circuit and a node of the first resistor and the second resistor and controlled by an output signal of a counter, an analog switch connected between a node of resistors of the third series-resistor circuit and the node of the first resistor and the second resistor and controlled by an output signal of a counter, and a short-circuiting analog switch connected between the other terminal of series-resistor circuit of the first variable resistance circuit and the other terminal of the second resistor of the second variable resistance circuit and controlled by an output signal of a counter to make a short-circuit therebetween.

2. The variable resistance device according to claim 1 wherein the n resistors of the first series-resistor circuit of the first variable resistance circuit have a resistance r substantially equal to one another.

3. The variable resistance device according to claim 2, wherein the analog switches being on/off controlled to stepwise change the resistance value of the first variable resistance circuit from 0 to nr in units of r.

4. The variable resistance device according to claim 1, wherein each of the analog switches of the first variable resistance circuit and the second variable resistance circuit comprises an N channel MOS transistor alone or a P channel MOS transistor alone, and the short-circuiting analog switch for short-circuiting the series-resistor circuit of the first variable resistance circuit and the second resistor of the second variable resistance circuit comprises a combination of an N channel MOS transistor and a P channel MOS transistor.

5. The variable resistor device according to claim 1, wherein a resistor is inserted in series between the one terminal of the first series-resistor circuit of the first variable resistance circuit and that resistor of the resistors of the first series-resistor circuit which is closest to the one terminal of the first series-resistor circuit, the inserted resistor having a resistance substantially equal to an on-resistance of each of the analog switches of the first variable resistance circuit.

6. A zero-data-detection mute circuit of an output section of a one-bit D/A converter in which a multibit digital signal is converted into a one-bit signal via a modulator, the one-bit signal is outputted in a form of analog signal via an inverting type amplifier of an analog low-pass filter, a counter is operated when detecting that the multibit digital signals are all zero for a predetermined time period to decrease stepwise a resistance of a feedback resistor circuit of the inverting type amplifier of the analog low-pass filter and finally make a short-circuit both terminals of the feedback resistor circuit according to an output of the counter to fix an output of the inverting type amplifier to a reference potential, the feedback resistor circuit comprising:

a first variable resistance circuit including n resistors connected in series forming a first series-resistor circuit and analog switches connected between one terminal of the series-resistor circuit and respective nodes of the resistors of the series-resistor circuit, n being an integer of 2 or more, the analog switches being on/off controlled by an output signal of a counter to stepwise change a resistance value of the first variable resistance circuit;

a second variable resistance circuit one terminal of which is connected to the one terminal of the first series-resistor circuit of the first variable resistance circuit, the second variable resistance circuit including a second series-resistor circuit of a first resistor and a second resistor which have a predetermined resistance ratio therebetween, one terminal of the first resistor being connected to one terminal of the second resistor, the other terminal of the first resistor being connected to the one terminal of the series-resistor circuit of the first variable resistance circuit, a third series-resistor circuit of a plurality of resistors, one terminal of third series-resistor circuit being connected to the other terminal of the second resistor, a plurality of analog switches connected between the other terminal of the first resistor and nodes of the respective resistors of the third series-resistor circuit, an analog switch connected between the other terminal of the third series-resistor circuit and a node of the first resistor and the second resistor and controlled by an output signal of a counter, an analog switch connected between a node of resistors of the third series-resistor circuit and the node of the first resistor and the second resistor and controlled by an output signal of a counter, and a short-circuiting analog switch connected between the other terminal of series-resistor circuit of the first variable resistance circuit and the other terminal of the second resistor of the second variable resistance circuit and controlled by an output signal of a counter to make a short-circuit therebetween.

7. The zero-data-detection mute circuit according to claim 6, wherein each of the analog switches of the first variable resistance circuit and the second variable resistance circuit comprises an N channel MOS transistor alone or a P channel MOS transistor alone, and the short-circuiting analog switch for short-circuiting the series-resistor circuit of the first variable resistance circuit and the second resistor of the second variable resistance circuit comprises a combination of an N channel MOS transistor and a P channel MOS transistor.

8. The zero-data-detection mute circuit according to claim 6, wherein a resistor is inserted in series between the one terminal of the first series-resistor circuit of the first variable resistance circuit and that resistor of the resistors of the first series-resistor circuit which is closest to the one terminal of the first series-resistor circuit, the inserted resistor having a resistance substantially equal to an on-resistance of each of the analog switches of the first variable resistance circuit.

9. The zero-data-detection mute circuit according to claim 6, wherein the modulator comprises a $\Sigma\Delta$ modulator.

10. The zero-data-detection mute circuit according to claim 6, wherein the n resistors of the first series-resistor circuit of the first variable resistance circuit have a resistance r substantially equal to one another.

11. The zero-data-detection mute circuit according to claim 10, wherein the analog switches being on/off controlled to stepwise change the resistance value of the first variable resistance circuit from 0 to nr in units of r.

12. A variable resistance device comprising:

a first variable resistance circuit including n resistors connected in series forming a series-resistor circuit and analog switches connected between one terminal of the series-resistor circuit and respective nodes of the resistors of the series-resistor circuit, n being an integer of 2 or more, the n resistors each having a resistance value of r, the analog switches being on/off controlled by an output signal of a counter to stepwise change a resistance value of the first variable resistance circuit from 0 to n·r; and a second variable resistance circuit, the second variable resistance circuit including:

a first resistor having a resistance value of 0.53r, a second resistor having a resistance value of 0.47r one terminal of which is connected to one terminal of the first resistor and the other terminal of which is connected to one terminal of the series-resistor circuit of the first variable resistance circuit, a third resistor having a resistance value of r/7 one terminal of which is connected to the other terminal of the first resistor, a first analog switch one terminal of which is connected to the other terminal of the third resistor, and the other terminal of which is connected to the other terminal of the second resistor, a fourth resistor having a resistance value of 4r/21 one terminal of which is connected to the other terminal of the third resistor, a second analog switch one terminal of which is connected to the other terminal of the fourth resistor, and the other terminal of which is connected to the other terminal of the second resistor, a fifth resistor having a resistance value of 4r/15 one terminal of which is connected to the other terminal of the fourth resistor, a third analog switch one terminal of which is connected to the other terminal of the fifth resistor, and the other terminal of which is connected to the other terminal of the second resistor, a sixth resistor having a resistance value of 2r/5 one terminal of which is connected to the other terminal of the fifth resistor, a fourth analog switch one terminal of which is connected to the other terminal of the sixth resistor, and the other terminal of which is connected to the other terminal of the second resistor, a seventh resistor having a resistance value of 2r/3 one terminal of which is connected to the other terminal of the sixth resistor, a fifth analog switch one terminal of which is connected to the other terminal of the seventh resistor, and the other terminal of which is connected to the other terminal of the second resistor, a sixth analog switch one terminal of which is connected to the other terminal of the fifth resistor, and the other terminal of which is connected to the one terminal of the first resistor, a seventh analog switch one terminal of which is connected to the other terminal of the seventh resistor, and the other terminal of which is connected to the one terminal of the first resistor, and an eighth analog switch connected between the other terminal of the series-resistor circuit of the first variable resistance circuit and the other terminal of the first resistor of the second variable resistance circuit to make a short-circuit therebetween.

13. The variable resistance device according to claim 12, wherein each of the analog switches of the first variable resistance circuit and the second variable resistance circuit comprises an N channel MOS transistor alone or a P channel MOS transistor alone, and the eighth analog switch comprises a combination of an N channel MOS transistor and a P channel MOS transistor.

14. The variable resistance device according to claim 12, wherein a resistance value between the other terminal of the first resistor having the resistance value of 0.53r and the other terminal of the second resistor having the resistance value of 0.47r is changed from r/8 to r in units of r/8.

15. The variable resistance device according to claim 12, wherein in the second variable resistance circuit, an on-resistance of the first analog switch is set to R7, an on-resistance of the second analog switch is set to R6, an on-resistance of the third analog switch is set to R5, an on-resistance of the fourth analog switch is set to R4, an on-resistance of the fifth analog switch is set to R3, an on-resistance of the sixth analog switch is set to R2, and an on-resistance of the seventh analog switch is set to R1 in which R2 becomes equal to R5 and R1 becomes equal to R3, and a resistance value of the third resistance is set to r/7−R7, a resistance value of the fourth resistance is set to 4r/21+R7−R6, a resistance value of the fifth resistance is set to 4r/15+R6−R5, a resistance value of the sixth resistance is set to 2r/5+R5−R4, and a resistance value of the seventh resistance is set to 2r/3+R4−R3.

16. The variable resistance device according to claim 15, wherein on-resistances of all of the analog switches in the first variable resistance circuit are equal to one another, a resistor is inserted in series between the one terminal of the series-resistor circuit of the first variable resistance circuit and the other terminal of the second resistor of the second variable resistance circuit, a resistance of the inserted resistor being equal to the on-resistance of each of the analog switches in the first variable resistor circuit, an on-resistance value of the eighth analog switch being equal to the on-resistance of each of the analog switches in the first variable resistor circuit, and a ninth analog switch is provided in parallel with the eighth analog switch, the ninth analog switch is turned on one step after the eighth analog switch is turned on to turn to a mute-on, and the eighth analog switch is turned off one step after the ninth analog switch is turned off to turn to a mute-off.

17. The variable resistance device according to claim 16, wherein on-resistance of the eighth analog switch is equal to an on-resistance of each of the analog switches in the first variable resistance circuit, a ninth analog switch and a tenth analog switch are provided in parallel with the eighth analog switch, the ninth analog switch is turned on one step after the eighth analog switch is turned on, and the tenth analog switch is turned on one step after the ninth analog switch is turned on when a mute is turned on, the ninth analog switch is turned off one step after the tenth analog switch is turned off and the eighth analog switch is turned off one step after the ninth analog switch is turned off when a mute is turned off, and the ninth analog switch and the tenth analog switch are turned on when the mute is turned on.

18. A zero-data-detection mute circuit of an output section of a one-bit D/A converter in which a multibit digital signal is converted into a one-bit signal via a modulator, the one-bit signal is outputted in a form of analog signal via an inverting type amplifier of an analog low-pass filter, a counter is operated when detecting that the multibit digital signals are all zero for a predetermined time period to decrease stepwise a resistance of a feedback resistor circuit of the inverting type amplifier of the analog low-pass filter and finally make a short-circuit both terminals of the feedback resistor circuit according to an output of the counter to fix an output of the inverting type amplifier to a reference potential, the feedback resistor circuit comprising:

a first variable resistance circuit including n resistors connected in series forming a series-resistor circuit and analog switches connected between one terminal of the series-resistor circuit and respective nodes of the resistors of the series-resistor circuit, n being an integer of 2 or more, the n resistors each having a resistance value of r, the analog switches being on/off controlled by an output signal of a counter to stepwise change a resistance value of the first variable resistance circuit from 0 to n·r; and a second variable resistance circuit, the second variable resistance circuit including:

a first resistor having a resistance value of 0.53r, a second resistor having a resistance value of 0.47r one terminal of which is connected to one terminal of the first resistor and the other terminal of which is connected to one terminal of the series-resistor circuit of the first variable resistance circuit, a third resistor having a resistance value of r/7 one terminal of which is connected to the other terminal of the first resistor, a first analog switch one terminal of which is connected to the other terminal of the third resistor, and the other terminal of which is connected to the other terminal of the second resistor, a fourth resistor having a resistance value of 4r/21 one terminal of which is connected to the other terminal of the third resistor, a second analog switch one terminal of which is connected to the other terminal of the fourth resistor, and the other terminal of which is connected to the other terminal of the second resistor, a fifth resistor having a resistance value of 4r/15 one terminal of which is connected to the other terminal of the fourth resistor, a third analog switch one terminal of which is connected to the other terminal of the fifth resistor, and the other terminal of which is connected to the other terminal of the second resistor, a sixth resistor having a resistance value of 2r/5 one terminal of which is connected to the other terminal of the fifth resistor, a fourth analog switch one terminal of which is connected to the other terminal of the sixth resistor, and the other terminal of which is connected to the other terminal of the second resistor, a seventh resistor having a resistance value of 2r/3 one terminal of which is connected to the other terminal of the sixth resistor, a fifth analog switch one terminal of which is connected to the other terminal of the seventh resistor, and the other terminal of which is connected to the other terminal of the second resistor, a sixth analog switch one terminal of which is connected to the other terminal of the fifth resistor, and the other terminal of which is connected to the one terminal of the first resistor, a seventh analog switch one terminal of which is connected to the other terminal of the seventh resistor, and the other terminal of which is connected to the one terminal of the first resistor, and an eighth analog switch connected between the other terminal of the series-resistor circuit of the first variable resistance circuit and the other terminal of the first resistor of the second variable resistance circuit to make a short-circuit therebetween.

19. The zero-data-detection mute circuit according to claim 18, wherein each of the analog switches of the first variable resistance circuit and the second variable resistance circuit comprises an N channel MOS transistor alone or a P channel MOS transistor alone, and the eighth analog switch comprises a combination of an N channel MOS transistor and a P channel MOS transistor.

20. The zero-data-detection mute circuit according to claim 18, wherein a resistance value between the other terminal of the first resistor having the resistance value of 0.53r and the other terminal of the second resistor having the resistance value of 0.47r is changed from r/8 to r in units of r/8.

21. The zero-data-detection mute circuit according to claim 18, wherein the modulator comprises a $\Sigma\Delta$ modulator.

22. The zero-data-detection mute circuit according to claim 18, wherein in the second variable resistance circuit, an on-resistance of the first analog switch is set to R7,
an on-resistance of the second analog switch is set to R6,
an on-resistance of the third analog switch is set to R5,
an on-resistance of the fourth analog switch is set to R4,
an on-resistance of the fifth analog switch is set to R3,
an on-resistance of the sixth analog switch is set to R2, and
an on-resistance of the seventh analog switch is set to R1 in which R2 becomes equal to R5 and R1 becomes equal to R3, and a resistance value of the third resistance is set to r/7−R7,
a resistance value of the fourth resistance is set to 4r/21+R7−R6,
a resistance value of the fifth resistance is set to 4r/15+R6−R5,
a resistance value of the sixth resistance is set to 2r/5+R5−R4, and
a resistance value of the seventh resistance is set to 2r/3+R4−R3.

23. The zero-data-detection mute circuit according to claim 22, wherein on-resistances of all of the analog switches in the first variable resistance circuit are equal to one another, a resistor is inserted in series between the one terminal of the series-resistor circuit of the first variable resistance circuit and the other terminal of the second resistor of the second variable resistance circuit, a resistance of the inserted resistor being equal to the on-resistance of each of the analog switches in the first variable resistor circuit, an on-resistance value of the eighth analog switch being equal to the on-resistance of each of the analog switches in the first variable resistor circuit, and a ninth analog switch is provided in parallel with the eighth analog switch, the ninth analog switch is turned on one step after the eighth analog switch is turned on to turn to a mute-on and the eighth analog switch is turned off one step after the ninth analog switch is turned off to turn to a mute-off.

24. The zero-data-detection mute circuit according to claim 23, wherein on-resistance of the eighth analog switch is equal to an on-resistance of each of the analog switches in the first variable resistance circuit, a ninth analog switch and a tenth analog switch are provided in parallel with the eighth analog switch, the ninth analog switch is turned on one step after the eighth analog switch is turned on, and the tenth analog switch is turned on one step after the ninth analog switch is turned on when a mute is turned on, the ninth analog switch is turned off one step after the tenth analog switch is turned off and the eighth analog switch is turned off one step after the ninth analog switch is turned off when a mute is turned off, and the ninth analog switch and the tenth analog switch are turned on when the mute is turned on.

25. A zero-data-detection mute circuit of an output section of a one-bit D/A converter, comprising:

an analog low-pass filter including an inverting type amplifier, configured to pass an analog-converted output of a one-bit D/A converter;

zero-data-detecting circuit configured to detect that an input digital signal inputted to the D/A converter is 0-level data;

a counter configured to receive an output signal of the zero-data-detecting circuit and generate an output signal when detecting that the digital signals inputted to the D/A converter are all zero for a predetermined time period; and a decoder configured to decode the output signal of the counter and decrease stepwise a resistance of a feedback resistor circuit of the inverting type amplifier of the analog low-pass filter and finally make a short-circuit both terminals of the feedback resistor circuit to fix an output of the analog low-pass filter to a reference potential, the feedback resistor circuit including a first variable resistance circuit and a second variable resistance circuit, wherein the first variable resistance circuit includes n resistors connected in series forming a series-resistor circuit and analog switches connected between one terminal of the series-resistor circuit and respective nodes of the resistors of the series-resistor circuit, n being an integer of 2 or more, the n resistors each having a resistance value of r, the analog switches being on/off controlled by an output signal of a counter to stepwise change a resistance value of the first variable resistance circuit from 0 to n·r; and the second variable resistance circuit includes:

a first resistor having a resistance value of 0.53r, a second resistor having a resistance value of 0.47r one terminal of which is connected to one terminal of the first resistor and the other terminal of which is connected to one terminal of the series-resistor circuit of the first variable resistance circuit, a third resistor having a resistance value of r/7 one terminal of which is connected to the other terminal of the first resistor, a first analog switch one terminal of which is connected to the other terminal of the third resistor, and the other terminal of which is connected to the other terminal of the second resistor, a fourth resistor having a resistance value of 4r/21 one terminal of which is connected to the other terminal of the third resistor, a second analog switch one terminal of which is connected to the other terminal of the fourth resistor, and the other terminal of which is connected to the other terminal of the second resistor, a fifth resistor having a resistance value of 4r/15 one terminal of which is connected to the other terminal of the fourth resistor, a third analog switch one terminal of which is connected to the other terminal of the fifth resistor, and the other terminal of which is connected to the other terminal of the second resistor, a sixth resistor having a resistance value of 2r/5 one terminal of which is connected to the other terminal of the fifth resistor, a fourth analog switch one terminal of which is connected to the other terminal of the sixth resistor, and the other terminal of which is connected to the other terminal of the second resistor, a seventh resistor having a resistance value of 2r/3 one terminal of which is connected to the other terminal of the sixth resistor, a fifth analog switch one terminal of which is connected to the other terminal of the seventh resistor, and the other terminal of which is connected to the other terminal of the second resistor, a sixth analog switch one terminal of which is connected to the other terminal of the fifth resistor, and the other terminal of which is connected to the one terminal of the first resistor, a seventh analog switch one terminal of which is connected to the other terminal of the seventh resistor, and the other terminal of which is connected to the one terminal of the first resistor, and an eighth analog switch connected between the other terminal of the series-resistor circuit of the first variable resistance circuit and the other terminal of the first resistor of the second variable resistance circuit to make a short-circuit therebetween.

26. The zero-data-detection mute circuit according to claim 25, wherein a resistance value between the other terminal of the first resistor having the resistance value of 0.53r and the other terminal of the second resistor having the resistance value of 0.47r is changed from r/8 to r in units of r/8.

27. The zero-data-detection mute circuit according to claim 26, wherein a resistance value between the other terminal of the first resistor having a resistance value of 0.53r and the other terminal of the second resistor having a resistance value of 0.47r is changed from r/8 to r in units of r/8.

28. A zero-data-detection mute circuit of an output section of a one-bit D/A converter, comprising:

an analog low-pass filter including an inverting type amplifier, configured to pass an analog-converted output of a one-bit D/A converter;

zero-data-detecting circuit configured to detect that an input digital signal inputted to the D/A converter is 0-level data;

a counter configured to receive an output signal of the zero-data-detecting circuit and generate an output signal when detecting that the digital signals inputted to the D/A converter are all zero for a predetermined time period; and a decoder configured to decode the output signal of the counter and decrease stepwise a resistance of a feedback resistor circuit of the inverting type amplifier of the analog low-pass filter and finally make a short-circuit both terminals of the feedback resistor circuit to fix an output of the analog low-pass filter to a reference potential, wherein the feedback resistor circuit includes:

a first variable resistance circuit including n resistors connected in series forming a first series-resistor circuit and analog switches connected between one terminal of the series-resistor circuit and respective nodes of the resistors of the series-resistor circuit, n being an integer of 2 or more, the analog switches being on/off controlled by an output signal of a counter to stepwise change a resistance value of the first variable resistance circuit;

a second variable resistance circuit one terminal of which is connected to the one terminal of the first series-resistor circuit of the first variable resistance circuit, the second variable resistance circuit including a second series-resistor circuit of a first resistor and a second resistor which have a predetermined resistance ratio therebetween, one terminal of the first resistor being connected to one terminal of the second resistor, the other terminal of the first resistor being connected to the one terminal of the series-resistor circuit of the first variable resistance circuit, a third series-resistor circuit of a plurality of resistors, one terminal of third series-resistor circuit being connected to the other terminal of the second resistor, a plurality of analog switches connected between the other terminal of the first resistor and nodes of the respective resistors of the third series-resistor circuit, an analog switch connected between the other terminal of the third series-resistor circuit and a node of the first resistor and the second resistor and controlled by an output signal of a counter, an analog switch connected between a node of resistors of the third series-resistor circuit and the node of the first resistor and the second resistor and controlled by an output signal of a counter, and a short-circuiting analog switch connected between the other terminal of series-resistor circuit of the first variable resistance circuit and the other terminal of the second resistor of the second variable resistance circuit and controlled by an output signal of a counter to make a short-circuit therebetween.

* * * * *